(12) United States Patent
Scott et al.

(10) Patent No.: US 8,000,928 B2
(45) Date of Patent: *Aug. 16, 2011

(54) METHODS AND APPARATUS FOR DATA ANALYSIS

(75) Inventors: Michael J. Scott, Livingston (GB); Jacky Gorin, Scottsdale, AZ (US); Paul Buxton, West Lothian (GB); Eric Paul Tabor, Gilbert, AZ (US)

(73) Assignee: Test Advantage, Inc., Tempe, AZ (US)

( * ) Notice: Subject to any disclaimer, the term of this patent is extended or adjusted under 35 U.S.C. 154(b) by 493 days.

This patent is subject to a terminal disclaimer.

(21) Appl. No.: 12/111,773

(22) Filed: Apr. 29, 2008

(65) Prior Publication Data
US 2008/0249742 A1 Oct. 9, 2008

Related U.S. Application Data

(63) Continuation of application No. 10/817,750, filed on Apr. 2, 2004, now Pat. No. 7,395,170, which is a continuation-in-part of application No. 10/730,388, filed on Dec. 7, 2003, now Pat. No. 7,225,107, which is a continuation-in-part of application No. 10/367,355, filed on Feb. 14, 2003, now Pat. No. 7,167,811, which is a continuation-in-part of application No. 10/154,627, filed on May 24, 2002, now Pat. No. 6,792,373, which is a continuation-in-part of application No. 09/872,195, filed on May 31, 2001, now Pat. No. 6,782,297.

(60) Provisional application No. 60/293,577, filed on May 24, 2001, provisional application No. 60/295,188, filed on May 31, 2001, provisional application No. 60/374,328, filed on Apr. 21, 2002, provisional application No. 60/483,003, filed on Jun. 27, 2003, provisional application No. 60/546,088, filed on Feb. 19, 2004.

(51) Int. Cl.
*G06F 17/18* (2006.01)
(52) U.S. Cl. .......... 702/179; 702/84; 702/117; 702/118; 702/119; 702/120; 702/121; 702/122; 702/123; 702/124; 702/182; 702/183; 700/55; 714/721; 438/10; 438/11; 438/12; 438/13; 438/14
(58) Field of Classification Search .................... 702/84, 702/117–124, 182, 183; 700/55; 714/721; 438/10, 14
See application file for complete search history.

(56) References Cited

U.S. PATENT DOCUMENTS
4,109,511 A   8/1978  Powers, Jr. et al.
(Continued)

FOREIGN PATENT DOCUMENTS
EP   1067392 A2   6/2000

OTHER PUBLICATIONS

Miguleanez, Emilio et al. "Advanced Automatic Parametric Outlier Detection Technologies for the Production Environment".*

(Continued)

*Primary Examiner* — Sujoy Kundu
(74) *Attorney, Agent, or Firm* — The Noblitt GRoup, PLLC

(57) ABSTRACT

A method and apparatus for data analysis according to various aspects of the present invention is configured to automatically select one or more outlier identification algorithms for identifying statistical outliers in test data for components.

45 Claims, 33 Drawing Sheets

U.S. PATENT DOCUMENTS

| | | | |
|---|---|---|---|
| 4,989,166 | A | 1/1991 | Akasaka et al. |
| 5,130,936 | A | 7/1992 | Sheppart et al. |
| 5,240,866 | A | 8/1993 | Friedman et al. |
| 5,287,284 | A | 2/1994 | Sugino et al. |
| 5,495,417 | A | 2/1996 | Fukuda et al. |
| 5,539,652 | A | 7/1996 | Tegethoff |
| 5,668,745 | A | 9/1997 | Day |
| 5,694,325 | A | 12/1997 | Fukuda et al. |
| 5,787,190 | A | 7/1998 | Peng et al. |
| 5,835,891 | A | 11/1998 | Stoneking |
| 5,892,949 | A | 4/1999 | Noble |
| 5,956,251 | A | 9/1999 | Atkinson et al. |
| 5,966,527 | A | 10/1999 | Krivokapi et al. |
| 6,182,022 | B1 | 1/2001 | Mayle et al. |
| 6,184,048 | B1 | 2/2001 | Ramon |
| 6,279,146 | B1 | 8/2001 | Evans et al. |
| 6,300,772 | B1 | 10/2001 | Brown et al. |
| 6,338,148 | B1 | 1/2002 | Gillenwater et al. |
| 6,366,851 | B1 | 4/2002 | Chojnacki et al. |
| 6,442,499 | B1 | 8/2002 | Gorin |
| 6,477,685 | B1 | 11/2002 | Lovelace |
| 6,516,309 | B1 | 2/2003 | Eberhart |
| 6,787,379 | B1 | 9/2004 | Madge et al. |
| 6,807,655 | B1 | 10/2004 | Rehani et al. |
| 6,939,727 | B1 | 9/2005 | Allen, III et al. |
| 6,943,042 | B2 | 9/2005 | Madge et al. |
| 7,395,170 | B2 * | 7/2008 | Scott et al. .................. 702/118 |
| 2002/0054694 | A1 | 5/2002 | Vachtsevanos et al. |
| 2003/0014205 | A1 | 1/2003 | Tabor |
| 2003/0140287 | A1 | 7/2003 | Wu et al. |
| 2003/0144810 | A1 | 7/2003 | Tabor |

OTHER PUBLICATIONS

Miller, Russel B. et al. "Unit Level Predicted Yield: a Method if Identifying High Defect Density Die at Wafer Sort".*

Stanley, James. "Spatial Outlier Method for Detecting Defects in Semiconductor Devices at Electrical Probe."*

Sabade, Sagar et al. "Immediate Neighbor Difference IDDQ Test (INDIT) for Outlier Identification".*

Madge, Robert et al. "Statistical Post-Processing at Wafersort—An Alternatice to Burn-in and a Manufacturable Solution to Test Limit Setting for Sub-micro Technologies".*

Madge, Robert, et al. Statistical Post-Processing at Wafersort—An Alternative to Burn-in and a Manufacturable Solution to Test Limit Setting for Sub-Micron . . . , IEEE 2002.

Motorola, Process Average Testing (PAT), Statistical Yield Analysis (SYA) and Junction Verification Test (JVT), Aug. 3, 1998.

"Automatically Analyzing Effects of PRocess Equipment on Yield," http://www.semiconductor.net/semiconductor.net/semiconductor/issues/1999/aug99/docs/yield.asp.

"Capability Ratios Vary", http://www.qualitydigest.com/june97/html/capablty.html.

"Using SPC in Batch Processes" http://www.qualitydigest.com/mar98/html/spcbatch.html.

"Splitting Wafer Lots in Semiconductor Manufacturing, Part III: Comparing Two Processes—A Better Approach," http://www.semiconductoronline.com/content/news/article.asp?DocID.

"Technique Closes the Loop on Test System Uncertainty," http://www.tmworld.com/articles/05_1999_Technique_Loop.htm.

"How Much Measurement Error is Too Much? Part I: Modelling Measurement Data," http://www.testandmeasurement.com/content/news/article.asp?DocID=(592878CF-FC4E-11D3-8C2C-009027D.

"Data Conductor, Solution for Semiconductor Yield Enhancement".

"Predictive Smoothing Algorithm Theory of Operation".

Applewhite. The view from the top. IEEE Spectrum, 41(II (INT)):18-31, Nov. 2004.

Canuto, M. Fairhurst and G. Howells, (2001) Improving ARTMap learning through variable vigilance. International Journal of Neural Systems, vol. 11, No. 6, pp. 509-522.

Carpenter, G. A. and S. Grossberg, (1998) The ART of adaptive pattern recognition by self-organization neural network. Computer, vol. 21, No. 3, pp. 77-88.

K. Chang and J. Ghosh. Principal Curve Classifier—A nonlinear approach to pattern classification. In IEEE World Congress on Computational Intelligence, Neural . . . May 1998.

M. Clerc and J. Kennedy. The particle swarm—explosion, stability, and convergence in a multidimensional complex space. IEEE Transaction on Evolutionary Computation, Feb. 2002.

R. C. Eberhart and J. Kennedy, "A new optimizer using particle swarm theory", in Proc. 6th Intl. Symposium on Micro Machines and Human Science, Nagoya, Japan, IEEE 1995.

R. C. Eberhart and Y. Shi. Evolving Artificial Neural Networks. In International Conference on Neural Networks and Brain, pp. PL5-PL13, Beijing, P.R. China, 1998.

R. C. Eberhart and X. Hu, "Human Tremor analysis using particle swarm optmization", in Proc. Congress on Evolutionary Computation 1999, IEEE Service Center, pp. 1927-1930.

R.C. Eberhart and Y. Shi, "Comparing inertia weight and constriction factors in particle swarm optimization", in Proc. of the Congress of Evolutionary Computation, 2000.

F. Chen and S. Liu, "A Neural-Network Approach To Recognize Defect Spatial Pattern In Semiconductor Fabrication", IEEE Transactions on Semiconductor Manufacturing,v.13 2000.

T. Fountain, T. Dietterich, and B. Sudyka. Mining IC test data to optimize VLSI testing. the 6th ACM SIGKDD International Conference pp. 18-25, 2000.

N. Franken and A.P. Engelbrecht. Comparing PSO structures to learn the game of checkers from zero knowledge. In Congress on Evolutionary Computation, vol. 1, Dec. 2003.

F. van den Bergh and A. P. Engelbrecht, "Cooperative Learning in Neural Networks using Particle Swarm Optimizers", South African Computer Journal, pp. 84-90, Nov. 2000.

F. van den Bergh and A. P. Engelbrecht, "Training Product Unit Networks using Cooperative Particle Swarm Optimisers", in Proceedings of IJCNN 2001, (Washington DC, USA), 2001.

K. W. Tobin, S. S. Gleason, T. P. Karnowski, S. L. Cohen and F. Lakhani, Automatic Classification of Spatial Signatures on Semiconductor Wafermaps. SPIE 22nd Annual (1997).

S.S. Gleason, K.W. Tobin, T.P. Karnowski, and Fred Lakhani, (1999) Rapid Yield Learning through Optical Defect and Electrical Test Analysis, SPIE, 1999.

Hu M. K. "Visual pattern recognition by moments invariants", IRE Transactions on Information Theory, vol. 8(2), pp. 179-187, 1962.

The National Technology Roadmap for Semiconductors, Semiconductor Industry Association, San Jose, 2001 (Executive Summary).

The National Technology Roadmap for Semiconductors, Semiconductor Industry Association, San Jose, 2001 (Test and Test Equipment).

K. Kameyama, and Y. Kosugi, "Semiconductor Defect Classification using Hyperellipsoid Clustering Neural Networks and Model Switching", Intl Joint Conf on Neural Networks 1999.

T.P. Karnowski, K.W. Tobin, S.S. Gleason, Fred Lakhani, "The Application of Spatial Signature Analysis to Electrical Test Data: Validation Study," SPIE 24th Ann'l Symp Feb. 1999.

J. Kennedy and R. Mendes. Population structure and particle swarm performance. In Congress on Evolutionary Computation, pp. 1671-1676, 2002.

J. Kennedy and R. Mendes. Neighborhood topologies in fully-informed and best-of-neighborhood particle swarms. IEEE Int'l Workshop on Soft Computing Jul. 2003.

Kohonen T., The self-organizing map. Proceedings of the IEEE 78, pp. 1464-1480, 1990.

Kveton and D. Dash. Automatic excursion detection in manufacturing: Preliminary results. 18th Int'l Florida Artificial Intelligence Research Conference May 2004.

Lanzi, P. L., "Fast Feature Selection with Genetic Algorithms: A Filter Approach", IEEE International Conference on Evolutionary Computation , Apr. 13-16, 1997, pp. 537-540.

Leonardis and H. Bischof, "An efficient MDL-based construction of RBF networks", Neural Networks, vol. 11, pp. 963-973, 1998.

Y. Liu, X. Yao and T. Higuchi, "Evolutionary Ensembles with Negative Correlation Learning", in IEEE Transactions on Evolutionary Computation, 4(4): 380-387, Nov. 2000.

R. Mendes, J. Kennedy, and J. Neves. Watch thy neighbor or how the swarm can learn from its environment. IEEE Swarm Intelligence Symposium, pp. 88-94, Apr. 24-26, 2003.

R. Mendes, J. Kennedy, and J. Neves. The Fully Informed Particle: Simpler, Maybe Better. IEEE Transaction on Evolutionary Computation, 8:204-210, Jun. 2004.

Miguelanez, Emilio, DIWA: Device Independent Wafermap Analysis, 2003.

Miguelanez, Emilio, DIWA: Device Independent Wafermap Analysis, 2003 (Presentation).
Miguelanez, Emilio, Automating the Analysis of Wafer Data Using Adaptive Resonance Theory Networks, 2004 (Presentation).
Miguelanez, Emilio, Evolving Neural Networks using Swarm Intelligence for Binmap Classification, 2004.
Miguelanez, Emilio, Automating the Analysis of Wafer Data Using Adaptive Resonance Theory Networks, 2004.
Miguelanez, Emilio, Evolving Neural Networks using Swarm Intelligence for Binmap Classification, 2004 (Presentation).
Miguelanez, Emilio, Swarm Intelligence in Automated Electrical Wafer Sort Classification, 2005.
T. Nakashima, G. Nakai, and H. Ishibuchi. Constructing fuzzy ensembles for pattern classification problems. IEEE Int'l Conf on Systems, Man and Cybernetics, Oct. 2003.
Neblett. The role of test in total quality management. In Proceedings of the IEEE Systems Readiness Technology Conference AUTOTESTCON'94, vol. I, pp. 727-735, Sep. 1994.
Ozcan and C.K. Mohan. Particle swarm optimization: Surfing the waves. In International Congress on Evolutionary Computation, pp. 1939-1944, 1999.
Vafaie, H. and De Jong, K., "Genetic Algorithms as a Tool for Feature Selection in Machine Learning",4th Int'l Conf on Tools with Artificial Intelligence, Nov. 1992.
Watkins and L. Boggess. A new classifier based on resource limited Artificial Immune Systems. In Congress on Evolutionary Computation CEC'02, vol. II, pp. 1546-1551. IEEE May 2002.
C. Zhang, H. Shao, and Y.Li, "Particle swarm optimization for evolving artificial neural networks", IEEE Int'l Conf on Systems, Man and Cybernetics vol. 4, 2000.
K. E. Parsopoulos and M. N. Vrahatis. On the Computation of All Global Minimizers through Particle Swarm Optimization. IEEE Transaction on Evolutionary Computation, Jun. 2004.
T. Poggio and F. Girosi, "Networks for approximation and learning", Proc. of the IEEE, vol. 78, pp. 1481-1497, 1990.
J. Salerno, "Using the particle swarm optimization technique to train a recurrent neural model", IEEE Inter. Conference on Tools with Artificial Intelligence, pp. 45-49, 1997.
Y. Shi and R.C. Eberhart, "Parameter selection in particle swarm optimization", in Proc. of the 1998 Annual Conference on Evolutionary Programming, San Diego, CA, 1998.
Y. Shi and R. C. Eberhart. "A Modified Particle Swarm Optimizer", in Proc. of Intl. Joint Conf. on Neural Networks, Washington, USA, pp. 69-73, Jul. 1999.
K. W. Tobin, S. S. Gleason, T. P. Karnowski, An Image Paradigm for Semiconductor Defect Data Reduction, SPIE's International Symposium on Microlithography, 1996.
K.W. Tobin, S.S. Gleason, F. Lakhami, and M.H. Bennet, "Automated Analysis for Rapid Defect Sourcing and Yield Learning", Future Fab International, vol. 4, 1997.
K.W. Tobin, S. S.Gleason, T.P. Karnowski, and S.L. Cohen, Feature Analysis and classification of Manufacturing Signatures on Semiconductor Wafers, SPIE 9th Annual, 1997.
K. W. Tobin, S. S. Gleason, T. P. Karnowski, S. L. Cohen and F. Lakhani, Automatic Classification of Spatial Signatures on Semiconductor Wafermaps, SPIE 22nd Annual, 1997.
Tseng, L. Y. and Yang, S. B., "Genetic Algorithms for Clustering, Feature Selection and Classification", International Conference on Neural Networks, Jun. 9-12, 1997.
Singh et al., Screening for Known Good Die (KGD) Based on Defect Clustering: An Experimental Study, IEEE.
Singh, Position Statement: Good Die in Bad Neighborhoods, IEEE.
Miller, Position Statement: Good Die in Bad Neighborhoods, IEEE.
Roehr, Position Statement: Good Die in Bad Neighborhoods, IEEE.
Mann, "Leading Edge" of Wafer Level Testing.
Michelson, Statistically Calculating Reject Limits at Parametric Test, IEEE.
Sabade et al., Immediate Neighbor Difference IDDQ Test (INDIT) for Outlier Detection, Dept of Computer Science—Texas A&M University.
Huang et al, Image Processing Techniques for Wafer Defect Cluster Identification, IEEE.
Sabade et al, Use of Multiple IDDQ Test Metrics for Outlier Identification, Dept. of Computer Science—Texas A&M University.
Chen et al, A Neural-Network Approach to Recognize Defect Spatial Pattern Semiconductor Fabrication.
Defecter(tm)II—Defect Data Analysis Software, Semicon.
Stanley, James, Spatial Outlier Methods for Detecting Defects in Semiconductor Devices at Electrical Probe, Motorola.
Ratcliffe, Jeff, Setting a Nearest Neighbor IDDQ Threshold.
Daasch, Robert, Variance Reduction Using Wafer Patterns in Iddq Data, Proceeding of International Test Conference Oct. 2000, pp. 189-198.
Daasch, Robert, Neighbor Selection for Variance Reduction in Iddq and Other Parametric Data, ITC International Test Conference, IEEE 2001.
Madge, Robert et al. Statistical Post-Processing at Wafersort—An alternative to burn-in and a manufacturable solution to test limit setting for sub-micron . . . IEEE2002.
Motorola, Process average testing (PAT) Statistical Yield Analysis (SYA) and Junction Verificatio Test (JVT), Aug. 3, 1998.
Becker, Clauia, Performance Criteria for Multivariate outlier identification procedures, 2000, University of Dortmund, Department of Statistics, Germany.
Jeff Chappell, LSI Applies Statistics to Defectivity, Apr. 14, 2003 (http://www.reed-electronics.com/electronicnews/index.asp?layout=articlePrint&articleID=CA292185).
Erik Jan Marinissen, et al., Creating Value Through Test, IEEE 2003, 1530-1591.
Russell B. Miller, et al., Unit Level Predicted Yield: a Method of Identifying High Defect Density Die at Wafer Sort, IEEE 2001, 1118-1127.
Philippe Lejeune, et al., Optimizing Yield vs. DPPM for Parts Average Testing, www.galaxysemi.com.
Emilio Miguelanez, et al., Advanced Automatic Parametric Outlier Detection Technologies for the Production Environment.
Guidelines for Part Average Testing, Automotive Electronics Council, AEC-Q001-Rev-C Jul. 18, 2003.
Zinke, Kevin, et al. Yield Enhancement Techniques Using Neural Network Pattern Detection, IEEE 1997, 211-215.
Lejeune, Philippe et al., Minimizing Yield Loss with Parts Average Testing (PAT) and Other DPM Reduction Techniques, Tetradyne Users Group, 2006.
Lejeune, Philippe et al., Minimizing Yield Loss with Parts Average Testing (PAT) and Other DPM Reduction Techniques (Presentation), Tetradyne Users Group, 2006.
Sapozhnikova et al., The Use of dARTMAP and FUZZY ARTMAP to solve the quality testing task in Semiconductor Industry, IEEE.
Sikka, Automated Feature Detection & Characterization in Sort Wafer Maps.
Hansen et al, Process improvement through the analysis of spatially clustered defects on wafer maps.
Denby et al, A graphical user interface for spatial data analysis in integrated circuit manufacturing, AT& T Bell Laboratories.
Friedman e tal, Model-free estimation of defect clustering in integrated circuit fabrication.
Hansen et al, Monitoring wafer map data from integrated circuit fabrication processes for spatially clustered defects.
Xu, Statistical Problems in Semiconductor Manufacturing.
Gneiting, Measurement related and model parameter related statistics.
Agilent PDQ-WLR(tm) Test and analysis software environment—product note Agilent Technologies, 2000.
Advance Parametric Tester with HP SPECS, Hewlett-Packard Company 1999.
Renaud, Bertrand, Integrating Parts Average Testing (PAT) into the Production Test Process, Galaxy Semiconductor Solutions, PowerPoint presentation.
Salvioni, Emilio, Dynamic Test Cell Integration with PAT, Salland Engineering, May 9, 2006, PowerPoint presentation.

* cited by examiner

RESISTIVITY PROFILE

METHODS AND APPARATUS FOR DATA ANALYSIS

CROSS-REFERENCES TO RELATED APPLICATIONS

This application is:

a continuation of U.S. patent application Ser. No. 10/817,750, filed Apr. 2, 2004, entitled METHODS AND APPARATUS FOR DATA ANALYSIS, now U.S. Pat. No. 7,395,170, which is a continuation-in-part of U.S. patent application Ser. No. 10/730,388, filed on Dec. 7, 2003, entitled METHODS AND APPARATUS FOR DATA ANALYSIS, now U.S. Pat. No. 7,255,107, which is a continuation-in-part of U.S. patent application Ser. No. 10/367,355, filed on Feb. 14, 2003, entitled METHODS AND APPARATUS FOR DATA ANALYSIS, now U.S. Pat. No. 7,167,811, which is a continuation-in-part of U.S. patent application Ser. No. 10/154,627, filed on May 24, 2002, entitled METHODS AND APPARATUS FOR SEMICONDUCTOR TESTING, now U.S. Pat. No. 6,792,373, which is a continuation-in-part of U.S. patent application Ser. No. 09/872,195, filed on May 31, 2001, entitled METHODS AND APPARATUS FOR DATA SMOOTHING, now U.S. Pat. No. 6,782,297, which claims the benefit of U.S. Provisional Patent Application No. 60/293,577, filed May 24, 2001, entitled METHODS AND APPARATUS FOR DATA SMOOTHING; U.S. Provisional Patent Application No. 60/295,188, filed May 31, 2001, entitled METHODS AND APPARATUS FOR TEST DATA CONTROL AND ANALYSIS; and U.S. Provisional Patent Application No. 60/374,328, filed Apr. 21, 2002, entitled METHODS AND APPARATUS FOR TEST PROGRAM ANALYSIS AND ENHANCEMENT;

claims the benefit of U.S. Provisional Patent Application No. 60/483,003, filed Jun. 27, 2003, entitled DEVICE INDEPENDENT WAFERMAP ANALYSIS; and claims the benefit of U.S. Provisional Patent Application No. 60/546,088, filed Feb. 19, 2004, entitled DYNAMIC OUTLIER ALGORITHM SELECTION FOR QUALITY IMPROVEMENT AND TEST PROGRAM OPTIMIZATION, and incorporates the disclosure of each application by reference. To the extent that the present disclosure conflicts with any referenced application, however, the present disclosure is to be given priority.

FIELD OF THE INVENTION

The invention relates to data analysis.

BACKGROUND OF THE INVENTION

Semiconductor companies test components to ensure that the components operate properly. The test data not only determine whether the components function properly, but also may indicate deficiencies in the manufacturing process. Accordingly, many semiconductor companies analyze the collected data from several different components to identify and correct problems. For example, the company may gather test data for multiple chips on each wafer among several different lots. Test data may come from a variety of sources, such as parametric electrical testing, optical inspection, scanning electron microscopy, energy dispersive x-ray spectroscopy, and focused ion beam processes for defect analysis and fault isolation. This data may be analyzed to identify common deficiencies or patterns of defects or identify parts that may exhibit quality and performance issues and to identify or classify user-defined "good parts". Steps may then be taken to correct the problems. Testing is typically performed before device packaging (at wafer level) as well as upon completion of assembly (final test).

Gathering and analyzing test data is expensive and time consuming. Automatic testers apply signals to the components and read the corresponding output signals. The output signals may be analyzed to determine whether the component is operating properly. Each tester generates a large volume of data. For example, each tester may perform 200 tests on a single component, and each of those tests may be repeated 10 times. Consequently, a test of a single component may yield 2000 results. Because each tester is testing 100 or more components an hour and several testers may be connected to the same server, an enormous amount of data must be stored. Further, to process the data, the server typically stores the test data in a database to facilitate the manipulation and analysis of the data. Storage in a conventional database, however, requires further storage capacity as well as time to organize and store the data.

Furthermore, acquiring the test data presents a complex and painstaking process. A test engineer prepares a test program to instruct the tester to generate the input signals to the component and receive the output signals. The program tends to be very complex to ensure full and proper operation of the component. Consequently, the test program for a moderately complex integrated circuit involves a large number of tests and results. Preparing the program demands extensive design and modification to arrive at a satisfactory solution, and optimization of the program, for example to remove redundant tests or otherwise minimize test time, requires additional exertion.

The analysis of the gathered data is also difficult. The volume of the data may demand significant processing power and time. As a result, the data is not usually analyzed at product run time, but is instead typically analyzed between test runs or in other batches. To alleviate some of these burdens, some companies only sample the data from the testers and discard the rest. Analyzing less than all of the data, however, ensures that the resulting analysis cannot be fully complete and accurate. As a result, sampling degrades the complete understanding of the test results.

In addition, even when the full set of test data generated by the tester is retained, the sheer volume of the test data presents difficulties in analyzing the data and extracting meaningful results. The data may contain significant information about the devices, the testing process, and the manufacturing process that may be used to improve production, reliability, and testing. In view of the amount of data, however, isolating and presenting the information to the user or another system is challenging.

Furthermore, much of the data interpretation is performed manually by engineers who review the data and make deductions about the test and manufacturing process based on their experience and familiarity with the fabrication and test process. Although manual analysis is often effective, engineers understand the fabrication and test systems differently, and are thus prone to arriving at different subjective conclusions based on the same data. Another problem arises when experienced personnel leave the company or are otherwise unavailable, for their knowledge and understanding of the fabrication and test system and the interpretation of the test data cannot be easily transferred to other personnel.

BRIEF DESCRIPTION OF THE DRAWING

A more complete understanding of the present invention may be derived by referring to the detailed description and the claims when considered in connection with the following illustrative figures, which may not be to scale. Like reference numbers refer to similar elements throughout the figures.

Elements in the figures are illustrated for simplicity and clarity and have not necessarily been drawn to scale. For example, the connections and steps performed by some of the elements in the figures may be exaggerated or omitted relative to other elements to help to improve understanding of embodiments of the present invention.

DETAILED DESCRIPTION OF EXEMPLARY EMBODIMENTS

The present invention may be described in terms of functional block components and various process steps. Such functional blocks and steps may be realized by any number of hardware or software components configured to perform the specified functions. For example, the present invention may employ various testers, processors, storage systems, processes, and algorithms, e.g., statistical engines, memory elements, signal processing elements, neural networks, pattern analyzers, logic elements, programs, and the like, which may carry out a variety of functions under the control of one or more testers, microprocessors, or other control devices. In addition, the present invention may be practiced in conjunction with any number of test environments, and each system described is merely one exemplary application for the invention. Further, the present invention may employ any number of conventional techniques for data analysis, component interfacing, data processing, component handling, and the like.

Figure 1:
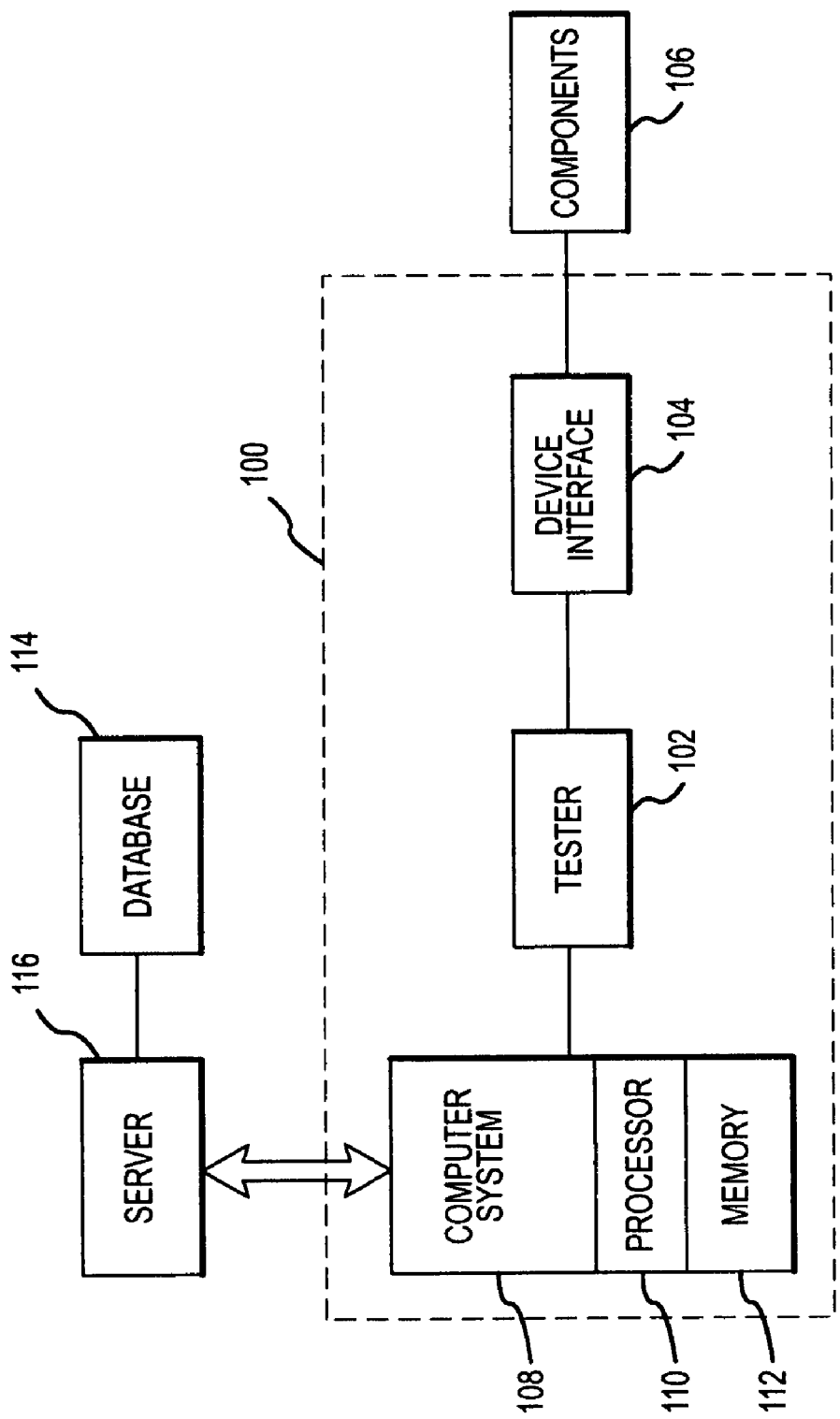
FIG. 1 is a block diagram of a test system according to various aspects of the present invention and associated functional components.
Figure 2:
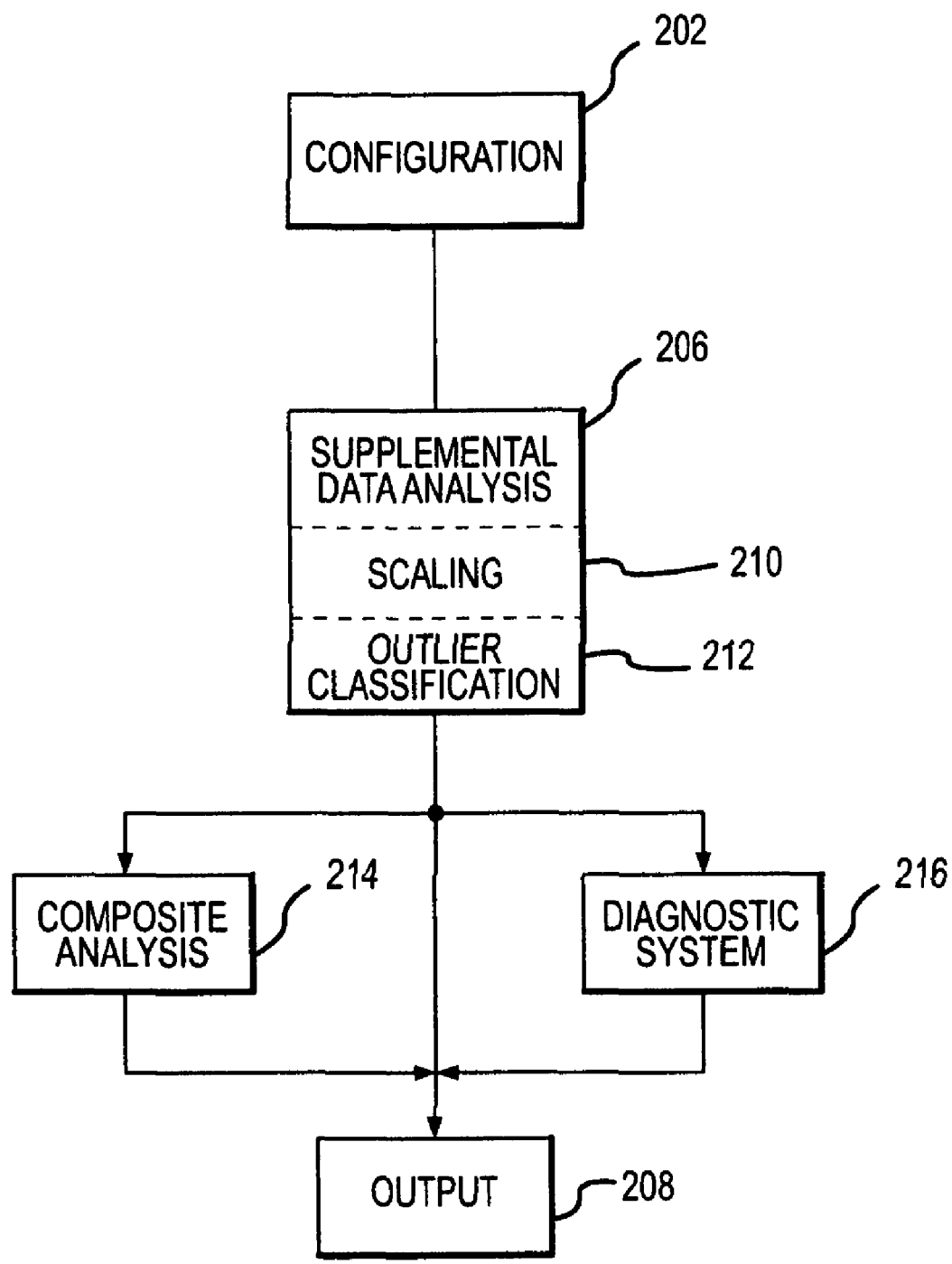
FIG. 2 is a block diagram of elements for operating the test system.

Referring to FIGS. 1 and 2, a method and apparatus according to various aspects of the present invention operates in conjunction with a test system 100 having a tester 102, such as automatic test equipment (ATE) for testing semiconductors. In the present embodiment, the test system 100 comprises a tester 102 and a computer system 108. The test system 100 may be configured for testing any components 106, such as semiconductor devices on a wafer, circuit boards, packaged devices, or other electrical or optical systems. In the present embodiment, the components 106 comprise multiple integrated circuit dies formed on a wafer or packaged integrated circuits or devices. The components 106 are created using a fabrication process, which may comprise any suitable manufacturing process for creating the components 106, and may include a test process, which may comprise any suitable process for testing the operation of the components 106.

The tester 102 suitably comprises any test equipment that tests components 106 and generates output data relating to the testing, and may comprise multiple machines or other sources of data. The tester 102 may comprise a conventional automatic tester, such as a Teradyne tester, and suitably operates in conjunction with other equipment for facilitating the testing. The tester 102 may be selected and configured according to the particular components 106 to be tested and/or any other appropriate criteria.

The tester 102 may operate in conjunction with the computer system 108 to, for example, program the tester 102, load and/or execute the test program, collect data, provide instructions to the tester 102, analyze test data, control tester parameters, and the like. In the present embodiment, the computer system 108 receives tester data from the tester 102 and performs various data analysis functions independently of the tester 102. The computer system 108 may implement a statistical engine to analyze data from the tester 102, as well as a diagnostic system 216 for identifying potential problems in the fabrication and/or test process based on the test data. The computer system 108 may comprise a separate computer, such as a personal computer or workstation, connected to or networked % with the tester 102 to exchange signals with the tester 102. In an alternative embodiment, the computer system 108 may be omitted from or integrated into other components of the test system 100, and various functions may be performed by other components, such as the tester 102 or elements connected to the network.

In the present exemplary system, the computer system 108 includes a processor 110 and a memory 112. The processor 110 comprises any suitable processor, such as a conventional Intel, Motorola, or Advanced Micro Devices processor, operating in conjunction with any suitable operating system, such as Windows XP, Unix, or Linux. Similarly, the memory 112 may comprise any appropriate memory accessible to the processor 110, such as a random access memory (RAM) or other suitable storage system, for storing data. In particular, the memory 112 of the present system includes a fast access memory for storing and receiving information and is suitably configured with sufficient capacity to facilitate the operation of the computer 108.

In the present embodiment, the memory 112 includes capacity for storing output results received from the tester 102 and facilitating analysis of the output test data. The memory 112 is configured for fast storage and retrieval of test data for analysis. In various embodiments, the memory 112 is configured to store the elements of a dynamic datalog, suitably comprising a set of information selected by the test system 100 and/or the operator according to selected criteria and analyses based on the test results.

For example, the memory 112 suitably stores a component identifier for each component 106, such as x-y coordinates corresponding to a position of the component 106 on a wafer map for the tested wafer. Each x-y coordinate in the memory 112 may be associated With a particular component 106 at the corresponding x-y coordinate on the wafer map. Each component identifier has one or more fields, and each field corresponds, for example, to a particular test performed on the component 106 at the corresponding x-y position on the wafer, a statistic related to the corresponding component 106, or other relevant data. The memory 112 may be configured to include any data identified by the user as desired according to any criteria or rules.

The computer 108 of the present embodiment also suitably has access to a storage system, such as another memory (or a portion of the memory 112), a hard drive array, an optical storage system, or other suitable storage system. The storage system may be local, like a hard drive dedicated to the computer 108 or the tester 102, or may be remote, such as a hard drive array associated with a server to which the test system 100 is connected. The storage system may store programs and/or data used by the computer 108 or other components of the test system 100. In the present embodiment, the storage system comprises a database 114 available via a remote server 116 comprising, for example, a main production server for a manufacturing facility. The database 114 stores tester information, such as tester data files, master data files for operating the test system 100 and its components, test programs, downloadable instructions for the test system 100, and the like. In addition, the storage system may comprise complete tester data files, such as historical tester data files retained for analysis.

The test system 100 may include additional equipment to facilitate testing of the components 106. For example, the present test system 100 includes a device interface 104, like a conventional device interface board and/or a device handler or prober, to handle the components 106 and provide an interface between the components 106 and the tester 102. The test system 100 may include or be connected to other components, equipment, software, and the like to facilitate testing of the components 106 according to the particular configuration, application, environment of the test system 100, or other relevant factors. For example, in the present embodiment, the test system 100 is connected to an appropriate communication medium, such as a local area network, intranet, or global network like the internet, to transmit information to other systems, such as the remote server 116.

The test system 100 may include one or more testers 102 and one or more computers 108. For example, one computer 108 may be connected to an appropriate number of, such as up to twenty or more, testers 102 according to various factors, such as the system's throughput and the configuration of the computer 108. Further, the computer 108 may be separate from the tester 102, or may be integrated into the tester 102, for example utilizing one or more processors, memories, clock circuits, and the like of the tester 102 itself. In addition, various functions may be performed by different computers. For example, a first computer may perform various pre-analysis tasks, several computers may then receive the data and perform data analysis, and another set of computers may prepare the dynamic datalogs and/or other output analyses and reports.

A test system 100 according to various aspects of the present invention tests the components 106 and provides enhanced analysis and test results. For example, the enhanced analysis may identify incorrect, questionable, or unusual results, repetitive tests, and/or tests with a relatively high probability of failure. The test system 100 may also analyze multiple sets of data, such as data taken from multiple wafers and/or lots of wafers, to generate composite data based on multiple datasets. Various data may also be used by the test system 100 to diagnose characteristics in the fabrication, test, and/or other process, such as problems, inefficiencies, potential hazards, instabilities, or other aspects that may be identified via the test data. The operator, such as the product engineer, test engineer, manufacturing engineer, device engineer, or other personnel using the test data and analyses, may then use the results to verify and/or improve the test system 100 and/or the fabrication system and classify the components 106.

The test system 100 according to various aspects of the present invention executes an enhanced test process for testing the components 106 and collecting and analyzing test data. The test system 100 suitably operates in conjunction with a software application executed by the computer 108. Referring to FIG. 2, the software application of the present embodiment includes multiple elements for implementing the enhanced test process, including a configuration element 202, a supplementary data analysis element 206, and an output element 208. The test system 100 may also include a composite analysis element 214 for analyzing data from more than one dataset. Further, the test system may include a diagnostic system 216 for identifying characteristics and potential problems using the test data.

Each element 202, 206, 208, 214, 216 suitably comprises a software module operating on the computer 108 to perform various tasks. Generally, the configuration element 202 prepares test system 100 for testing and analysis. In the supplementary data analysis element 206, output test data from the tester 102 is analyzed to generate supplementary test data, suitably at run time and automatically. The supplementary test data is then transmitted to the operator or another system, such as the composite analysis element 214, the diagnostic system 216, and/or the output element 208.

The configuration element 202 configures the test system 100 for testing the components 106 and analyzing the test data. The test system 100 suitably uses a predetermined set of initial parameters and, if desired, information from the operator to configure the test system 100. The test system 100 is suitably initially configured with predetermined or default parameters to minimize operator attendance to the test system 100. Adjustments may be made to the configuration by the operator, if desired, for example via the computer 108.

Figure 3:
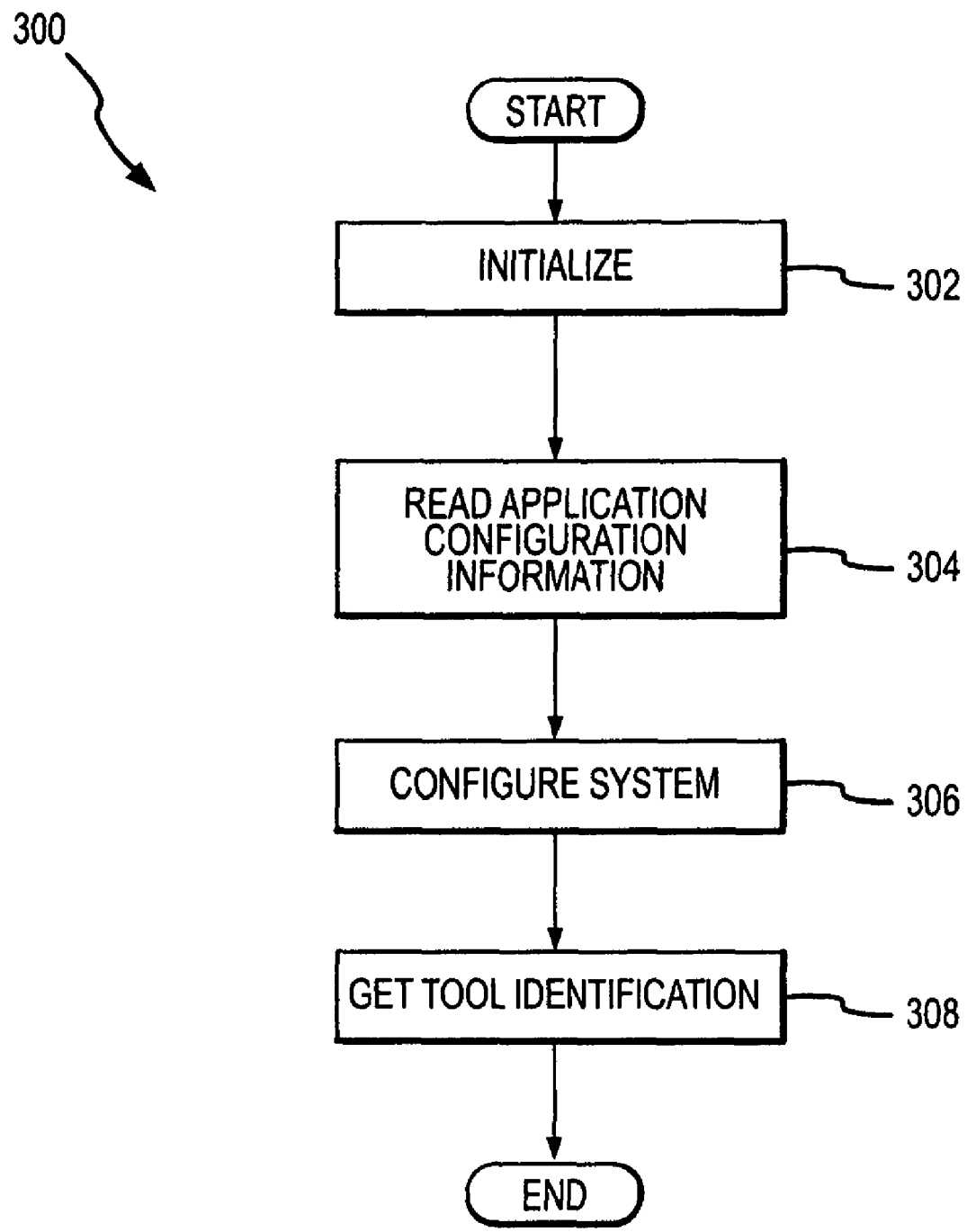
FIG. 3 illustrates a flow diagram for a configuration element.

Referring to FIG. 3, an exemplary configuration process 300 performed by the configuration element 202 begins with an initialization procedure (step 302) to set the computer 108 in an initial state. The configuration element 202 then obtains application configuration information (step 304), for example from the database 114, for the computer 108 and the tester 102. For example, the configuration element 202 may access a master configuration file for the enhanced test process and/or a tool configuration file relating to the tester 102. The master configuration file may contain data relating to the proper configuration for the computer 108 and other components of the test system 100 to execute the enhanced test process. Similarly, the tool configuration file suitably includes data relating to the tester 102 configuration, such as connection, directory, IP address, tester node identification, manufacturer, flags, prober identification, or any other pertinent information for the tester 102.

The configuration element 202 may then configure the test system 100 according to the data contained in the master configuration file and/or the tool configuration file (step 306). In addition, the configuration element 202 may use the configuration data to retrieve further relevant information from the database 114, such as the tester's 102 identifier (step 308) for associating data like logistics instances for tester data with the tester 102. The test system 100 information also suitably includes one or more default parameters that may be accepted, declined, or adjusted by the operator. For example, the test system 100 information may include global statistical process control (SPC) rules and goals that are submitted to the operator upon installation, configuration, power-up, or other appropriate time for approval and/or modification. The test system 100 information may also include default wafer maps or other files that are suitably configured for each product, wafer, component 106, or other item that may affect or be affected by the test system 100. The configuration algorithms, parameters, and any other criteria may be stored in a recipe file for easy access, correlation to specific products and/or tests, and for traceability.

When the initial configuration process is complete, the test system 100 commences a test run, for example in conjunction with a conventional series of tests, in accordance with a test program. The tester 102 suitably executes the test program to apply signals to connections on the components 106 and read output test data from the components 106. The tester 102 may perform multiple tests on each component 106 on a wafer or the wafer itself, and each test may be repeated several times on the same component 106. The tests may comprise any appropriate tests, such as (but not limited to) continuity, supply current, leakage current, parametric static, parametric dynamic, and functional and stress tests. Test data from the tester 102 is stored for quick access and supplemental analysis as the test data is acquired. The data may also be stored in a long-term memory for subsequent analysis and use.

Figure 9:
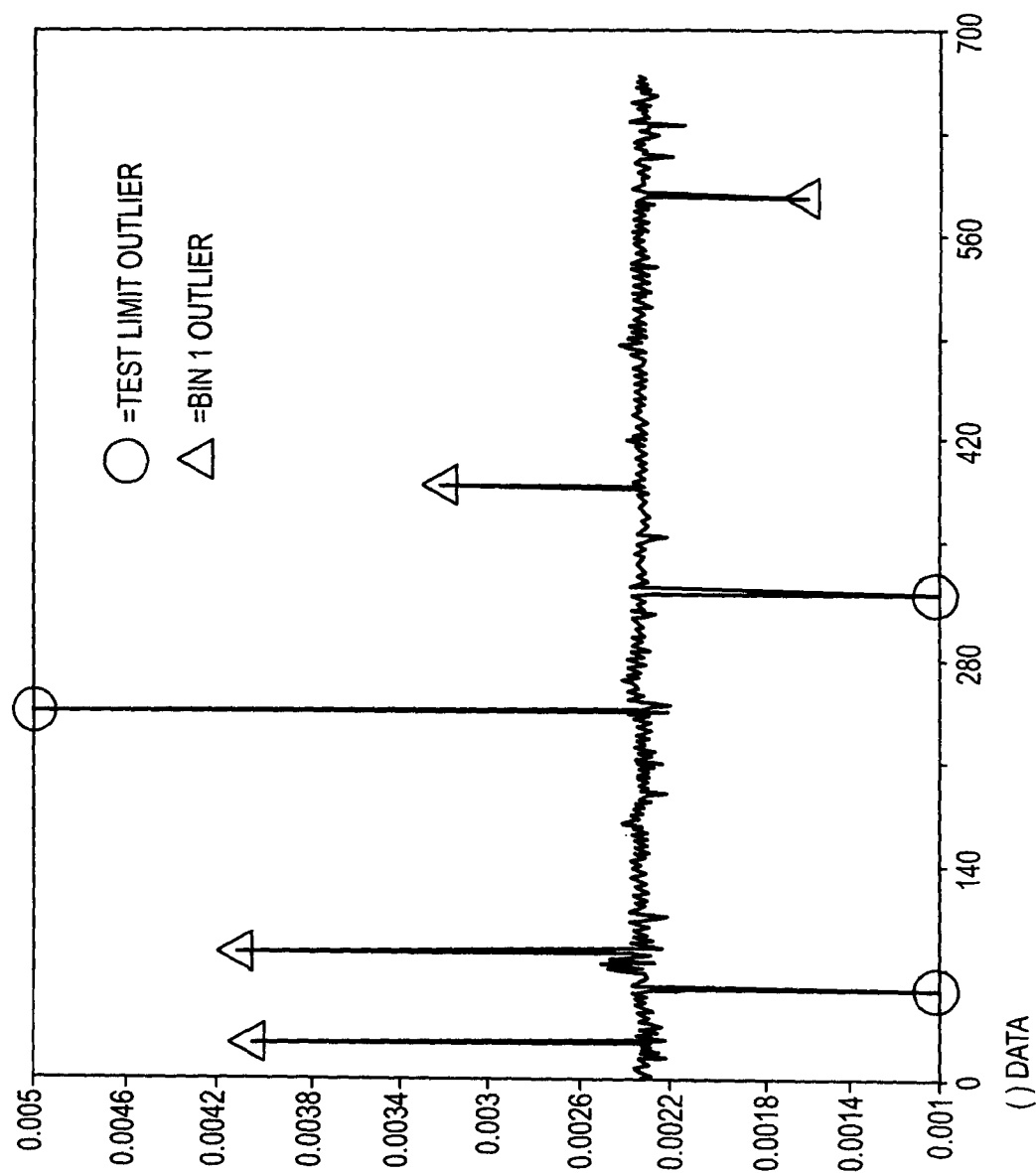
FIG. 9 is a plot of test data for a test of multiple components.

Each test generates at least one result for at least one of the components 106. Referring to FIG. 9, an exemplary set of test results for a single test of multiple components 106 comprises a first set of test results having statistically similar values and a second set of test results characterized by values that stray from the first set. Each test result may be compared to an upper test limit and a lower test limit. If a particular result for a component 106 exceeds either limit, the component 106 may be classified as a "bad part" or otherwise classified according to the test and/or the test result.

Some of the test results in the second set that stray from the first set may exceed the control limits, while others do not. For the present purposes, those test results that stray from the first set but do not exceed the control limits or otherwise fail to be detected are referred to as "outliers". The outliers in the test results may be identified and analyzed for any appropriate purpose, such as to identify potentially unreliable components 106. The outliers may also be used to identify a various potential problems and/or improvements in the test and manufacturing processes.

As the tester 102 generates the test results, the output test data for each component, test, and repetition is stored by the tester 102 in a tester data file. The output test data received from each component 106 is analyzed by the tester 102 to classify the performance of the component 106, such as into a particular bin classification, for example by comparison to the upper and lower test limits, and the results of the classification are also stored in the tester data file. The tester data file may include additional information as well, such as logistics data and test program identification data. The tester data file is then provided to the computer 108 in an output file, such as a standard tester data format (STDF) file, and stored in memory 112. The tester data file may also be stored in the storage system for longer term storage for later analysis, such as by the composite analysis element 214.

When the computer 108 receives the tester data file, the supplementary data analysis element 206 analyzes the data to provide enhanced output results. The supplementary data analysis element 206 may provide any appropriate analysis of the tester data to achieve any suitable objective. For example, the supplementary data analysis element 206 may implement a statistical engine for analyzing the output test data at run time and identifying data and characteristics of the data of interest to the operator. The data and characteristics identified may be stored, while data that is not identified may be otherwise disposed of, such as discarded.

The supplementary data analysis element 206 may, for example, calculate statistical figures according to the data and a set of statistical configuration data. The statistical configuration data may call for any suitable type of analysis according to the needs of the test system 100 and/or the operator, such as statistical process control, outlier identification and classification, signature analyses, and data correlation. Further, the supplementary data analysis element 206 suitably performs the analysis at run time, i.e. within a matter of seconds or minutes following generation of the test data. The supplementary data analysis element 206 may also perform the analysis automatically with minimal intervention from the operator and/or test engineer.

Figure 4A:
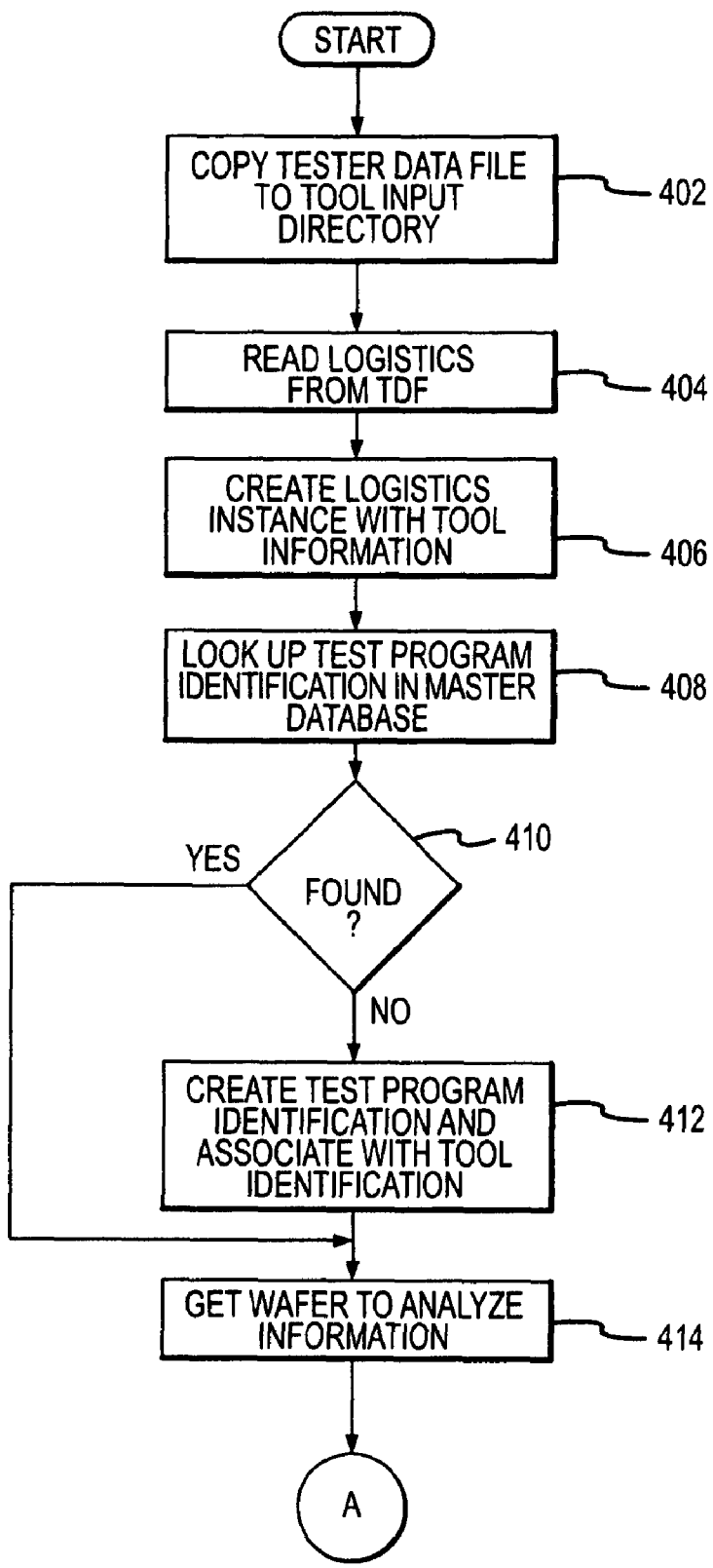
FIGS. 4A-C illustrate a flow diagram for a supplemental data analysis element.
Figure 4B:
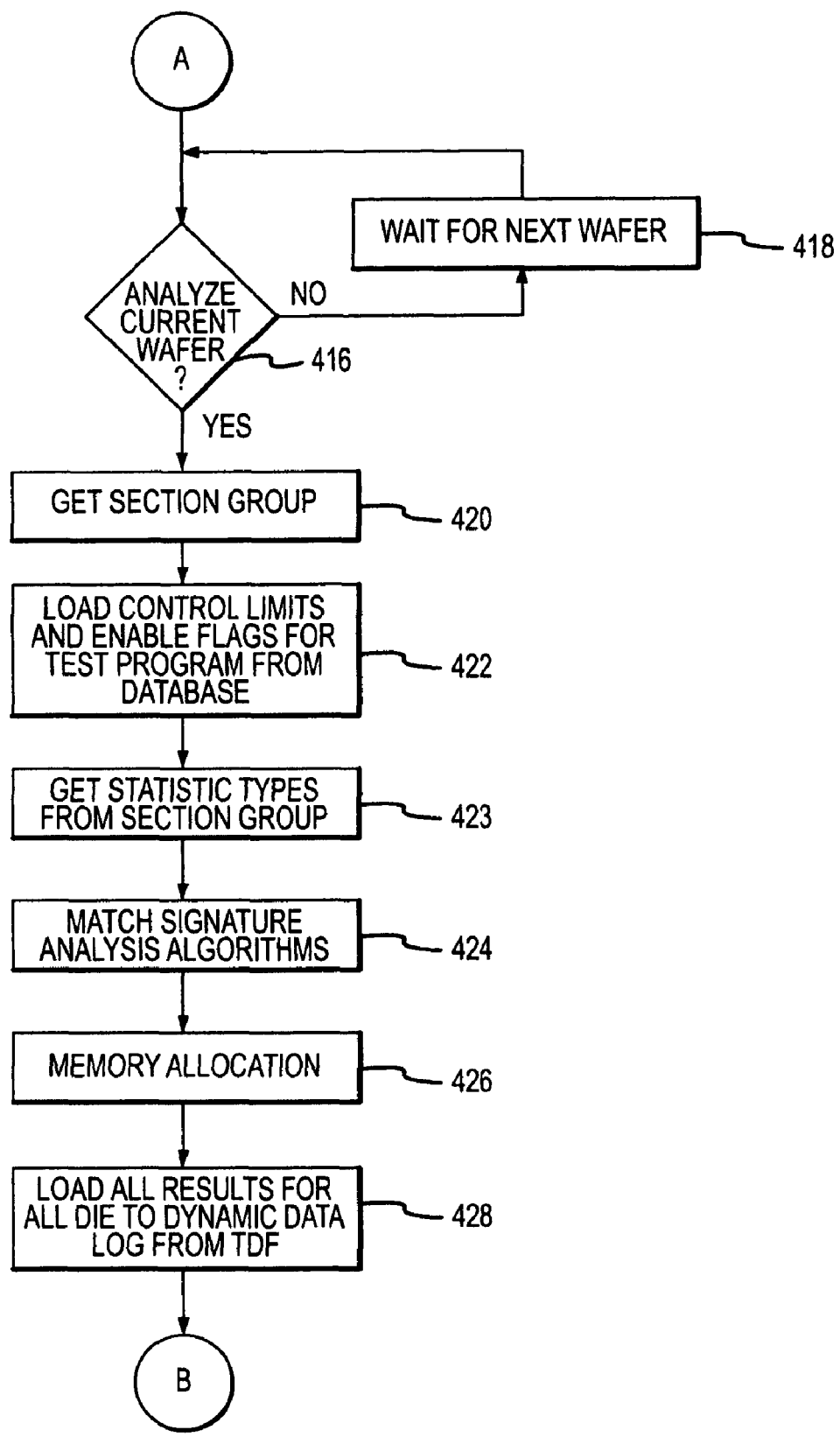
Figure 4C:
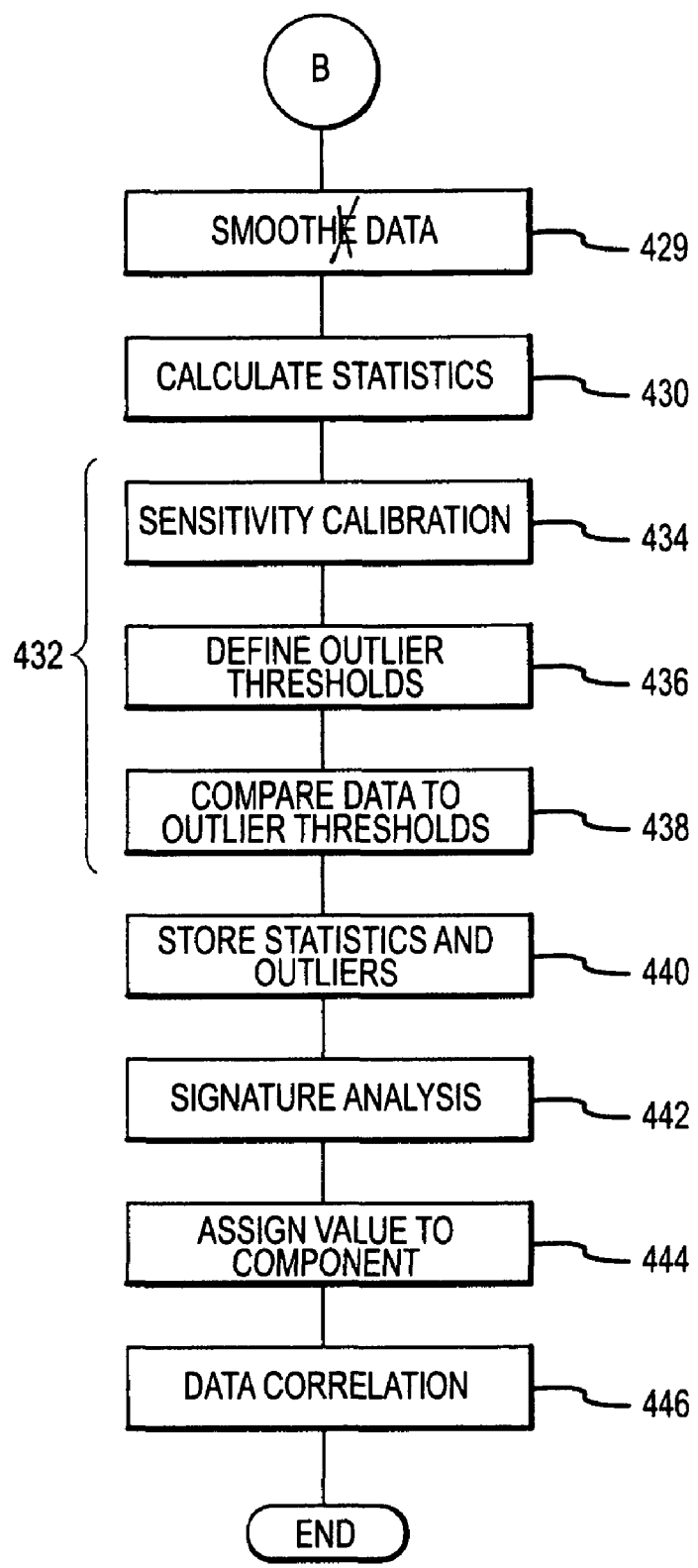

In the present test system 100, after the computer 108 receives and stores the tester data file, the supplementary data analysis element 206 performs various preliminary tasks to prepare the computer 108 for analysis of the output test data and facilitate generation of supplementary data and preparation of an output report. Referring now to FIGS. 4A-C, in the present embodiment, the supplementary data analysis element 206 initially copies the tester data file to a tool input directory corresponding to the relevant tester 102 (step 402). The supplementary data analysis element 206 also retrieves configuration data to prepare the computer 108 for supplementary analysis of the output test data.

The configuration data suitably includes a set of logistics data that may be retrieved from the tester data file (step 404). The supplementary data analysis element 206 also creates a logistics reference (step 406). The logistics reference may include tester 102 information, such as the tester 102 information derived from the tool configuration file. In addition, the logistics reference is assigned an identification.

The configuration data may also include an identifier for the test program that generated the output test data. The test program may be identified in any suitable manner, such as looking it up in the database 114 (step 408), by association with the tester 102 identification, or reading it from the master configuration file. If no test program identification can be established (step 410), a test program identification may be created and associated with the tester 102 (step 412).

The configuration data further identifies the wafers in the test run to be processed by the supplementary data analysis element 206, if fewer than all of the wafers. In the present embodiment, the supplementary data analysis element 206 accesses a file indicating which wafers are to be analyzed (step 414). If no indication is provided, the computer 108 suitably defaults to analyzing all of the wafers in the test run.

If the wafer for the current test data file is to be analyzed (step 416), the supplementary data analysis element 206 proceeds with performing the supplementary data analysis on the test data file for the wafer. Otherwise, the supplementary data analysis element 206 waits for or accesses the next test data file (step 418).

The supplementary data analysis element 206 may establish one or more section groups to be analyzed for the various wafers to be tested (step 420). To identify the appropriate section group to apply to the output test data, the supplementary data analysis element 206 suitably identifies an appropriate section group definition, for example according to the test program and/or the tester identification. Each section group includes one or more section arrays, and each section array includes one or more sections of the same section types.

Figure 5:
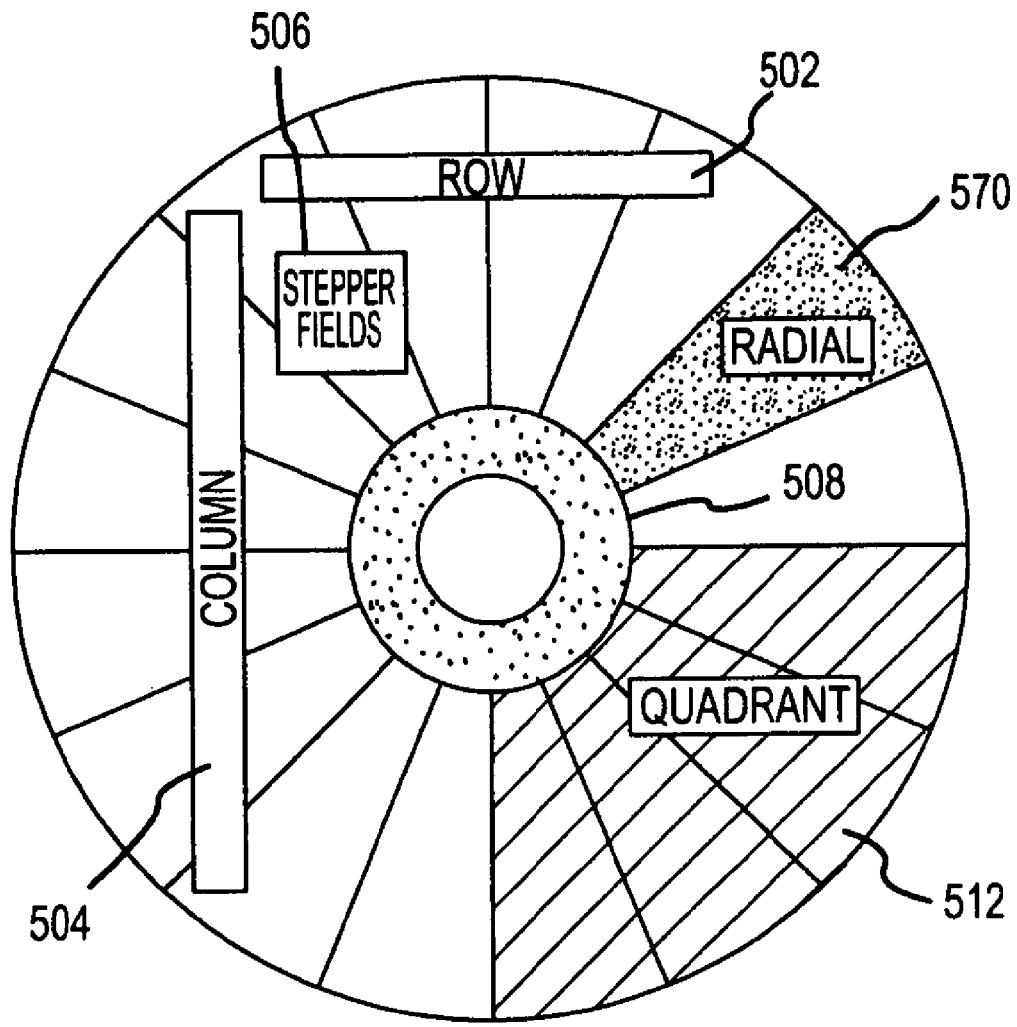
FIG. 5 is a diagram of various sections of a wafer and sectioning techniques.

Section types comprise various sorts of component 106 groups positioned in predetermined areas of the wafer. For example, referring to FIG. 5, a section type may include a row 502, a column 504, a stepper field 506, a circular band 508, a radial zone 570, a quadrant 512, or any other desired grouping of components 106. Different section types may be used according to the configuration of the components 106, such as order of components 106 processed, sections of a tube, or the like. Such groups of components 106 are analyzed together to identify, for example, common defects or characteristics that may be associated with the group. For example, if a particular portion of the wafer does not conduct heat like other portions of the wafer, the test data for a particular group of components 106 may reflect common characteristics or defects associated with the uneven heating of the wafer.

Upon identifying the section group for the current tester data file, the supplemental data analysis element 206 retrieves any further relevant configuration data, such as control limits and enable flags for the test program and/or tester 102 (step 422). In particular, the supplemental data analysis element 206 suitably retrieves a set of desired statistics or calculations associated with each section array in the section group (step 423). Desired statistics and calculations may be designated in any manner, such as by the operator or retrieved from a file. Further, the supplemental data analysis element 206 may also identify one or more signature analysis algorithms (step 424) for each relevant section type or other appropriate variation relating to the wafer and retrieve the signature algorithms from the database 114 as well.

All of the configuration data may be provided by default or automatically accessed by the configuration element 202 or the supplemental data analysis element 206. Further, the configuration element 202 and the supplemental data analysis element 206 of the present embodiment suitably allow the operator to change the configuration data according to the operator's wishes or the test system 100 requirements. When the configuration data have been selected, the configuration data may be associated with relevant criteria and stored for future use as default configuration data. For example, if the operator selects a certain section group for a particular kind of components 106, the computer 108 may automatically use the same section group for all such components 106 unless instructed otherwise by the operator.

The supplemental data analysis element 206 also provides for configuration and storage of the tester data file and additional data. The supplemental data analysis element 206 suitably allocates memory (step 426), such as a portion of the memory 112, for the data to be stored. The allocation suitably provides memory for all of the data to be stored by the supplemental data analysis element 206, including output test data from the tester data file, statistical data generated by the supplemental data analysis element 206, control parameters, and the like. The amount of memory allocated may be calculated according to, for example, the number of tests performed on the components 106, the number of section group arrays, the control limits, statistical calculations to be performed by the supplementary data analysis element 206, and the like.

When all of the configuration data for performing the supplementary analysis are ready and upon receipt of the output test data, the supplementary data analysis element 206 loads the relevant test data into memory (step 428) and performs the supplementary analysis on the output test data. The supplementary data analysis element 206 may perform any number and types of data analyses according to the components 106, configuration of the test system 100, desires of the operator, or other relevant criteria. The supplemental data analysis element 206 may be configured to analyze the sections for selected characteristics identifying potentially defective components 106 and patterns, trends, or other characteristics in the output test data that may indicate manufacturing concerns or flaws.

The present supplementary data analysis element 206, for example, smoothes the output test data, calculates and analyzes various statistics based on the output test data, and identifies data and/or components 106 corresponding to various criteria. The present supplementary data analysis element 206 may also classify and correlate the output test data to provide information to the operator and/or test engineer relating to the components 106 and the test system 100. For example, the present supplementary data analysis element 206 may perform output data correlations, for example to identify potentially related or redundant tests, and an outlier incidence analysis to identify tests having frequent outliers.

The supplementary data analysis element 206 may include a smoothing system to initially process the tester data to smooth the data and assist in the identification of outliers (step 429). The smoothing system may also identify significant changes in the data, trends, and the like, which may be provided to the operator by the output element 208. The smoothing system is suitably implemented, for example, as a program operating on the computer system 108. The smoothing system suitably comprises multiple phases for smoothing the data according to various criteria. The first phase may include a basic smoothing process. The supplemental phases conditionally provide for enhanced tracking and/or additional smoothing of the test data.

The smoothing system suitably operates by initially adjusting an initial value of a selected tester datum according to a first smoothing technique, and supplementally adjusting the value according to a second smoothing technique if at least one of the initial value and the initially adjusted value meets a threshold. The first smoothing technique tends to smooth the data. The second smoothing technique also tends to smooth the data and/or improve tracking of the data, but in a different manner from the first smoothing technique. Further, the threshold may comprise any suitable criteria for determining whether to apply supplemental smoothing. The smoothing system suitably compares a plurality of preceding adjusted data to a plurality of preceding raw data to generate a comparison result, and applies a second smoothing technique to the selected datum to adjust the value of the selected datum according to whether the comparison result meets a first threshold. Further, the smoothing system suitably calculates a predicted value of the selected datum, and may apply a third smoothing technique to the selected datum to adjust the value of the selected datum according to whether the predicted value meets a second threshold.

Figure 8:
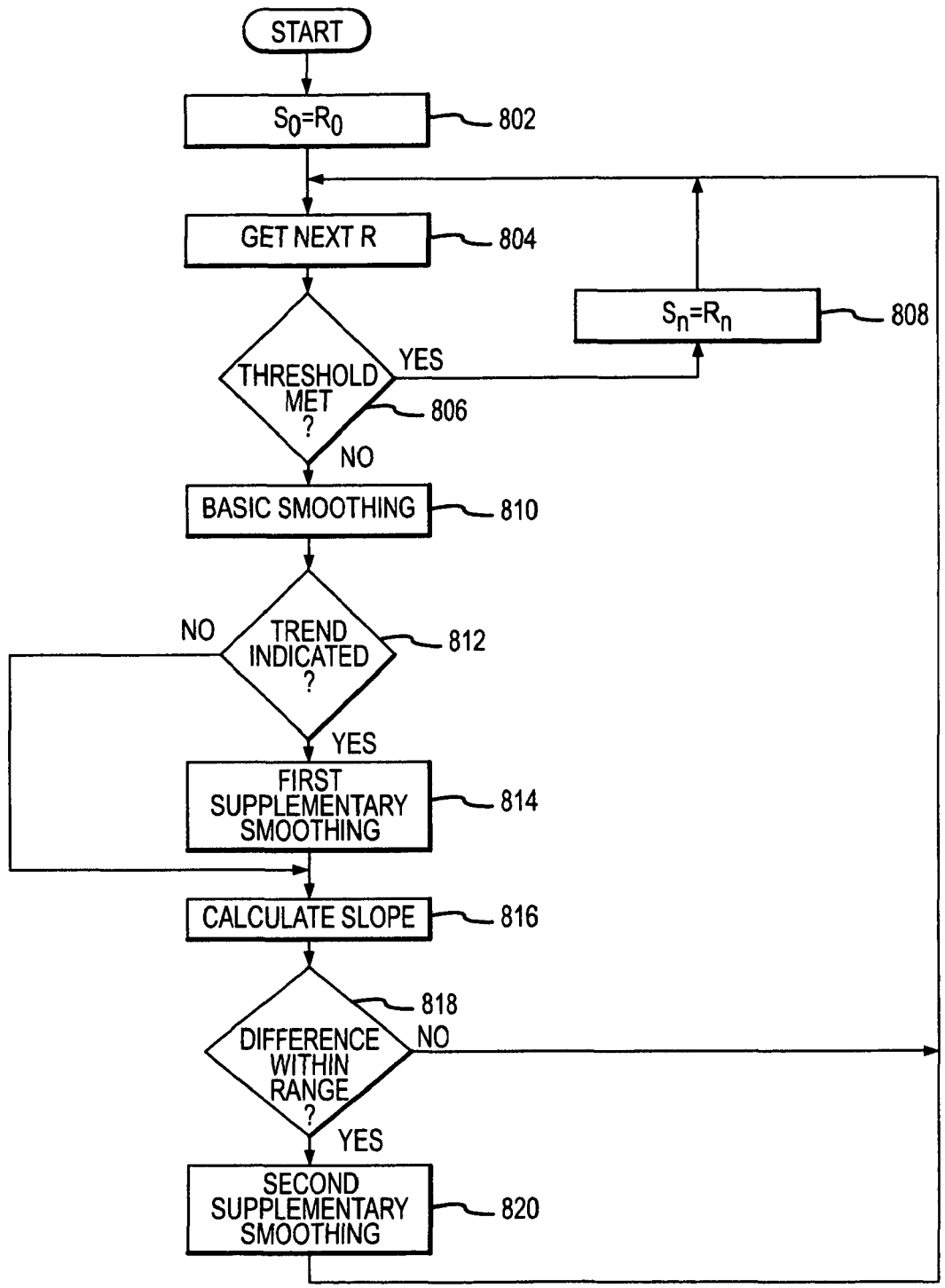
FIG. 8 is a flow diagram for operation of an exemplary data smoothing system according to various aspects of the present invention.

Referring to FIG. 8, a first smoothed test data point is suitably set equal to a first raw test data point (step 802) and the smoothing system proceeds to the next raw test data point (step 804). Before performing smoothing operations, the smoothing system initially determines whether smoothing is appropriate for the data point and, if so, performs a basic smoothing operation on the data Any criteria may be applied to determine whether smoothing is appropriate, such as according to the number of data points received, the deviation of the data point values from a selected value, or comparison of each data point value to a threshold. In the present embodiment, the smoothing system performs a threshold comparison. The threshold comparison determines whether data smoothing is appropriate. If so, the initial smoothing process is suitably configured to proceed to an initial smoothing of the data.

More particularly, in the present embodiment, the process starts with an initial raw data point $R_0$, which is also designated as the first smoothed data point $S_0$. As additional data points are received and analyzed, a difference between each raw data point ($R_n$) and a preceding smoothed data point ($S_{n-1}$) is calculated and compared to a threshold ($T_1$) (step 806). If the difference between the raw data point $R_n$ and the preceding smoothed data point $S_{n-1}$ exceeds the threshold $T_1$, it is assumed that the exceeded threshold corresponds to a significant departure from the smoothed data and indicates a shift in the data. Accordingly, the occurrence of the threshold crossing may be noted and the current smoothed data point $S_n$ is set equal to the raw data point $R_n$ (step 808). No smoothing is performed, and the process proceeds to the next raw data point.

If the difference between the raw data point and the preceding smoothed data point does not exceed the threshold $T_1$, the process calculates a current smoothed data point $S_n$ in conjunction with an initial smoothing process (step 810). The initial smoothing process provides a basic smoothing of the data. For example, in the present embodiment, the basic smoothing process comprises a conventional exponential smoothing process, such as according to the following equation:

$$S_n = (R_n - S_{n-1}) * M_1 + S_{n-1}$$

where $M_1$ is a selected smoothing coefficient, such as 0.2 or 0.3.

The initial smoothing process suitably uses a relatively low coefficient $M_1$ to provide a significant amount of smoothing for the data. The initial smoothing process and coefficients may be selected according to any criteria and configured in any manner, however, according to the application of the smoothing system, the data processed, requirements and capabilities of the smoothing system, and/or any other criteria. For example, the initial smoothing process may employ random, random walk, moving average, simple exponential, linear exponential, seasonal exponential, exponential weighted moving average, or any other appropriate type of smoothing to initially smooth the data.

The data may be further analyzed for and/or subjected to smoothing. Supplementary smoothing may be performed on the data to enhance the smoothing of the data and/or improve the tracking of the smoothed data to the raw data. Multiple phases of supplementary smoothing may also be considered and, if appropriate, applied. The various phases may be independent, interdependent, or complementary. In addition, the data may be analyzed to determine whether supplementary smoothing is appropriate.

In the present embodiment, the data is analyzed to determine whether to perform one or more additional phases of smoothing. The data is analyzed according to any appropriate criteria to determine whether supplementary smoothing may be applied (step 812). For example, the smoothing system identify trends in the data, such as by comparing a plurality of adjusted data points and raw data points for preceding data and generating a comparison result according to whether substantially all of the preceding adjusted data share a common relationship (such as less than, greater than, or equal to) with substantially all of the corresponding raw data.

The smoothing system of the present embodiment compares a selected number $P_2$ of raw data points to an equal number of smoothed data points. If the values of all of the $P_2$ raw data points exceed (or are equal to) the corresponding smoothed data points, or if all raw data points are less than (or equal to) the corresponding smoothed data points, then the smoothing system may determine that the data is exhibiting a trend and should be tracked more closely. Accordingly, the occurrence may be noted and the smoothing applied to the data may be changed by applying supplementary smoothing. If, on the other hand, neither of these criteria is satisfied, then the current smoothed data point remains as originally calculated and the relevant supplementary data smoothing is not applied.

In the present embodiment, the criterion for comparing the smoothed data to the raw data is selected to identify a trend in the data behind which the smoothed data may be lagging. Accordingly, the number of points $P_2$ may be selected according to the desired sensitivity of the system to changing trends in the raw data.

The supplementary smoothing changes the effect of the overall smoothing according to the data analysis. Any appropriate supplementary smoothing may be applied to the data to more effectively smooth the data or track a trend in the data. For example, in the present embodiment, if the data analysis indicates a trend in the data that should be tracked more closely, then the supplementary smoothing may be applied to reduce the degree of smoothing initially applied so that the smoothed data more closely tracks the raw data (step 814).

In the present embodiment, the degree of smoothing is reduced by recalculating the value for the current smoothed data point using a reduced degree of smoothing. Any suitable smoothing system may be used to more effectively track the data or otherwise respond to the results of the data analysis. In the present embodiment, another conventional exponential smoothing process is applied to the data using a higher coefficient $M_2$:

$$S_n = (R_n - S_{n-1}) * M_2 + S_{n-1}$$

The coefficients $M_1$ and $M_2$ may be selected according to the desired sensitivity of the system, both in the absence ($M_1$) and the presence ($M_2$) of trends in the raw data. In various applications, for example, the value of $M_1$ may be higher than the value of $M_2$.

The supplementary data smoothing may include additional phases as well. The additional phases of data smoothing may similarly analyze the data in some manner to determine whether additional data smoothing should be applied. Any number of phases and types of data smoothing may be applied or considered according to the data analysis.

For example, in the present embodiment, the data may be analyzed and potentially smoothed for noise control, such as using a predictive process based on the slope, or trend, of the smoothed data. The smoothing system computes a slope (step 816) based on a selected number $P_3$ of smoothed data points preceding the current data point according to any appropriate process, such as linear regression, N-points centered, or the like. In the present embodiment, the data smoothing system uses a "least squares fit through line" process to establish a slope of the preceding $P_3$ smoothed data points.

The smoothing system predicts a value of the current smoothed data point according to the calculated slope. The system then compares the difference between the previously calculated value for the current smoothed data point ($S_n$) to the predicted value for the current smoothed data point to a range number ($R_3$) (step 818). If the difference is greater than the range $R_3$, then the occurrence may be noted and the current smoothed data point is not adjusted. If the difference is within the range $R_3$, then the current smoothed data point is set equal to the difference between the calculated current smoothed data point ($S_n$) and the predicted value for the current smoothed data point ($S_{n\_pred}$) multiplied by a third multiplier $M_3$ and added to the original value of the current smoothed data point (step 820). The equation:

$$S_n = (S_{n\_pred} - S_n) * M_3 + S_n$$

Thus, the current smoothed data point is set according to a modified difference between the original smoothed data point and the predicted smoothed data point, but reduced by a certain amount (when $M_3$ is less than 1). Applying the predictive smoothing tends to reduce point-to-point noise sensitivity during relatively flat (or otherwise non-trending) portions of the signal. The limited application of the predictive smoothing process to the smoothed data points ensures that the calculated average based on the slope does not affect the smoothed data when significant changes are occurring in the raw data, i.e., when the raw data signal is not relatively flat.

After smoothing the data, the supplementary data analysis element 206 may proceed with further analysis of the tester data. For example, the supplementary data analysis element 206 may conduct statistical process control (SPC) calculations and analyses on the output test data. More particularly, referring again to FIG. 4A-C, the supplemental data analysis element 206 may calculate and store desired statistics for a particular component 106, test, and/or section (step 430). The statistics may comprise any statistics useful to the operator or the test system 100, such as SPC figures that may include averages, standard deviations, minima, maxima, sums, counts, Cp, Cpk, or any other appropriate statistics.

The supplementary data analysis element 206 also suitably performs a signature analysis to dynamically and automatically identify, trends and anomalies in the data, for example according to section, based on a combination of test results for that section and/or other data, such as historical data (step 442). The signature analysis identifies signatures and applies a weighting system, suitably configured by the operator, based on any suitable data, such as the test data or identification of defects. The signature analysis may cumulatively identify trends and anomalies that may correspond to problem areas or other characteristics of the wafer or the fabrication process. Signature analysis may be conducted for any desired signatures, such as noise peaks, waveform variations, mode shifts, and noise. In the present embodiment, the computer 108 suitably performs the signature analysis on the output test data for each desired test in each desired section.

In the present embodiment, a signature analysis process may be performed in conjunction with the smoothing process. As the smoothing process analyzes the tester data, results of the analysis indicating a trend or anomaly in the data are stored as being indicative of a change in the data or an outlier that may be of significance to the operator and/or test engineer. For example, if a trend is indicated by a comparison of sets of data in the smoothing process, the occurrence of the trend may be noted and stored. Similarly, if a data point exceeds the threshold $T_1$ in the data smoothing process, the occurrence may be noted and stored for later analysis and/or inclusion in the output report.

Figure 6A:
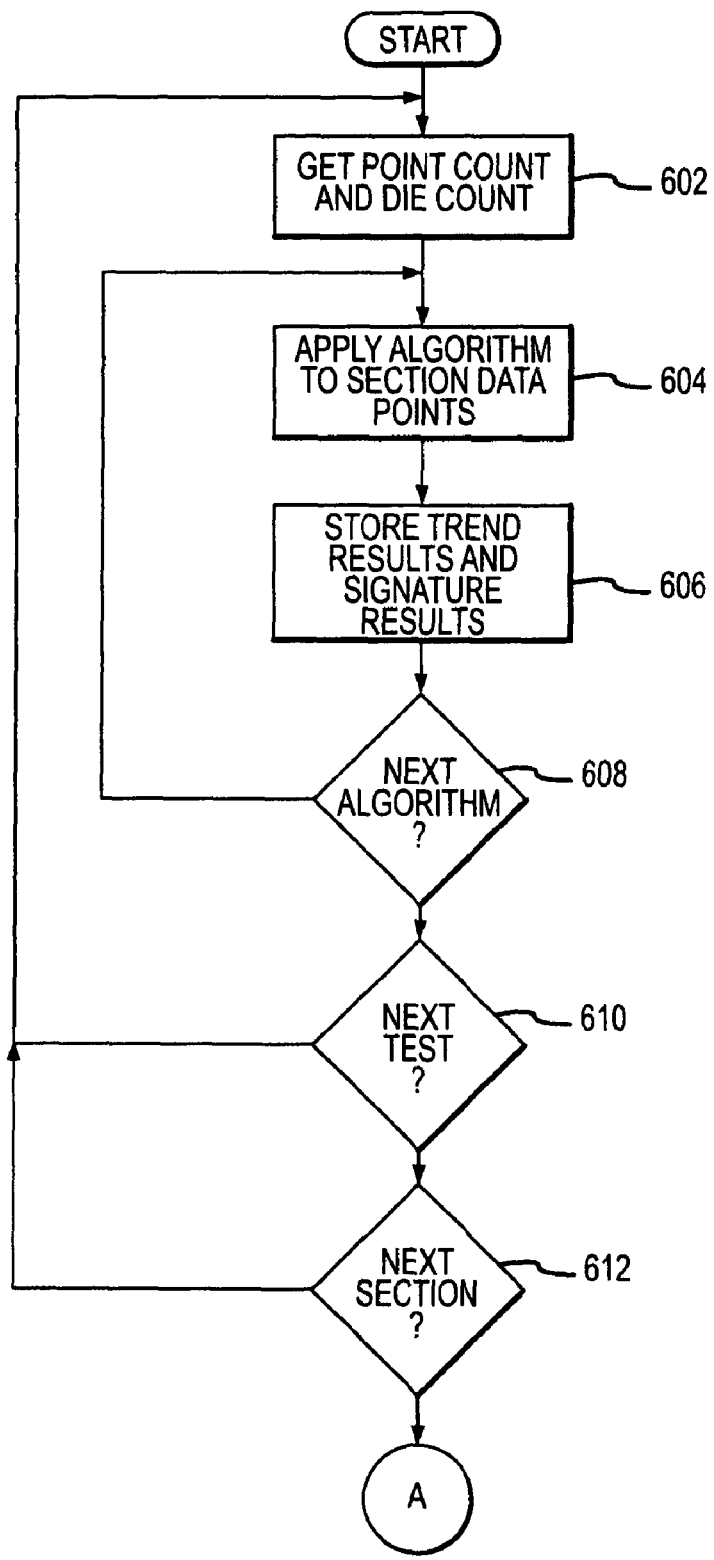
FIGS. 6A-B further illustrate a flow diagram for a supplemental data analysis element.
Figure 6B:
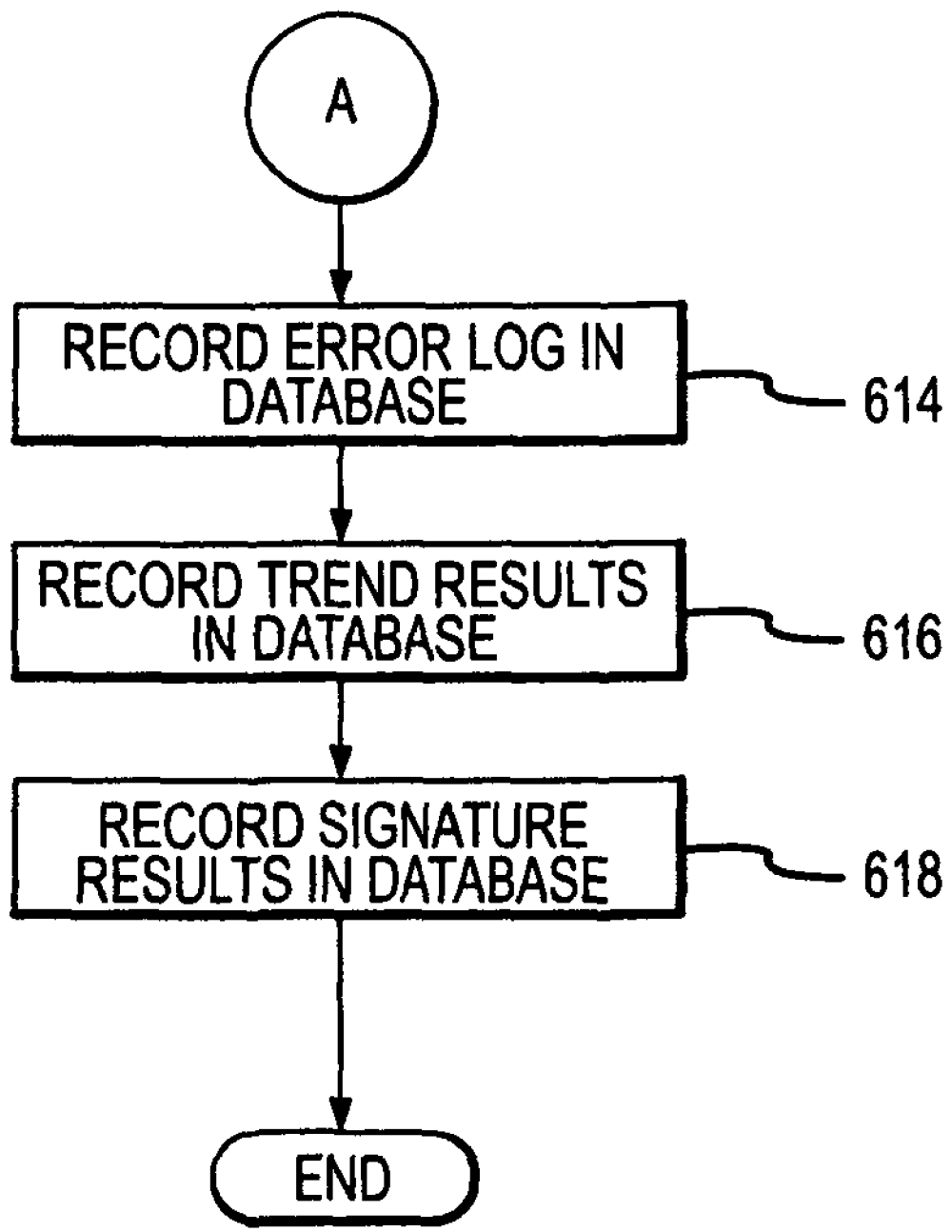

For example, referring to FIGS. 6A-B, a signature analysis process 600 may initially calculate a count (step 602) for a particular set of test data and control limits corresponding to a particular section and test. The signature analysis process then applies an appropriate signature analysis algorithm to the data points (step 604). The signature analysis is performed for each desired signature algorithm, and then to each test and each section to be analyzed. Errors identified by the signature analysis, trend results, and signature results are also stored (step 606). The process is repeated for each signature algorithm (step 608), test (step 610), and section (step 612). Upon completion, the supplementary data analysis element 206 records the errors (step 614), trend results (step 616), signature results (step 618), and any other desired data in the storage system.

Upon identification of each relevant data point, such as outliers and other data of importance identified by the supplementary analysis, each relevant data point may be associated with a value identifying the relevant characteristics (step 444). For example, each relevant components or data point may be associated with a series of values, suitably expressed as a hexadecimal figure, corresponding to the results of the supplementary analysis relating to the data point. Each value may operate as a flag or other designator of a particular characteristic. For example, if a particular data point has failed a particular test completely, a first flag in the corresponding hexadecimal value may be set. If a particular data point is the beginning of a trend in the data, another flag may be set. Another value in the hexadecimal figure may include information relating to the trend, such as the duration of the trend in the data.

The supplementary data analysis element 206 may also be configured to classify and correlate the data (step 446). For example, the supplementary data analysis element 206 may utilize the information in the hexadecimal figures associated with the data points to identify the failures, outliers, trends, and other features of the data. The supplementary data analysis element 206 also suitably applies conventional correlation techniques to the data, for example to identify potentially redundant or related tests.

The computer 108 may perform additional analysis functions upon the generated statistics and the output test data, such as automatically identifying and classifying outliers (step 432). Analyzing each relevant datum according to the selected algorithm suitably identifies the outliers. If a particular algorithm is inappropriate for a set of data, the supplementary data analysis element 206 may be configured to automatically abort the analysis and select a different algorithm.

The supplementary data analysis element 206 may operate in any suitable manner to designate outliers, such as by comparison to selected values and/or according to treatment of the data in the data smoothing process. For example, an outlier identification element 212 according to various aspects of the present invention initially automatically calibrates its sensitivity to outliers based on selected statistical relationships for each relevant datum (step 434). Some of these statistical relationships are then compared to a threshold or other reference point, such as the data mode, mean, or median, or combinations thereof, to define relative outlier threshold limits. In the present embodiment, the statistical relationships are scaled, for example by one, two, three, and six standard deviations of the data, to define the different outlier amplitudes (step 436). The output test data may then be compared to the outlier threshold limits to identify and classify the output test data as outliers (step 438).

The supplementary data analysis element 206 stores the resulting statistics and outliers in memory and identifiers, such as the x-y wafer map coordinates, associated with any such statistics and outliers (step 440). Selected statistics, outliers, and/or failures may also trigger notification events, such as sending an electronic message to an operator, triggering a light tower, stopping the tester 102, or notifying a server 116.

In the present embodiment, the supplementary data analysis element 206 includes a scaling element 210 and an outlier classification element 212. The scaling element 210 is configured to dynamically scale selected coefficients and other values according to the output test data. The outlier classification element 212 is configured to identify and/or classify the various outliers in the data according to selected algorithms.

More particularly, the scaling element 210 of the present embodiment suitably uses various statistical relationships for dynamically scaling outlier sensitivity and smoothing coefficients for noise filtering sensitivity. The scaling coefficients are suitably calculated by the scaling element and used to modify selected outlier sensitivity values and smoothing coefficients. Any appropriate criteria, such as suitable statistical relationships, may be used for scaling. For example, a sample statistical relationship for outlier sensitivity scaling is defined as:

$$(\sqrt{1+\mathrm{NaturalLog}_{Cpk}^2})$$

Another sample statistical relationship for outlier sensitivity and smoothing coefficient scaling is defined as:

$$(\sqrt{1+\mathrm{NaturalLog}_{Cpk}^2})*\mathrm{Cpm}$$

Another sample statistical relationship for outlier sensitivity and smoothing coefficient scaling is defined as:

$$\frac{(\sigma*Cpk)}{(\mathrm{Max}-\mathrm{Min})},$$

where σ=datum Standard Deviation

A sample statistical relationship used in multiple algorithms for smoothing coefficient scaling is:

$$\frac{\sigma}{\mu}*10,$$

where σ=datum Standard Deviation and μ=datum Mean

Another sample statistical relationship used in multiple algorithms for smoothing coefficient scaling is:

$$\frac{\sigma^2}{\mu^2}*10,$$

where σ=datum Standard Deviation and μ=datum Mean

The outlier classification element 212 is suitably configured to identify and/or classify the outliers in the components 106, output test data, and/or analysis results according to any suitable algorithms. In addition, the outlier classification element 212 may be configured to utilize multiple candidate outlier identification algorithms and identify one or more algorithms suited for identifying outliers in the output test data. Different tests generate different population distributions, such that an outlier identification algorithm that is appropriate for one test may be inappropriate for another. The outlier classification element 212 is suitably configured to differentiate between different data populations and automatically select one or more outlier identification algorithms based on the data population type of the current data. The automatic selection may select from any appropriate set of candidate outlier identification algorithms, and may perform the selection according to any suitable criteria and analysis.

Figure 30:
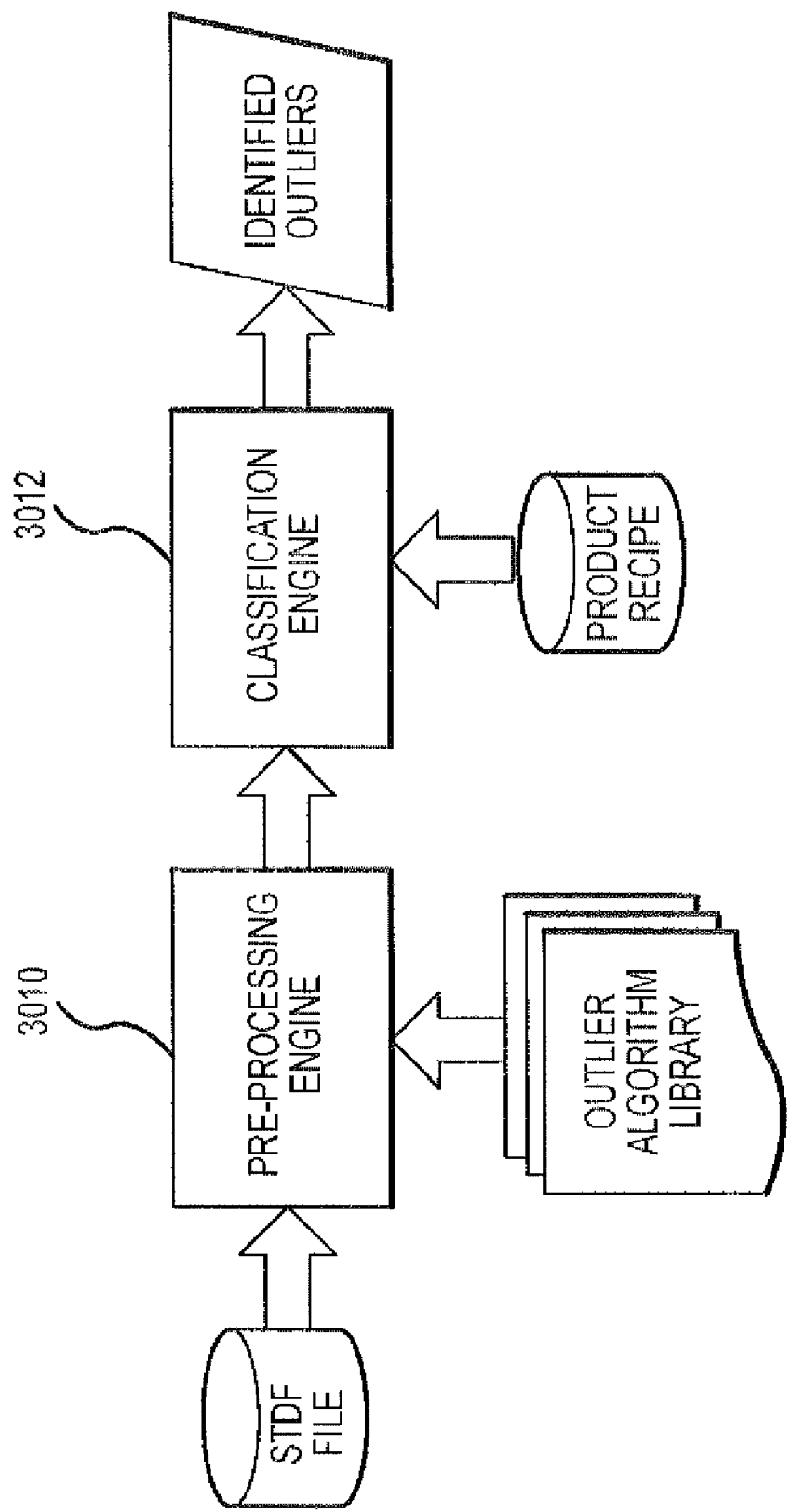
FIG. 30 is a diagram of a system for automatically selecting one or more outlier identification algorithms.

For example, referring to FIG. 30, the outlier classification element 212 may be configured to automatically perform an outlier identification algorithm selection process. The outlier classification element 212 suitably comprises a pre-processing engine 3010 and a classification engine 3012. The pre-processing engine 3010 suitably generates data to facilitate selection of the relevant outlier identification algorithms. The classification engine 3012 suitably selects one or more relevant outlier identification algorithms and identifies the outliers accordingly.

The output test data, for example data taken from a particular test, are initially provided to the outlier classification element 212 to analyze the output test data for compatibility with various candidate outlier identification algorithms. The data may be analyzed in any suitable manner to identify appropriate algorithms for identifying the outliers in the output test data. For example, in the present embodiment, the pre-processing engine 3010 receives the output test data and prepares the available outlier identification algorithms, such as by retrieving them from an outlier identification algorithm library stored in memory. The pre-processing engine 3010 analyzes the output test data for outliers using several of the available algorithms. In the present embodiment, the pre-processing engine 3010 analyzes the output test data using each of the algorithms designated by the user, or another suitable selection of algorithms, to generate pre-processing data, such as outliers as identified by all algorithms and various descriptive statistics, such as minimum, maximum, mean, median, standard deviation, CPK, CPM, and the like. The algorithms may be based on industry standard (e.g., IQR, median +/− N*sigma, etc.) and/or proprietary, custom, or user-defined outlier identification techniques. The outlier identification algorithm library is suitably configurable by the user, for example to add, remove, or edit outlier identification algorithms, for example according to the particular products under test or the characteristics of the tests to be performed. Different algorithms may be appropriate for different statistical population types, such as normal, logarithmic normal, bimodal, clamped, or low CPK data populations. The candidate outlier identification algorithms may comprise any suitable algorithms for various types and distributions of data, such as inter-quartile range (IQR) normal distribution, 3 sigma; IQR normal distribution, 6 sigma; IQR log normal, 3 sigma; IQR log normal, 6 sigma; bimodal algorithms; clamped algorithms; low capability algorithms; custom algorithms based on 3-, 6-, or n-sigma; and proprietary algorithms having various sensitivities. The pre-processing engine 3010 may also analyze the test data to generate characteristics relating to the output test data. For example, the pre-processing engine 3010 may calculate various statistical properties of the output test data.

The pre-processing algorithm results are dynamically selected for outlier detection. In the present embodiment, the outlier classification element 212 analyzes the test results to identify the most useful or applicable outlier identification algorithms. The data from the selected outlier identification algorithms may be retained, while the remaining data is discarded. For example, in the present embodiment, the classification engine 3012 receives the results of the pre-processing analysis generated by each of the available outlier identification algorithms. The classification engine 3012 analyzes the pre-processing data according to any suitable criteria, such as predetermined and/or user-defined recipe-driven rules to determine whether the pre-processing data satisfy various criteria.

The rules may be any appropriate rules, for example employing statistical ratios or values, such as comparing statistics, like minimum, maximum, mean, median, standard deviation, CPK, and CPM, to various thresholds or other criteria. For example, the classification engine 3012 may skip the outlier detection process under certain circumstances, such as having too few test results or a too narrow or a bimodal distribution among the test results. The rules may be pre-selected and/or may be adjusted or added by the user to accommodate specific conditions of the products and test environment. Further, the classification engine 3012 may be configured to apply a particular algorithm to a certain type of test, for example when the results of the test are known to have a particular distribution. Other rules may determine whether a particular test is applicable. For example, the classification engine 3012 may compare the CPK to a threshold. If the CPK is below the threshold, then the IQR normal outlier identification algorithm may be used. In the present system, results from an algorithm satisfying a rule are used for outlier identification. Other algorithm results for that test are suitably ignored.

The outlier classification element 212 may also identify and classify selected outliers and components 106 according to the test output test results and the information generated by the supplementary analysis element 206. For example, the outlier classification element 212 is suitably configured to classify the components 106 into critical/marginal/good part categories, for example in conjunction with user-defined criteria; user-defined good/bad spatial patterns recognition; classification of pertinent data for tester data compression; test setup in-situ sensitivity qualifications and analysis; tester yield leveling analysis; dynamic wafer map and/or test strip mapping for part dispositions and dynamic retest; or test program optimization analyses. The outlier classification element 212 may classify data in accordance with conventional SPC control rules, such as Western Electric rules or Nelson rules, to characterize the data.

The outlier classification element 212 suitably classifies the data using a selected set of classification limit calculation methods. Any appropriate classification methods may be used to characterize the data according to the needs of the operator. The present outlier classification element 212, for example, classifies outliers by comparing the output test data to selected thresholds, such as values corresponding to one, two, three, and six statistically scaled standard deviations from a threshold, such as the data mean, mode, and/or median. The identification of outliers in this manner tends to normalize any identified outliers for any test regardless of datum amplitude and relative noise.

The outlier classification element 212 analyzes and correlates the normalized outliers and/or the raw data points based on user-defined rules. Sample user-selectable methods for the purpose of part and pattern classification based on identified outliers are as follows:

Cumulative Amplitude, Cumulative Count Method:

$$Count_{LIMIT} = \mu_{OverallOutlierCount} + \left( \frac{3*(\sigma^2_{OverallOutlierCount})}{(Max_{OverallOutlierCount} - Min_{OverallOutlierCount})} \right)$$

$$NormalizedOutlierAmplitude_{LIMIT} =$$

$$\mu_{Overall\ Normalized\ Outlier\ Amplitude} + \left( \frac{3*(\sigma^2_{Overall\ Normalized\ Outlier\ Amplitude})}{(Max_{Overall\ Normalized\ Outlier\ Amplitude} - Min_{Overall\ Normalized\ Outlier\ Amplitude})} \right)$$

Classification Rules:

$Part_{CRITICAL}$ = True,

If $\lfloor (Part_{Cumulative\ Outlier\ Count} > Count_{LIMIT})$

AND $(Part_{Cumulative\ Normalized\ Outlier\ Amplitude} > NormalizedOutlierAmplitude_{LIMIT}) \rfloor$ $Part_{MARGINAL:HighAmplitude}$ = True, If$\lfloor (Part_{Cumulative\ Normalized\ Outlier\ Amplitude} > NormalizedOutlierAmplitude_{LIMIT}) \rfloor$ $Part_{MARGINAL:HighCount}$ = True, If $(Part_{CumulativeOutlierCount} > Count_{LIMIT})$ Cumulative Amplitude Squared, Cumulative Count Squared Method:

$$Count_{LIMIT^2} = \mu_{OverallOutlierCount^2} + \left( \frac{3*(\sigma^2_{OverallOutlierCount^2})}{(Max_{OverallOutlierCount^2} - Min_{OverallOutlierCount^2})} \right)$$

$$NormalizedOutlierAmplitude_{LIMIT^2} =$$

$$\mu_{OverallNormalizedOutlierAmplitude^2} + \left( \frac{3*(\sigma^2_{Overall\ NormalizedOutlier\ Amplitude^2})}{(Max_{OverallNormalizedOutlierAmplitude^2} - Min_{OverallNormalizedOutlierAmplitude^2})} \right)$$

Classification Rules:

$Part_{CRITICAL}$=True,If$\lfloor (Part_{OutlierCount^2}$>Count$_{LIMIT^2})$
 AND
 $(Part_{NormalizedOutlierAmplitude^2}$>NormalizedOutlierAmplitude$_{LIMIT^2}) \rfloor$ $Part_{MARGINAL:HighAmplitude}$=True,If$\lfloor$
 $(Part_{CumlativeNormalizedOutlierAmplitude^2}$>NormalizedOutlierAmplitude$_{LIMIT^2}) \rfloor$ $Part_{MARGINAL:HighCount}$=True,If
 $\lfloor (Part_{Cumlative\ Outlier\ Count^2}$>Count$_{LIMIT^2}) \rfloor$ N-points Method:

The actual numbers and logic rules used in the following examples can be customized by the end user per scenario (test program, test node, tester, prober, handler, test setup, etc.). σ in these examples=σ relative to datum mean, mode, and/or median based on datum standard deviation scaled by key statistical relationships.

$Part_{CRITICAL}$=True,If$[((Part_{COUNT:6\sigma}+Part_{COUNT:3\sigma} \leq 2) OR ((Part_{COUNT:2\sigma}+Part_{COUNT:3\sigma}) \leq 6)]$ $Part_{CRITICAL}$=True,If$[((Part_{COUNT:6\sigma}+Part_{COUNT:3\sigma} \leq 1) AND ((Part_{COUNT:2\sigma}+Part_{COUNT:1\sigma}) \leq 3)]$ $$\text{Part}_{MARGINAL} = \text{True, If}[((\text{Part}_{COUNT:6\sigma} + \text{Part}_{COUNT:3\sigma} + \text{Part}_{COUNT:2\sigma} + \text{Part}_{COUNT:1\sigma}) \leq 3)]$$

$$\text{Part}_{NOISY} = \text{True, If}[((\text{Part}_{COUNT:6\sigma} + \text{Part}_{COUNT:3\sigma} + \text{Part}_{COUNT:2\sigma} + \text{Part}_{COUNT:1\sigma}) \leq 1)]$$

The supplementary data analysis element 206 may be configured to perform additional analysis of the output test data and the information generated by the supplementary data analysis element 206. For example, the supplementary data analysis element 206 may identify tests having high incidences of failure or outliers, such as by comparing the total or average number of failures, outliers, or outliers in a particular classification to one or more threshold values.

The supplementary data analysis element 206 may also be configured to correlate data from different tests to identify similar or dissimilar trends, for example by comparing cumulative counts, outliers, and/or correlating outliers between wafers or other data sets. The supplementary data analysis element 206 may also analyze and correlate data from different tests to identify and classify potential critical and/or marginal and/or good parts on the wafer. The supplementary data analysis element 206 may also analyze and correlate data from different tests to identify user-defined good part patterns and/or bad part patterns on a series of wafers for the purposes of dynamic test time reduction.

The supplementary data analysis element 206 is also suitably configured to analyze and correlate data from different tests to identify user-defined pertinent raw data for the purposes of dynamically compressing the test data into memory. The supplementary data analysis element 206 may also analyze and correlate statistical anomalies and test data results for test node in-situ setup qualification and sensitivity analysis. Further, the supplementary data analysis element 206 may contribute to test node yield leveling analysis, for example by identifying whether a particular test node may be improperly calibrated or otherwise producing inappropriate results. The supplementary data analysis element 206 may moreover analyze and correlate the data for the purposes of test program optimization including, but not limited to, automatic identification of redundant tests using correlated results and outlier analysis and providing additional data for use in analysis. The supplementary data analysis element 206 is also suitably configured to identify critical tests, for example by identifying regularly failed or almost failed tests, tests that are almost never-fail, and/or tests exhibiting a very low Cpk.

The supplementary data analysis may also provide identification of test sampling candidates, such as tests that are rarely or never failed or in which outliers are never detected. The supplementary data analysis element 206 may also provide identification of the best order test sequence based on correlation techniques, such as conventional correlation techniques, combined with analysis and correlation of identified outliers and/or other statistical anomalies, number of failures, critical tests, longest/shortest tests, or basic functionality issues associated with failure of the test.

The supplementary data analysis may also provide identification of critical, marginal, and good parts as defined by sensitivity parameters in a recipe configuration file. Part identification may provide disposition/classification before packaging and/or shipping the part that may represent a reliability risk, and/or test time reduction through dynamic probe mapping of bad and good parts during wafer probe. Identification of these parts may be represented and output in any appropriate manner, for example as good and bad parts on a dynamically generated prober control map (for dynamic mapping), a wafer map used for offline inking equipment, a test strip map for strip testing at final test, a results file, and/or a database results table.

Supplemental data analysis at the cell controller level tends to increase quality control at the probe, and thus final test yields. In addition, quality issues may be identified at product run time, not later. Furthermore, the supplemental data analysis and signature analysis tends to improve the quality of data provided to the downstream and offline analysis tools, as well as test engineers or other personnel, by identifying outliers. For example, the computer 108 may include information on the wafer map identifying a group of components having signature analyses indicating a fault in the manufacturing process. Thus, the signature analysis system may identify potentially defective goods that may be undetected using conventional test analysis.

Figure 10:
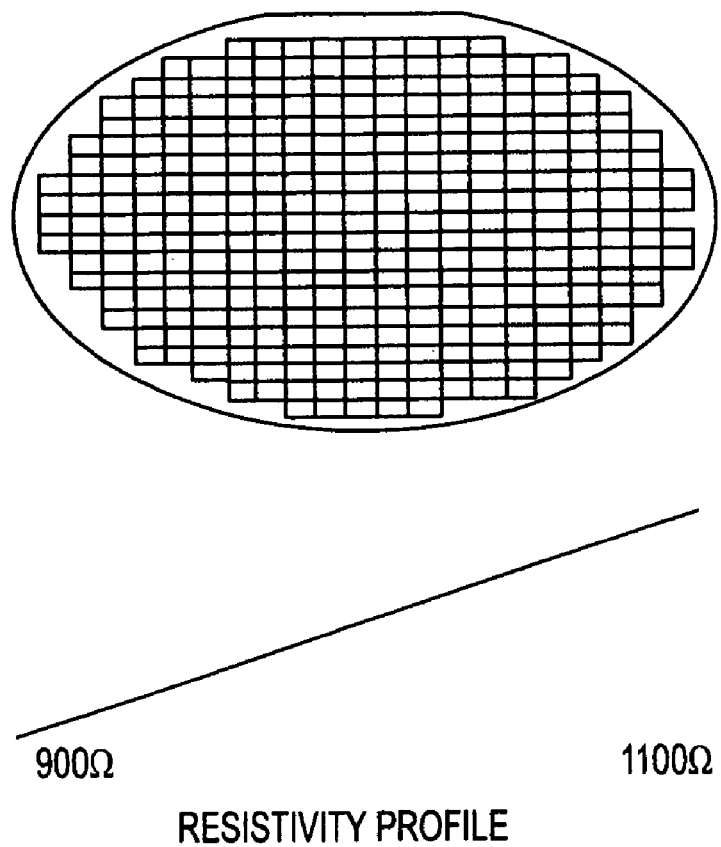
FIG. 10 is a representation of a wafer having multiple devices and a resistivity profile for the wafer.
Figure 11:
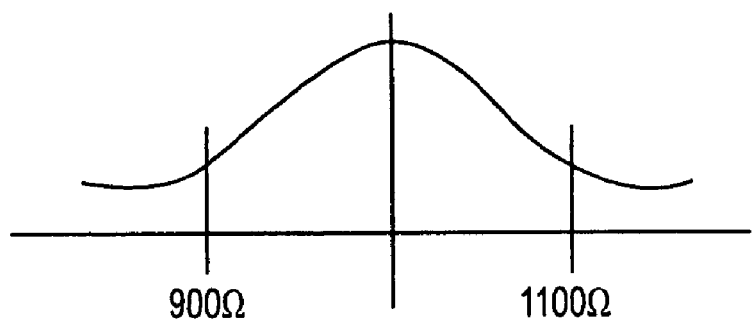
FIG. 11 is a graph of resistance values for a population of resistors in the various devices of the wafer of FIG. 10.

Referring now to FIG. 10, an array of semiconductor devices are positioned on a wafer. In this wafer, the general resistivity of resistor components in the semiconductor devices varies across the wafer, for example due to uneven deposition of material or treatment of the wafer. The resistance of any particular component, however, may be within the control limits of the test. For example, the target resistance of a particular resistor component may be $1000\Omega +/-10\%$. Near the ends of the wafer, the resistances of most of the resistors approach, but do not exceed, the normal distribution range of $900\Omega$ and $1110\Omega$ (FIG. 11).

Components on the wafer may include defects, for example due to a contaminant or imperfection in the fabrication process. The defect may increase the resistance of resistors located near the low-resistivity edge of the wafer to $1080\Omega$. The resistance is well over the $1000\Omega$ expected for a device near the middle of the wafer, but is still well within the normal distribution range.

Figure 12A:
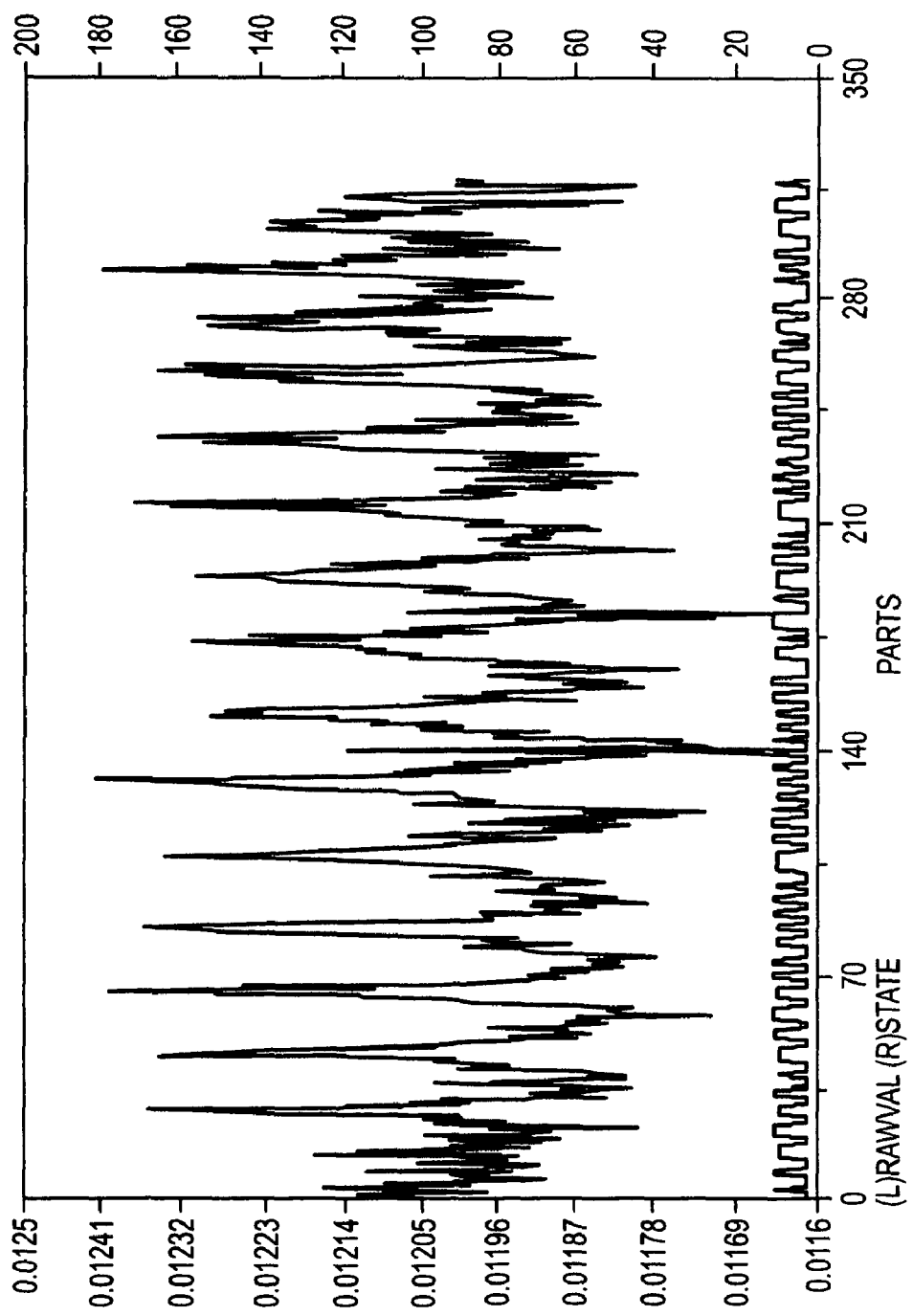
FIGS. 12A-B are general and detailed plots, respectively, of raw test data and outlier detection triggers for the various devices of FIG. 10.
Figure 12B:
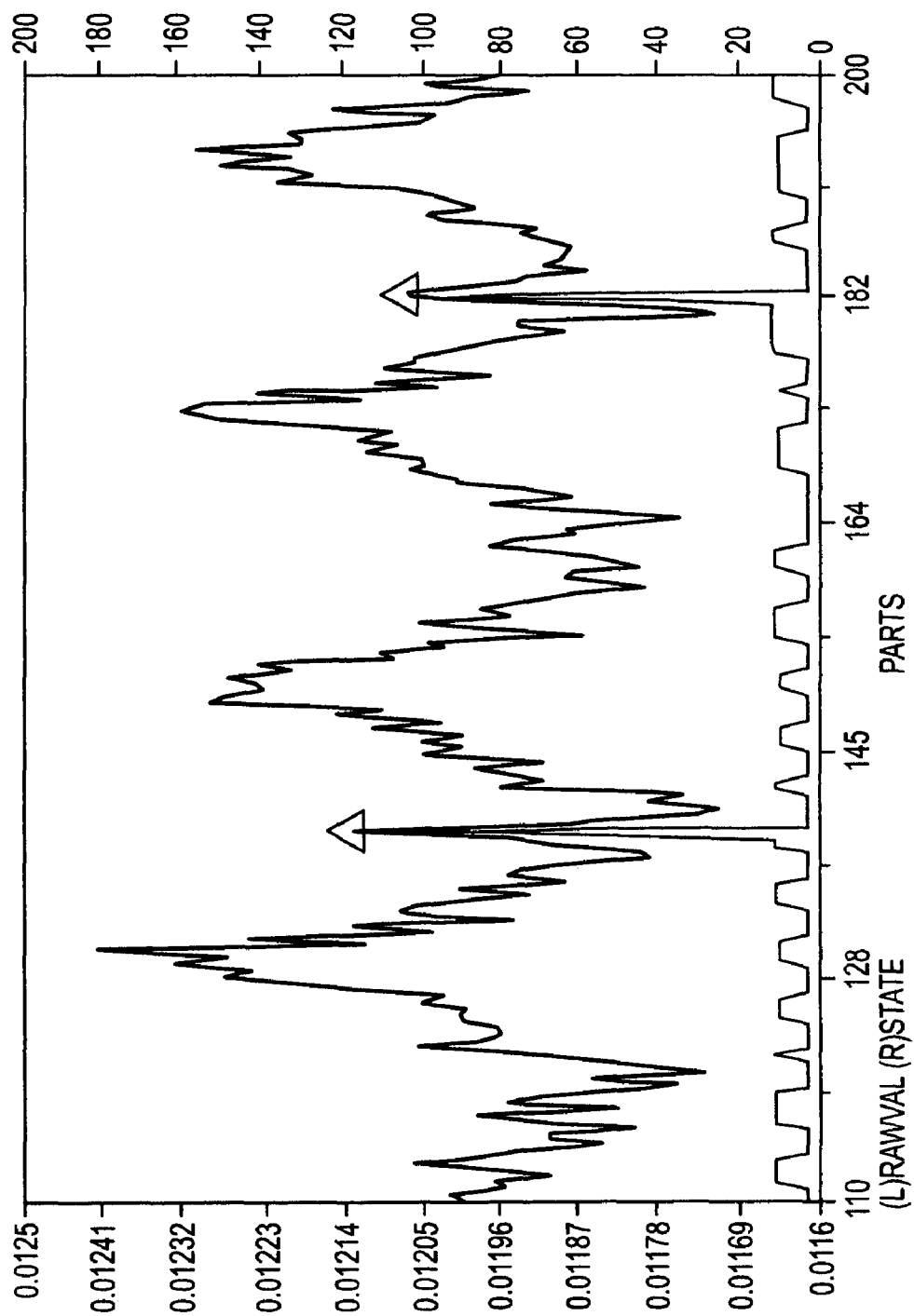

Referring to FIGS. 12A-B, the raw test data for each component may be plotted. The test data exhibits considerable variation, due in part to the varying resistivity among components on the wafer as the prober indexes across rows or columns of devices. The devices affected by the defect are not easily identifiable based on visual examination of the test data or comparison to the test limits.

When the test data is processed according to various aspects of the present invention, the devices affected by the defect may be associated with outliers in the test data. The test data is largely confined to a certain range of values. The data associated with the defects, however, is unlike the data for the surrounding components. Accordingly, the data illustrates the departure from the values associated with the surrounding devices without the defect. The outlier classification element 212 may identify and classify the outliers according to the magnitude of the departure of the outlier data from the surrounding data.

The output element 208 collects data from the test system 100, suitably at run time, and provides an output report to a printer, database, operator interface, or other desired destination. Any form, such as graphical, numerical, textual, printed, or electronic form, may be used to present the output report for use or subsequent analysis. The output element 208 may provide any selected content, including selected output test data from the tester 102 and results of the supplementary data analysis.

Figure 7:
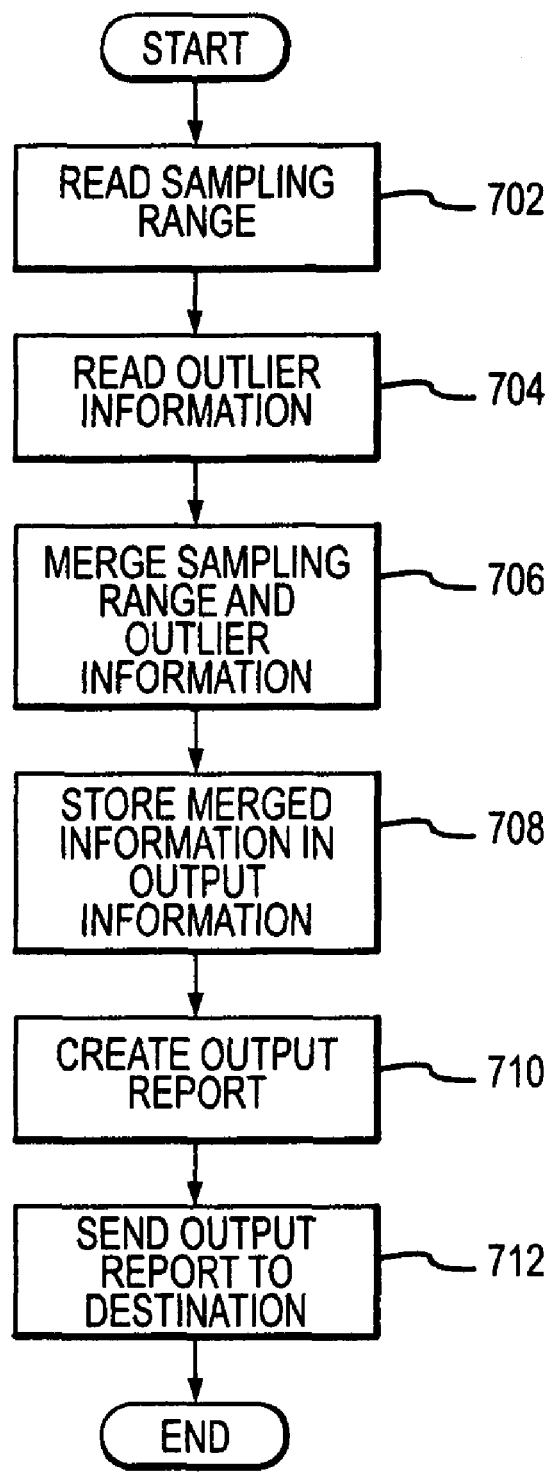
FIG. 7 illustrates a flow diagram for an output element.

In the present embodiment, the output element 208 suitably provides a selection of data from the output test data specified by the operator as well as supplemental data at product run time via the dynamic datalog. Referring to FIG. 7, the output element 208 initially reads a sampling range from the database 114 (step 702). The sampling range identifies predetermined information to be included in the output report. In the present embodiment, the sampling range identifies components 106 on the wafer selected by the operator for review. The predetermined components may be selected according to any criteria, such as data for various circumferential zones, radial zones, random components, or individual stepper fields. The sampling range comprises a set of x-y coordinates corresponding to the positions of the predetermined components on the wafer or an identified portion of the available components in a batch.

The output element 208 may also be configured to include information relating to the outliers, or other information generated or identified by the supplementary data analysis element, in the dynamic datalog (step 704). If so configured, the identifiers, such as x-y coordinates, for each of the outliers are assembled as well. The coordinates for the operator-selected components and the outliers are merged into the dynamic datalog (step 706), which in the current embodiment is in the format of the native tester data output format. Merging resulting data into the dynamic datalog facilitates compression of the original data into summary statistics and critical raw data values into a smaller native tester data file, reducing data storage requirements without compromising data integrity for subsequent customer analysis. The output element 208 retrieves selected information, such as the raw test data and one or more data from the supplementary data analysis element 206, for each entry in the merged x-y coordinate array of the dynamic datalog (step 708).

The retrieved information is then suitably stored in an appropriate output report (step 710). The report may be prepared in any appropriate format or manner. In the present embodiment, the output report suitably includes the dynamic datalog having a wafer map indicating the selected components on the wafer and their classification. Further, the output element 208 may superimpose wafer map data corresponding to outliers on the wafer map of the preselected components. Additionally, the output element 208 may include only the outliers from the wafer map or batch as the sampled output. The output report may also include a series of graphical representations of the data to highlight the occurrence of outliers and correlations in the data. The output report may further include recommendations and supporting data for the recommendations. For example, if two tests appear to generate identical sets of failures and/or outliers, the output report may include a suggestion that the tests are redundant and recommend that one of the tests be omitted from the test program. The recommendation may include a graphical representation of the data showing the identical results of the tests.

The output report may be provided in any suitable manner, for example output to a local workstation, sent to a server, activation of an alarm, or any other appropriate manner (step 712). In one embodiment, the output report may be provided off-line such that the output does not affect the operation of the system or transfer to the main server 116. In this configuration, the computer 108 copies data files, performs the analysis, and generates results, for example for demonstration or verification purposes.

In addition to the supplementary analysis of the data on each wafer, a testing system 100 according to various aspects of the present invention may also perform composite analysis of the data and generate additional data to identify patterns and trends over multiple datasets, such as using multiple wafers and/or lots. Composite analysis is suitably performed to identify selected characteristics, such as patterns or irregularities, among multiple datasets. For example, multiple datasets may be analyzed for common characteristics that may represent patterns, trends, or irregularities over two or more datasets.

The composite analysis may comprise any appropriate analysis for analyzing test data for common characteristics among the datasets, and may be implemented in any suitable manner. For example, in the present testing system 100, the composite analysis element 214 performs composite analysis of data derived from multiple wafers and/or lots. The test data for each wafer, lot, or other grouping forms a dataset. The composite analysis element 214 is suitably implemented as a software module operating on the computer 108. The composite analysis element 214 may be implemented, however, in any appropriate configuration, such as in a hardware solution or a combined hardware and software solution. Further, the composite analysis element 214 may be executed on the test system computer 108 or a remote computer, such as an independent workstation or a third party's separate computer system. The composite analysis may be performed at run time, following the generation of one or more complete datasets, or upon a collection of data generated well before the composite analysis, including historical data.

The composite analysis may use any data from two or more datasets. Composite analysis can receive several sets of input data, including raw data and filtered or smoothed data, for each dataset, such as by executing multiple configurations through the classification engine. Once received, the input data is suitably filtered using a series of user-defined rules, which can be defined as mathematical expressions, formulas, or any other criteria. The data is then analyzed to identify patterns or irregularities in the data. The composite data may also be merged into other data, such as the raw data or analyzed data, to generate an enhanced overall dataset. The composite analysis element 214 may then provide an appropriate output report that may be used to improve the test process. For example, the output report may provide information relating to issues in a manufacturing and/or testing process.

In the present system, the composite analysis element 214 analyzes sets of wafer data in conjunction with user expressions or other suitable processes and a spatial analysis to build and establish composite maps that illustrate significant patterns or trends. Composite analysis can receive several different datasets and/or composite maps for any one set of wafers by executing multiple user configurations on the set of wafers.

Figure 13:
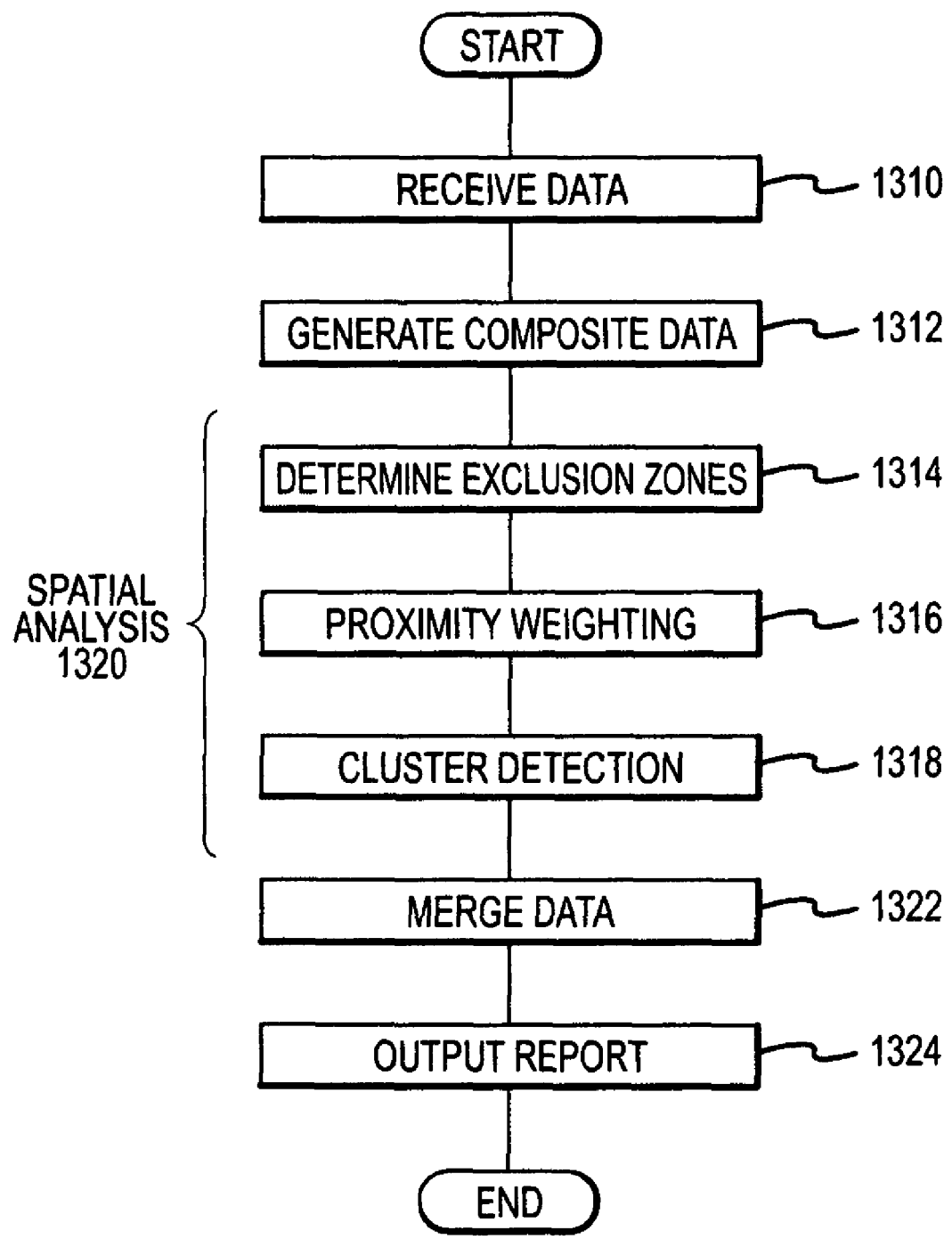
FIG. 13 is a flow diagram of a composite analysis process according to various aspects of the present invention.

Referring to FIG. 13, in the present embodiment operating in the semiconductor testing environment, the composite analysis element 214 receives data from multiple datasets, such as the data from multiple wafers or lots (1310). The data may comprise any suitable data for analysis, such as raw data, filtered data, smoothed data, historical data from prior test runs, or data received from the tester at run time. In the present embodiment, the composite analysis element 214 receives raw data and filtered data at run time. The filtered data may comprise any suitable data for analysis, such as smoothed data and/or signature analysis data. In the present embodiment, the composite analysis element 214 receives the raw dataset and supplementary data generated by the supplementary data analysis element 206, such as the smoothed data, identification of failures, identification of outliers, signature analysis data, and/or other data.

After receiving the raw data and the supplementary data, the composite analysis element 214 generates composite data for analysis (1312). The composite data comprises data representative of information from more than one dataset. For example, the composite data may comprise summary information relating to the number of failures and/or outliers for a particular test occurring for corresponding test data in different datasets, such as data for components at identical or similar positions on different wafers or in different lots. The composite data may, however, comprise any appropriate data, such as data relating to areas having concentrations of outliers or failures, wafer locations generating a significant number of outliers or failures, or other data derived from two or more datasets.

The composite data is suitably generated by comparing data from the various datasets to identify patterns and irregularities among the datasets. For example, the composite data may be generated by an analysis engine configured to provide and analyze the composite data according to any suitable algorithm or process. In the present embodiment, the composite analysis element 214 includes a proximity engine configured to generate one or more composite masks based on the datasets. The composite analysis element 214 may also process the composite mask data, for example to refine or emphasize information in the composite mask data.

In the present embodiment, the proximity engine receives multiple datasets, either through a file, memory structure, database, or other data store, performs a spatial analysis on those datasets (1320), and outputs the results in the form of a composite mask. The proximity engine may generate the composite mask data, such as a composite image for an overall dataset, according to any appropriate process or technique using any appropriate methods. In particular, the proximity engine suitably merges the composite data with original data (1322) and generates an output report for use by the user or another system (1324). The proximity engine may also be configured to refine or enhance the composite mask data for analysis, such as by spatial analysis, analyzing the data for recurring characteristics in the datasets, or removing data that does not meet selected criteria.

In the present embodiment, the proximity engine performs composite mask generation 1312, and may also be configured to determine exclusion areas 1314, perform proximity weighting 1316, and detect and filter clusters 1318. The proximity engine may also provide proximity adjustment or other operations using user-defined rules, criteria, thresholds, and precedence. The result of the analysis is a composite mask of the inputted datasets that illustrates spatial trends and/or patterns found throughout the datasets given. The proximity engine can utilize any appropriate output method or medium, including memory structures, databases, other applications, and file-based data stores such as text files or XML files in which to output the composite mask.

Figure 14:
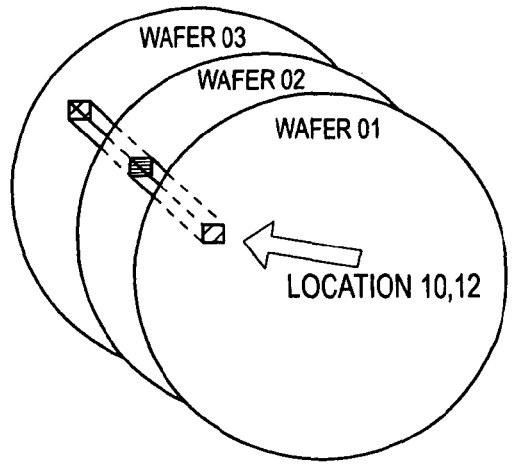
FIG. 14 is a diagram of a representative data point location on three representative wafers.

The proximity engine may use any appropriate technique to generate the composite mask data, including cumulative squared methods, N-points formulas, Western Electrical rules, or other user defined criteria or rules. In the present embodiment, composite mask data may be considered as an overall encompassing or "stacked" view of multiple datasets. The present proximity engine collects and analyzes data for corresponding data from multiple datasets to identify potential relationships or common characteristics in the data for the particular set of corresponding data. The data analyzed may be any appropriate data, including the raw data, smoothed data, signature analysis data, and/or any other suitable data In the present embodiment, the proximity engine analyzes data for corresponding locations on multiple wafers. Referring to FIG. 14, each wafer has devices in corresponding locations that may be designated using an appropriate identification system, such as an x, y coordinate system. Thus, the proximity engine compares data for devices at corresponding locations or data points, such as location 10, 12 as shown in FIG. 14, to identify patterns in the composite set of data.

The proximity engine of the present embodiment uses at least one of two different techniques for generating the composite mask data, a cumulative squared method and a formula-based method. The proximity engine suitably identifies data of interest by comparing the data to selected or calculated thresholds. In one embodiment, the proximity engine compares the data points at corresponding locations on the various wafers and/or lots to thresholds to determine whether the data indicate potential patterns across the datasets. The proximity engine compares each datum to one or more thresholds, each of which may be selected in any appropriate manner, such as a predefined value, a value calculated based on the current data, or a value calculated from historical data.

Figure 15C:
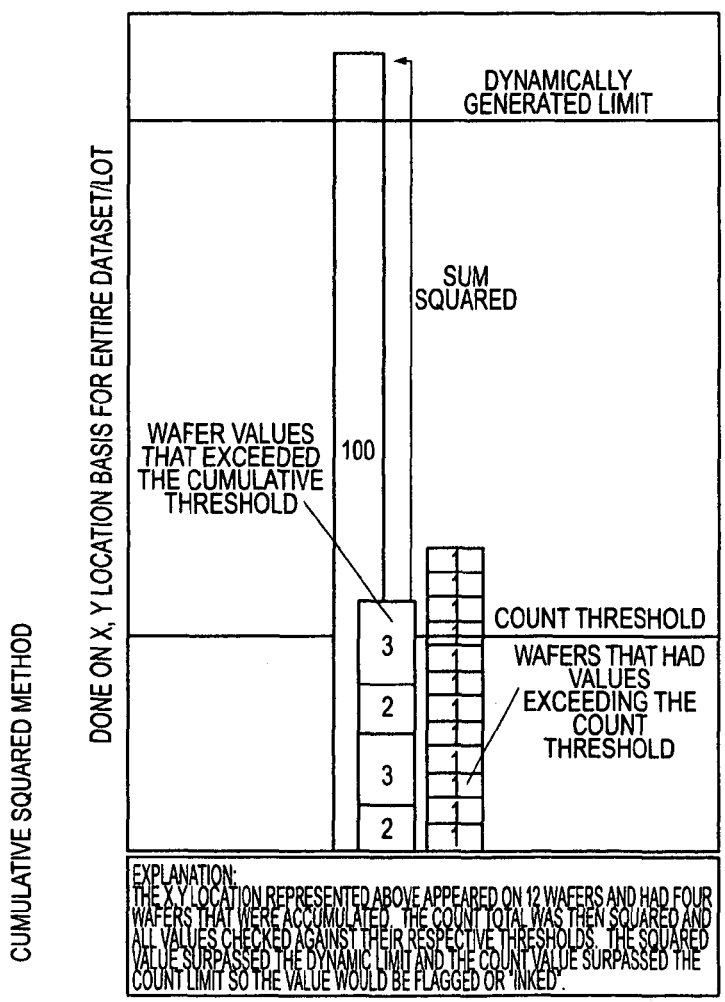
FIGS. 15A-C are a flow diagram and a chart relating to a cumulative squared composite data analysis process.
Figure 15A:
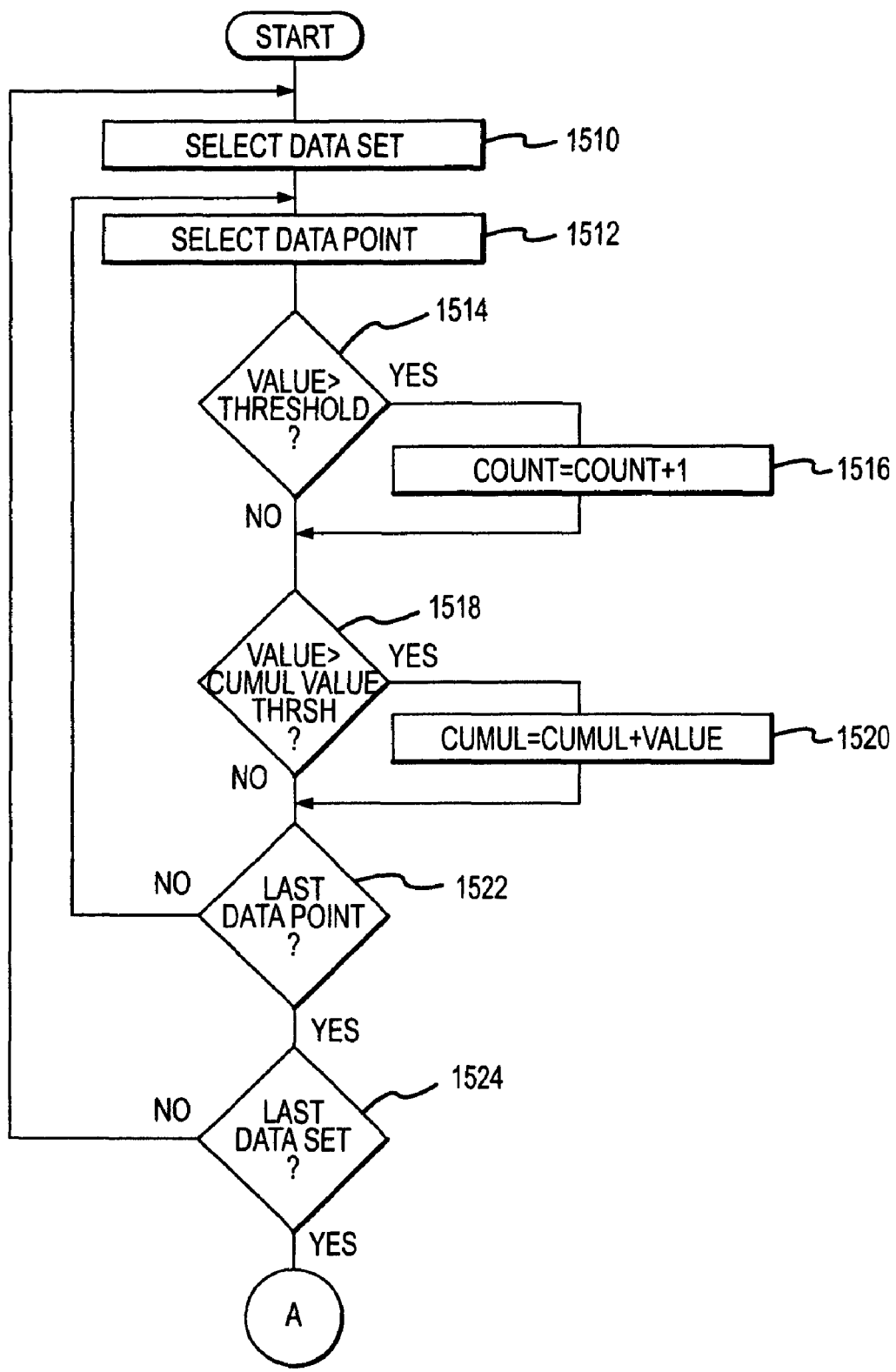
Figure 15B:
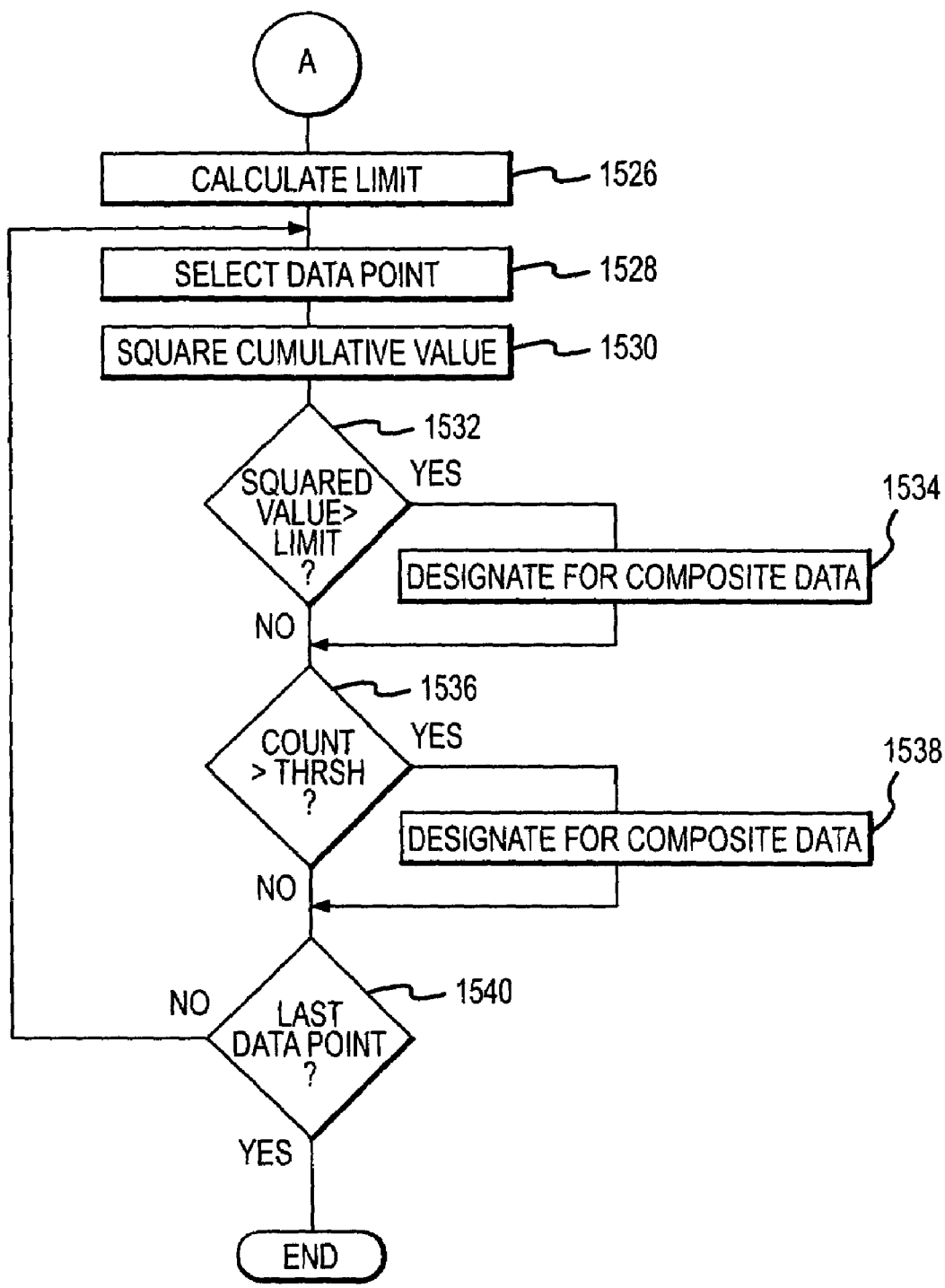

For example, a first embodiment of the present proximity engine implements a cumulative squared method to compare the data to thresholds. In particular, referring to FIGS. 15A-C, the proximity engine suitably selects a first data point (1512) in a first dataset (1510), such as a result for a particular test for a particular device on a particular wafer in a particular lot, and compares the data point value to a count threshold (1514). The threshold may comprise any suitable value, and any type of threshold, such as a range, a lower limit, an upper limit, and the like, and may be selected according to any appropriate criteria. If the data point value exceeds the threshold, i.e., is lower than the threshold, higher than the threshold, within the threshold limits, or whatever the particular qualifying relationship may be, an absolute counter is incremented (1516) to generate a summary value corresponding to the data point.

The data point value is also compared to a cumulative value threshold (1518). If the data point value exceeds the cumulative value threshold, the data point value is added to a cumulative value for the data point (1520) to generate another summary value for the data point. The proximity engine repeats the process for every corresponding data point (1522) in every relevant dataset (1524), such as every wafer in the lot or other selected group of wafers. Any other desired tests or comparisons may be performed as well for the data points and datasets.

When all of the relevant data points in the population have been processed, the proximity engine may calculate values based on the selected data, such as data exceeding particular thresholds. For example, the proximity engine may calculate overall cumulative thresholds for each set of corresponding data based on the cumulative value for the relevant data point (1526). The overall cumulative threshold may be calculated in any appropriate manner to identify desired or relevant characteristics, such as to identify sets of corresponding data points that bear a relationship to a threshold. For example, the overall cumulative threshold (Limit) may be defined according to the following equation:

$$\text{Limit} = \text{Average} + \frac{(ScaleFactor * \text{Standard } Deviation^2)}{(\text{Max} - \text{Min})}$$

where Average is the mean value of the data in the composite population of data, Scale Factor is a value or variable selected to adjust the sensitivity of the cumulative squared method, Standard Deviation is the standard deviation of data point values in the composite population of data, and (Max−Min) is the difference between the highest and lowest data point values in the complete population of data. Generally, the overall cumulative threshold is defined to establish a comparison value for identifying data points of interest in the particular data set.

Upon calculation of the overall cumulative threshold, the proximity engine determines whether to designate each data point for inclusion in the composite data, for example by comparing the count and cumulative values to thresholds. The proximity engine of the present embodiment suitably selects a first data point (1528), squares the total cumulative value for the data point (1530), and compares the squared cumulative value for the data point to the dynamically generated overall cumulative threshold (1532). If the squared cumulative value exceeds the overall cumulative threshold, then the data point is designated for inclusion in the composite data (1534).

The absolute counter value for the data point may also be compared to an overall count threshold (1536), such as a pre-selected threshold or a calculated threshold based on, for example, a percentage of the number of wafers or other datasets in the population. If the absolute counter value exceeds the overall count threshold, then the data point may again be designated for inclusion in the composite data (1538). The process is suitably performed for each data point (1540).

The proximity engine may also generate the composite mask data using additional or alternative techniques. The present proximity engine may also utilize a formula-based system for generating the composite mask data. A formula-based system according to various aspects of the present invention uses variables and formulas, or expressions, to define a composite wafer mask.

For example, in an exemplary formula-based system, one or more variables may be user-defined according to any suitable criteria. The variables are suitably defined for each data point in the relevant group. For example, the proximity engine may analyze each value in the data population for the particular data point, for example to calculate a value for the data point or count the number of times a calculation provides a particular result. The variables may be calculated for each data point in the dataset for each defined variable.

After calculating the variables, the data points may be analyzed, such as to determine whether the data point meets the user-defined criteria. For example, a user-defined formula may be resolved using the calculated variable values, and if the formula equates to a particular value or range of values, the data point may be designated for inclusion in the composite mask data.

Thus, the proximity engine may generate a set of composite mask data according to any suitable process or technique. The resulting composite mask data comprises a set of data that corresponds to the results of the data population for each data point. Consequently, characteristics for the data point may be identified over multiple datasets. For example, in the present embodiment, the composite mask data may illustrate particular device locations that share characteristics on multiple wafers, such as widely variable test results or high failure rates. Such information may indicate issues or characteristics in the manufacturing or design process, and thus may be used to improve and control manufacturing and testing.

The composite mask data may also be analyzed to generate additional information. For example, the composite mask data may be analyzed to illustrate spatial trends and/or patterns in the datasets and/or identify or filter significant patterns, such as filtering to reduce clutter from relatively isolated data points, enhancing or refining areas having particular characteristics, or filtering data having known characteristics. The composite mask data of the present embodiment, for example, may be subjected to spatial analyses to smooth the composite mask data and complete patterns in the composite mask data. Selected exclusion zones may receive particular treatment, such that composite mask data may be removed, ignored, enhanced, accorded lower significance, or otherwise distinguished from other composite mask data. A cluster detection process may also remove or downgrade the importance of data point clusters that are relatively insignificant or unreliable.

Figure 16:
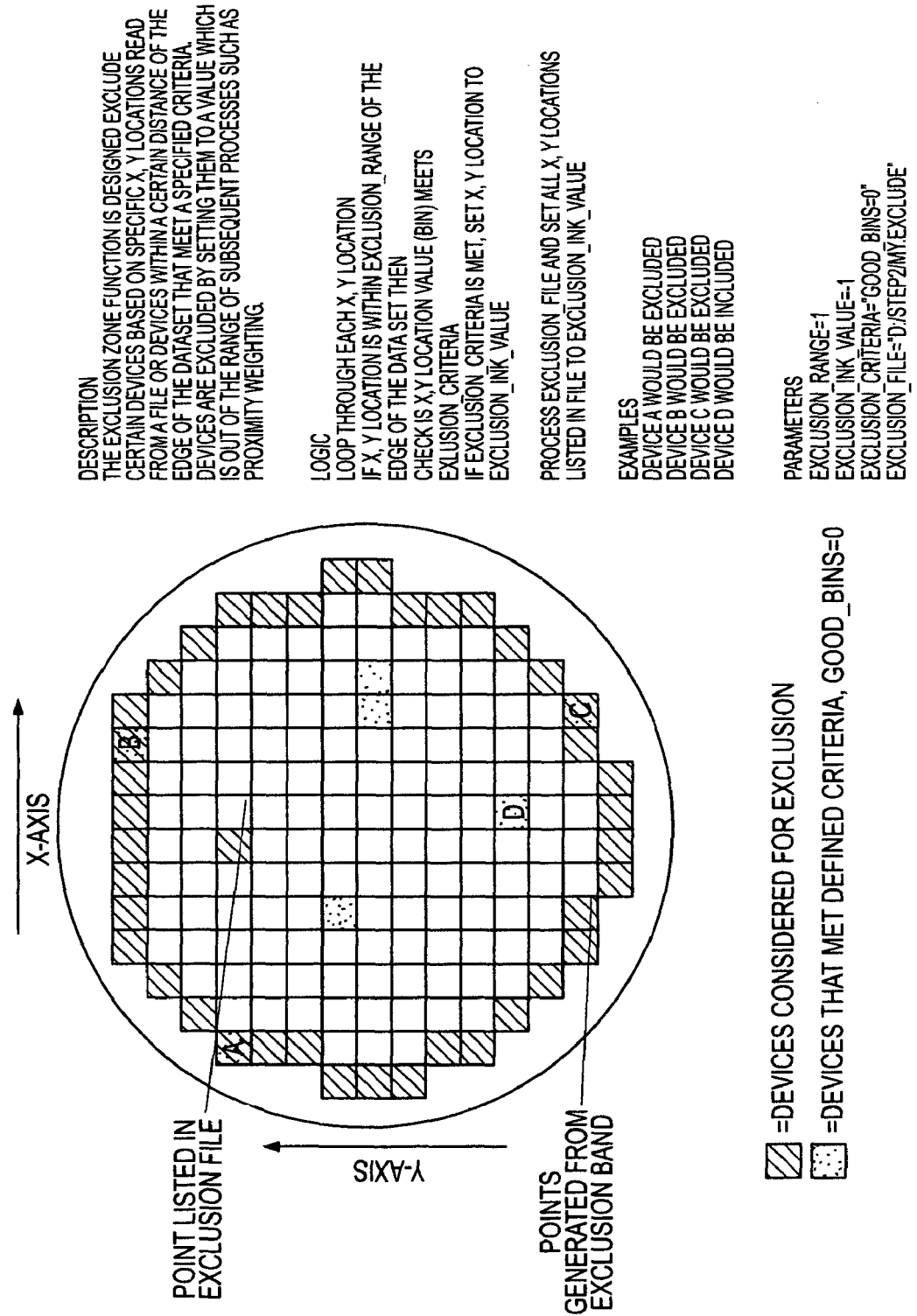
FIG. 16 is a diagram of an exclusion zone defined on a wafer.

In the present embodiment, the proximity engine may be configured to identify particular designated zones in the composite mask data such that data points from the designated zones are accorded particular designated treatment or ignored in various analyses. For example, referring to FIG. 16, the proximity engine may establish an exclusion zone at a selected location on the wafers, such as individual devices, groups of devices, or a band of devices around the perimeter of the wafer. The exclusion zone may provide a mechanism to exclude certain data points from affecting other data points in proximity analysis and/or weighting. The data points are designated as excluded in any suitable manner, such as by assigning values that are out of the range of subsequent processes.

The relevant zone may be identified in any suitable manner. For example, excluded data points may be designated using a file listing of device identifications or coordinates, such as x,y coordinates, selecting a particular width of band around the perimeter, or through other suitable processes for defining a relevant zone in the composite data. In the present embodiment, the proximity engine may define a band of excluded devices on a wafer using a simple calculation that causes the proximity engine to ignore or otherwise specially treat data points within a user defined range of the edge of the data set. For example, all devices within this range, or listed in the file, are then subject to selected exclusion criteria. If the exclusion criteria are met, the data points in the exclusion zone or the devices meeting the exclusion criteria are excluded from one or more analyses.

The proximity engine of the present embodiment is suitably configured to perform additional analyses upon the composite mask data. The additional analyses may be configured for any appropriate purpose, such as to enhance desired data, remove unwanted data, or identify selected characteristics in the composite mask data. For example, the proximity engine is suitably configured to perform a proximity weighting process, such as based on a point weighting system, to smooth and complete patterns in the composite mask data.

Figure 17A:
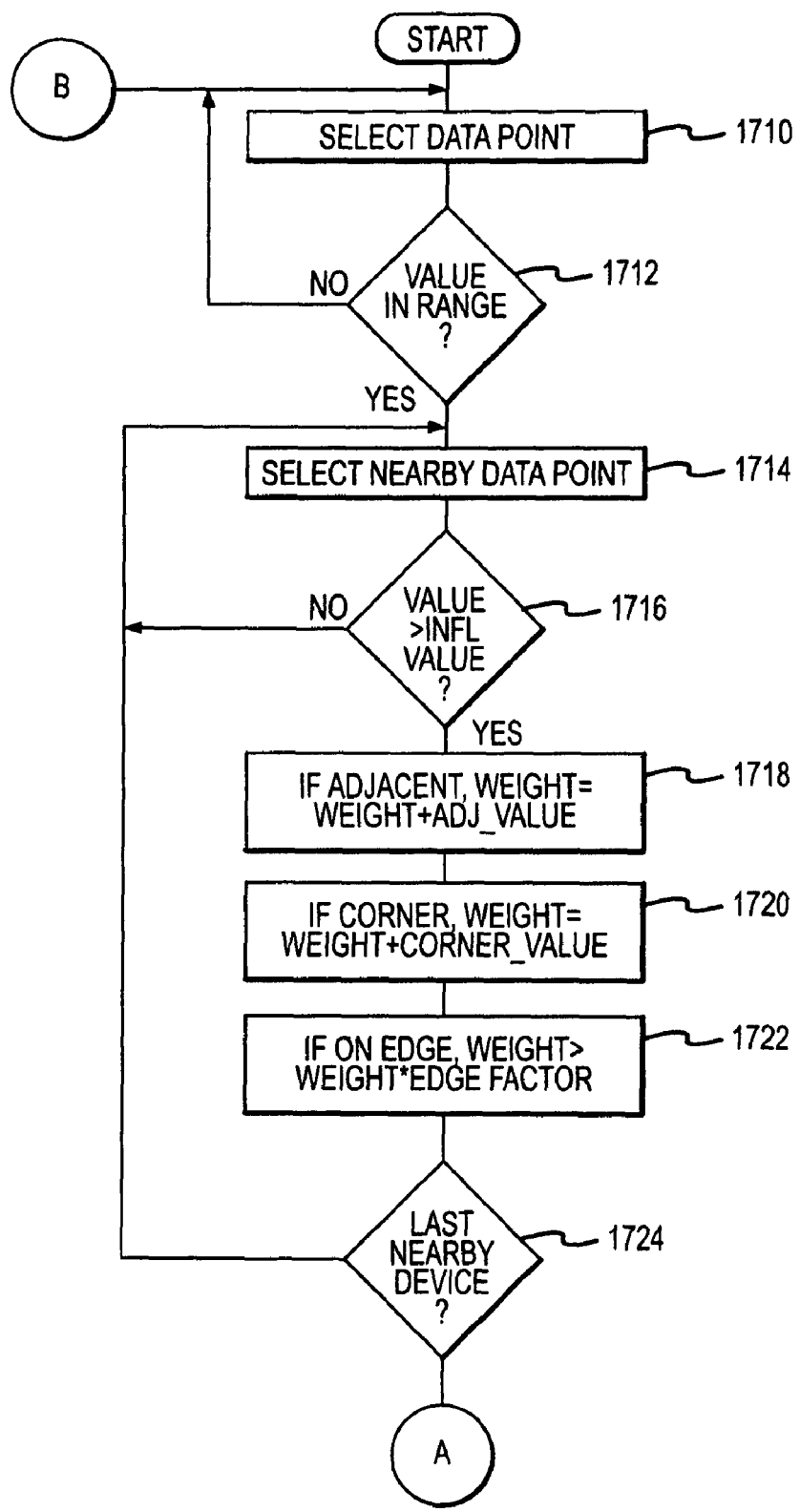
FIGS. 17A-B are a flow diagram of a proximity weighting process.
Figure 17B:
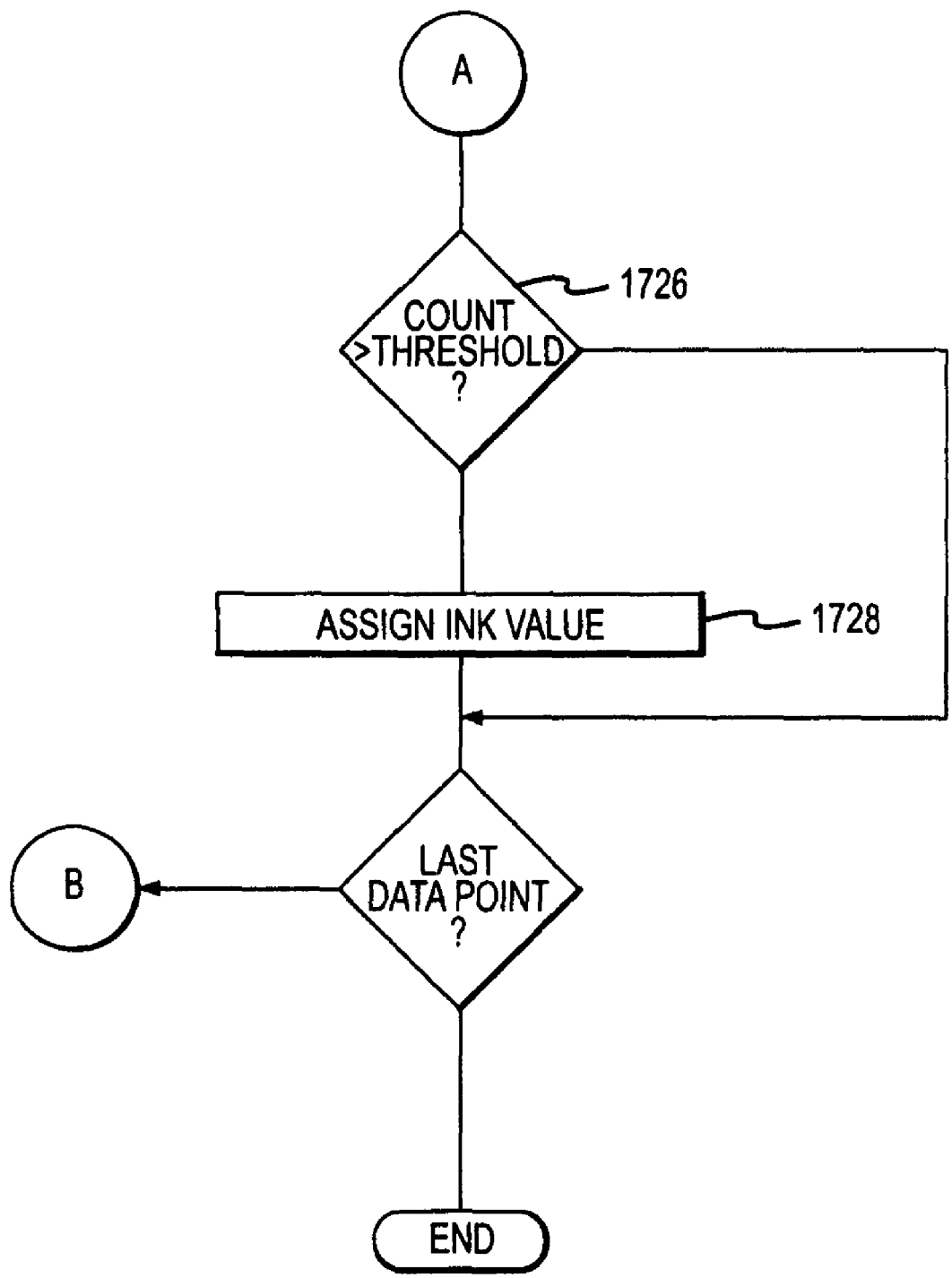
Figure 18:
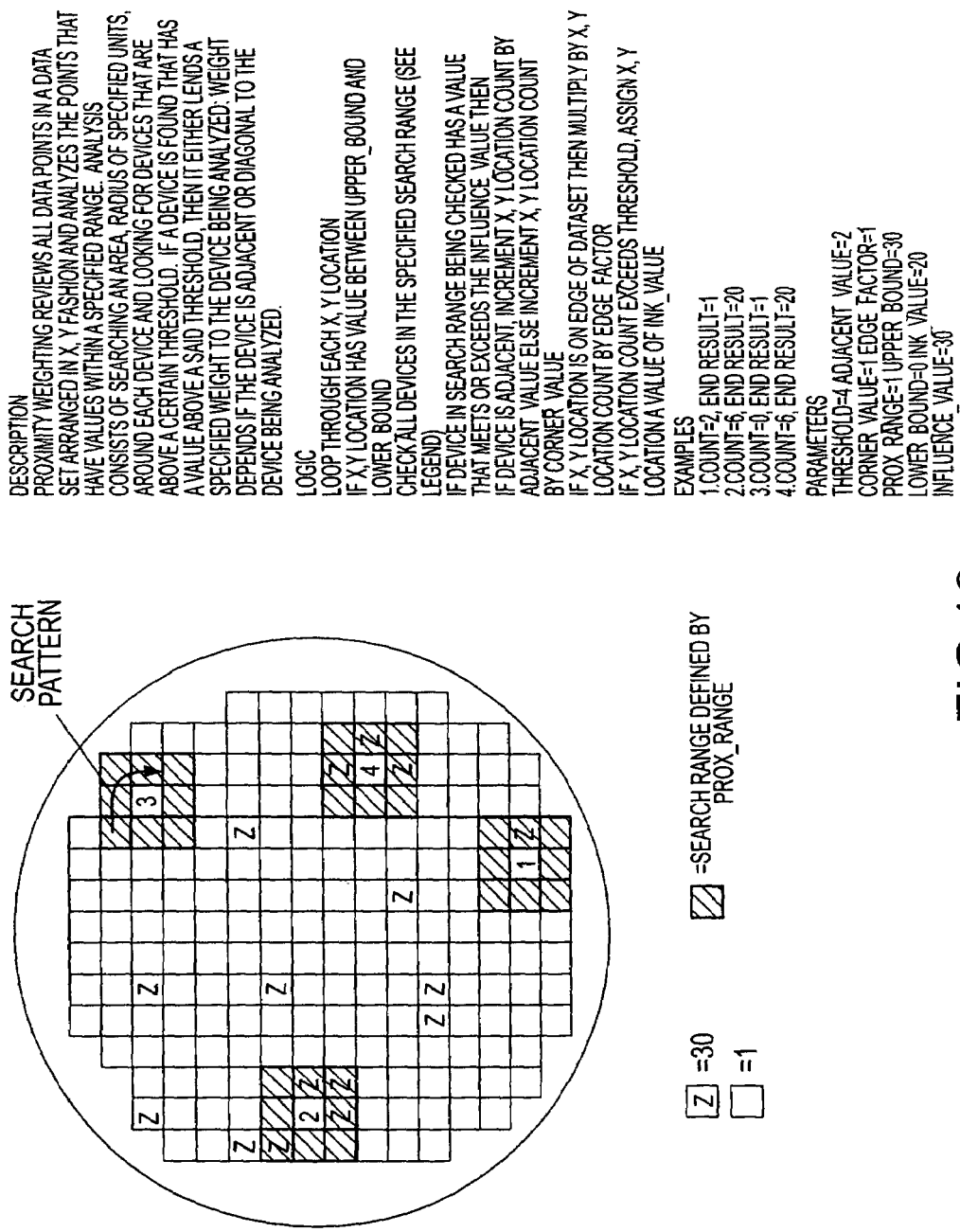
FIG. 18 is a diagram of a set of data points subjects to proximity weighting.

Referring to FIGS. 17A-B and 18, the present proximity engine searches through all data points in the dataset. The proximity engine selects a first point (1710) and checks the value of the data point against a criterion, such as a threshold or a range of values (1712). When a data point is found that exceeds the selected threshold or is within the selected range, the proximity engine searches data points surrounding the main data point for values (1714). The number of data points around the main data point may be any selected number and may be selected according to any suitable criteria.

The proximity engine searches the surrounding data points for data points exceeding an influence value or satisfying another suitable criterion indicating that the data point should be accorded weight (1716). If the data point exceeds the influence value, the proximity engine suitably assigns a weight to the main data point according to the values of the surrounding data points. In addition, the proximity engine may adjust the weight according to the relative position of the surrounding datapoint. For example, the amount of weight accorded to a surrounding data point can be determined according to whether the surrounding data point is adjacent (1718) or diagonal (1720) to the main data point. The total weight may also be adjusted if the data point is on the edge of the wafer (1722). When all surrounding data points around the main data point have been checked (1724), the main data point is assigned an overall weight, for example by adding the weight factors from the surrounding data points. The weight for the main data point may then be compared to a threshold, such as a user defined threshold (1726). If the weight meets or exceeds the threshold, the data point is so designated (1728).

The composite mask data may also be further analyzed to filter data. For example, in the present embodiment, the proximity engine may be configured to identify, and suitably remove, groups of data points that are smaller than a threshold, such as a user-specified threshold.

Figure 19:
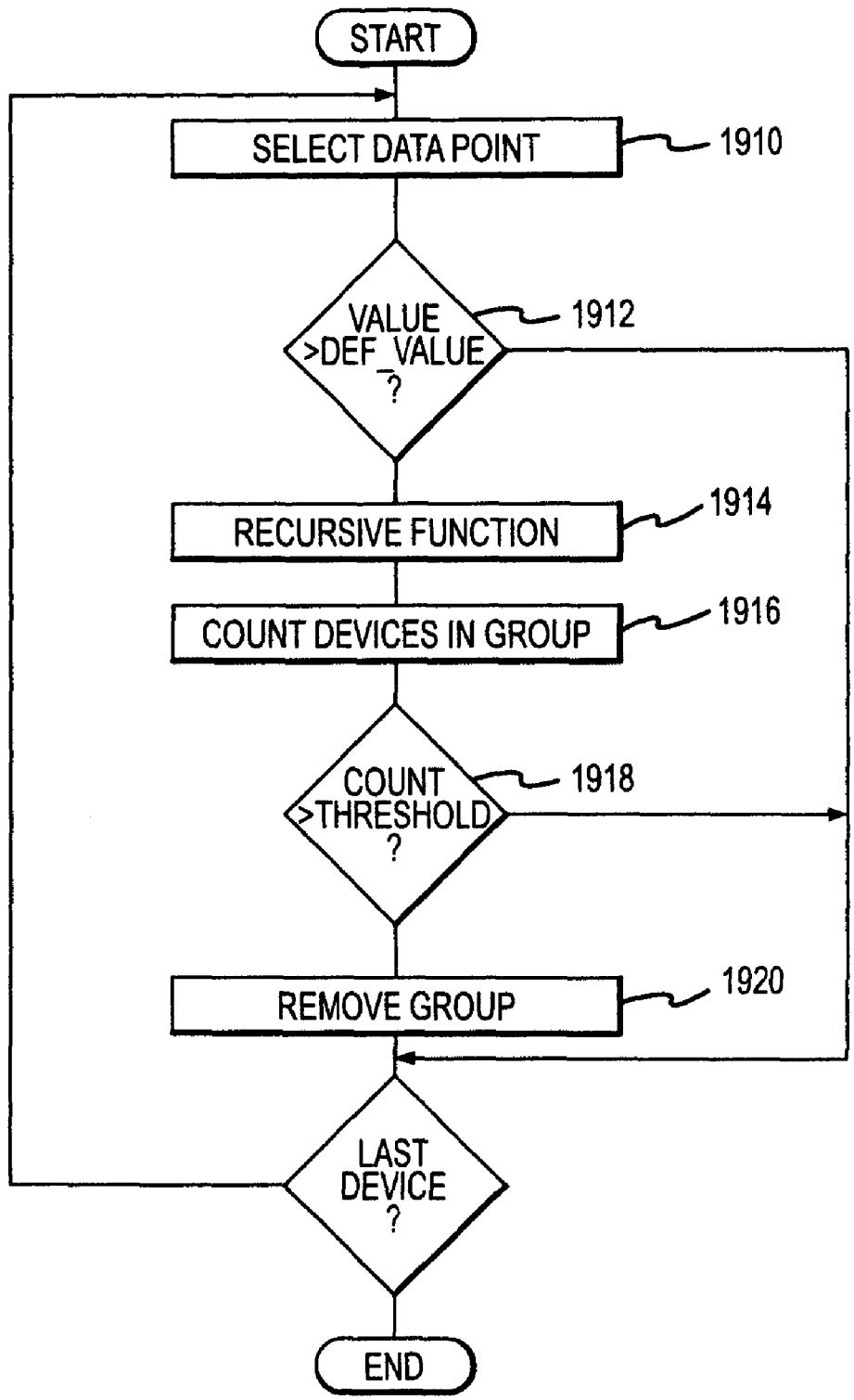
FIG. 19 is a flow diagram of a cluster detection and filtration process.
Figure 20:
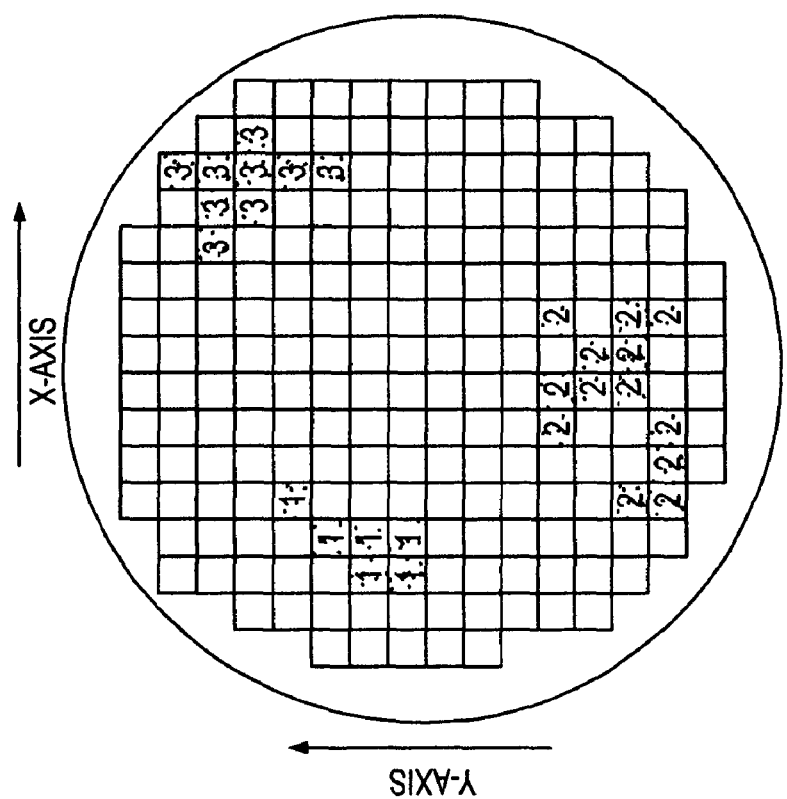
FIG. 20 is a diagram of a set of clusters on a wafer subject to detection and filtration.

Referring to FIGS. 19 and 20, the proximity engine of the present embodiment may be configured to define the groups, size them, and remove smaller groups. To define the groups, the proximity engine searches through every data point in the composite mask data for a data point satisfying a criterion. For example, the data points in the composite mask data may be separated into ranges of values and assigned index numbers. The proximity engine begins by searching the composite mask data for a data point matching a certain index (1910). Upon encountering a data point meeting designated index (1912), the proximity engine designates the found point as the main data point and initiates a recursive program that searches in all directions from the main data point for other data points that are in the same index, or alternatively, have substantially the same value, also exceed the threshold, or meet other desired criteria (1914).

As an example of a recursive function in the present embodiment, the proximity engine may begin searching for data points having a certain value, for instance five. If a data point with a value of five is found, the recursive program searches all data points around the main device until it finds another data point with the value of five. If another qualifying data point is found, the recursive program selects the encountered data point as the main data point and repeats the process. Thus, the recursive process analyzes and marks all data points having matching values that are adjacent or diagonal to each other and thus form a group. When the recursive program has found all devices in a group having a certain value, the group is assigned a unique group index and the proximity engine again searches through the entire composite mask data. When all of the data values have been searched, the composite mask data is fully separated into groups of contiguous data points having the same group index.

The proximity engine may determine the size of each group. For example, the proximity engine may count the number of data points in the group (1916). The proximity engine may then compare the number of data points in each group to a threshold and remove groups that do not meet the threshold (1918). The groups may be removed from the grouping analysis in any suitable manner (1920), such as by resetting the index value for the relevant group to a default value. For example, if the threshold number of data points is five, the proximity engine changes the group index number for every group having fewer than five data points to a default value. Consequently, the only groups that remain classified with different group indices are those having five or more data points.

The proximity engine may perform any appropriate additional operations to generate and refine the composite mask data. For example, the composite mask data, including the results of the additional filtering, processing, and analyzing of the original composite mask data, may be used to provide information relating to the multiple datasets and the original source of the data, such as the devices on the wafers or the fabrication process. The data may be provided to the user or otherwise used in any suitable manner. For example, the data may be provided to another system for further analysis or combination with other data, such as executing user-defined rules combined with a merging operation on the composite mask data, the raw data, and any other appropriate data to produce a data set that represents trends and patterns in the raw data. Further, the data may be provided to a user via an appropriate output system, such as a printer or visual interface.

In the present embodiment, for example, the composite mask data is combined with other data and provided to the user for review. The composite mask data may be combined with any other appropriate data in any suitable manner. For example, the composite mask data may be merged with signature data, the raw data, hardware bin data, software bin data, and/or other composite data. The merging of the datasets may be performed in any suitable manner, such as using various user-defined rules including expressions, thresholds, and precedence.

Figure 21:
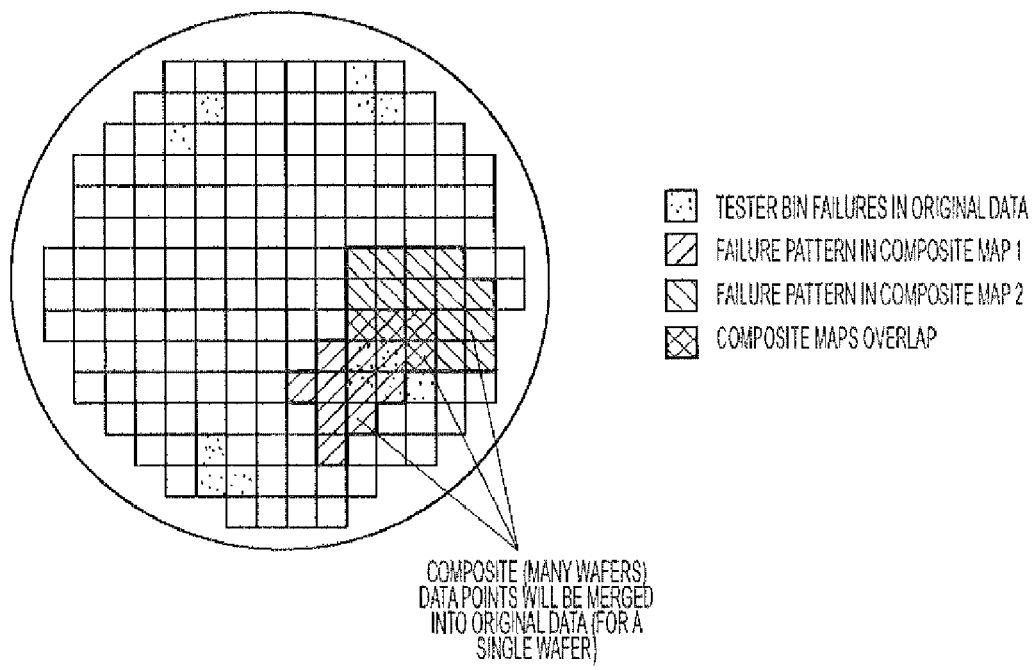
FIG. 21 is a diagram of a set of data points merged using an absolute merge process.

In the present system, the composite analysis element 214 performs the merging process using an appropriate process to merge the composite mask data with an original map of composite data, such as a map of composite raw data, composite signature data, or composite bin data. For example, referring to FIG. 21, the composite analysis element 214 may merge the composite mask data with the original individual wafer data using an absolute merge system in which the composite mask data is fully merged with the original data map. Consequently, the composite mask data is merged with the original data map regardless of overlap or encompassment of existing patterns. If only one composite mask illustrates a pattern out of multiple composite masks, the pattern is included in the overall composite mask.

Figure 22:
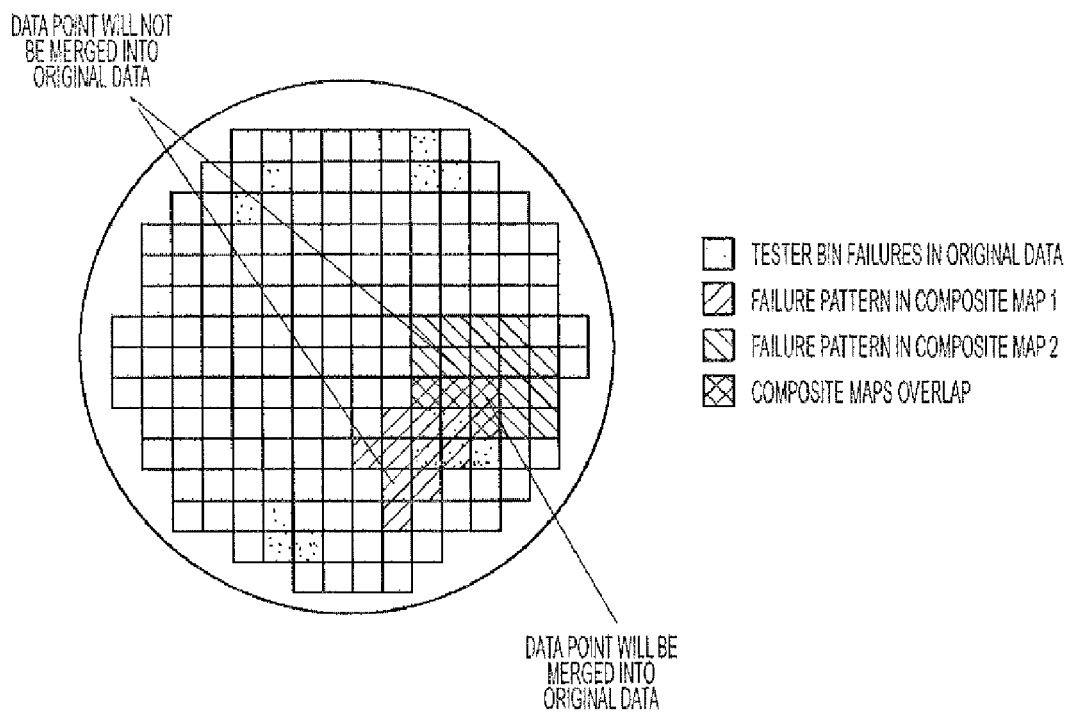
FIG. 22 is a diagram of a set of data points merged using an overlap merge process.

Alternatively, the composite analysis element 214 may merge the data in conjunction with additional analysis. The composite analysis element 214 may filter data that may be irrelevant or insignificant. For example, referring to FIG. 22, the composite analysis element 214 may merge only data in the composite mask data that overlaps data in the original data map or in another composite mask, which tends to emphasize potentially related information.

Figure 23:
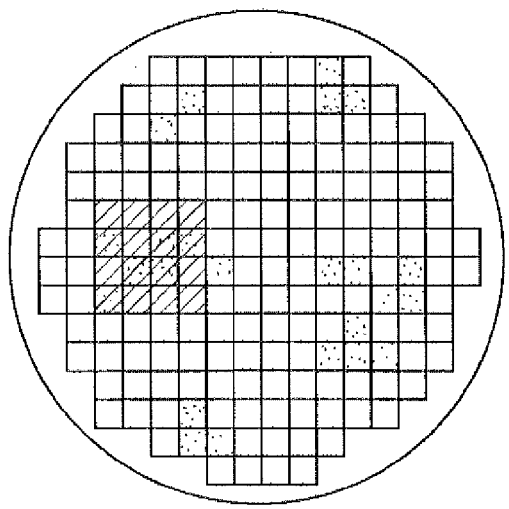
FIGS. 23 and 24 are diagrams of sets of data points merged using percentage overlap merge processes.
Figure 24:
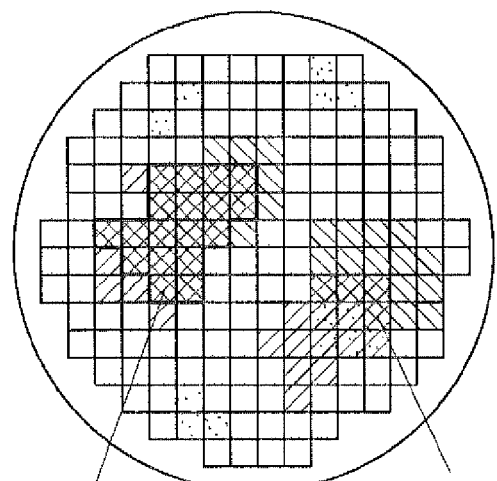

The composite analysis element 214 may alternatively evaluate the composite mask data and the original data to determine whether a particular threshold number, percentage, or other value of data points overlap between maps. Depending on the configuration, the data merged may only include areas where data points, in this case corresponding to devices, overlapped sufficiently between the composite mask data and the original data to meet the required threshold value for overlapping data points. Referring to FIG. 23, the composite analysis element 214 may be configured to include only composite data patterns that overlap to a sufficient degree with tester bin failures, i.e., failed devices, in the original data, such as 50% of the composite data overlapping with tester bin failure data. Thus, if less than the minimum amount of composite data overlaps with the original data, the composite data pattern may be ignored. Similarly, referring to FIG. 24, the composite analysis element 214 may compare two different sets of composite data such as data from two different recipes, and determine whether the overlap between the two recipes satisfies selected criteria. Only the data that overlaps and/or satisfies the minimum criteria is merged.

The merged data may be provided to the output element 208 for output to the user or other system. The merged data may be passed as input to another process, such as a production error identification process or a large trend identification process. The merged data may also be outputted in any assortment or format, such as memory structures, database tables, flat text files, or XML files.

In the present embodiment, the merged data and/or wafer maps are provided into an ink map generation engine. The ink map engine produces maps for offline inking equipment. In addition to offline inking maps, the merged data results may be utilized in generating binning results for inkless assembly of parts, or any other process or application that utilizes these types of results.

The test system 100 may also be configured to use test data to identify characteristics and/or problems associated with the fabrication process, including the manufacturing and/or testing process. For example, the test system 100 may analyze test data from one or more sources and automatically match characteristics of the test data to known problems, issues, or characteristics in the manufacturing and test process. If the test data characteristics do not correspond to a known issue, then the test system may receive and store information relating to the issue after it is diagnosed, such that the test system 100 is updated to diagnose new test data characteristics as they are encountered.

In particular, the diagnostic system 216 is suitably configured to automatically identify and classify test data characteristics. The test system 100 may also automatically provide a notification, such as an immediate alert and/or later output report. The classification criteria and procedures are configurable, such that when different test data characteristics are associated with different problems, the information is suitably provided to the diagnostic system 216 for use in subsequent analyses. Automatic classification and updating the test characteristics facilitates consistent analysis of the test data and retains information within the diagnostic system 216 for continuously improving test data analysis.

For example, the test data diagnostic system 216 may be configured to diagnose problems based, at least in part, on the test data. The data may be received at run time, retrieved from a storage system after completion of one or more test runs, and/or include historic data. The diagnostic system 216 may receive test data from any suitable source, such as parametric test, metrologic, process control, microscopy, spectroscopy, and defect analysis and fault isolation data. The diagnostic system 216 may also receive processed data, such as smoothed data and filtered composite data, and additional data that is generated based on the test data, such as bin results, SPC data, spatial analysis data, outlier data, composite data, and data signatures.

Figure 25:
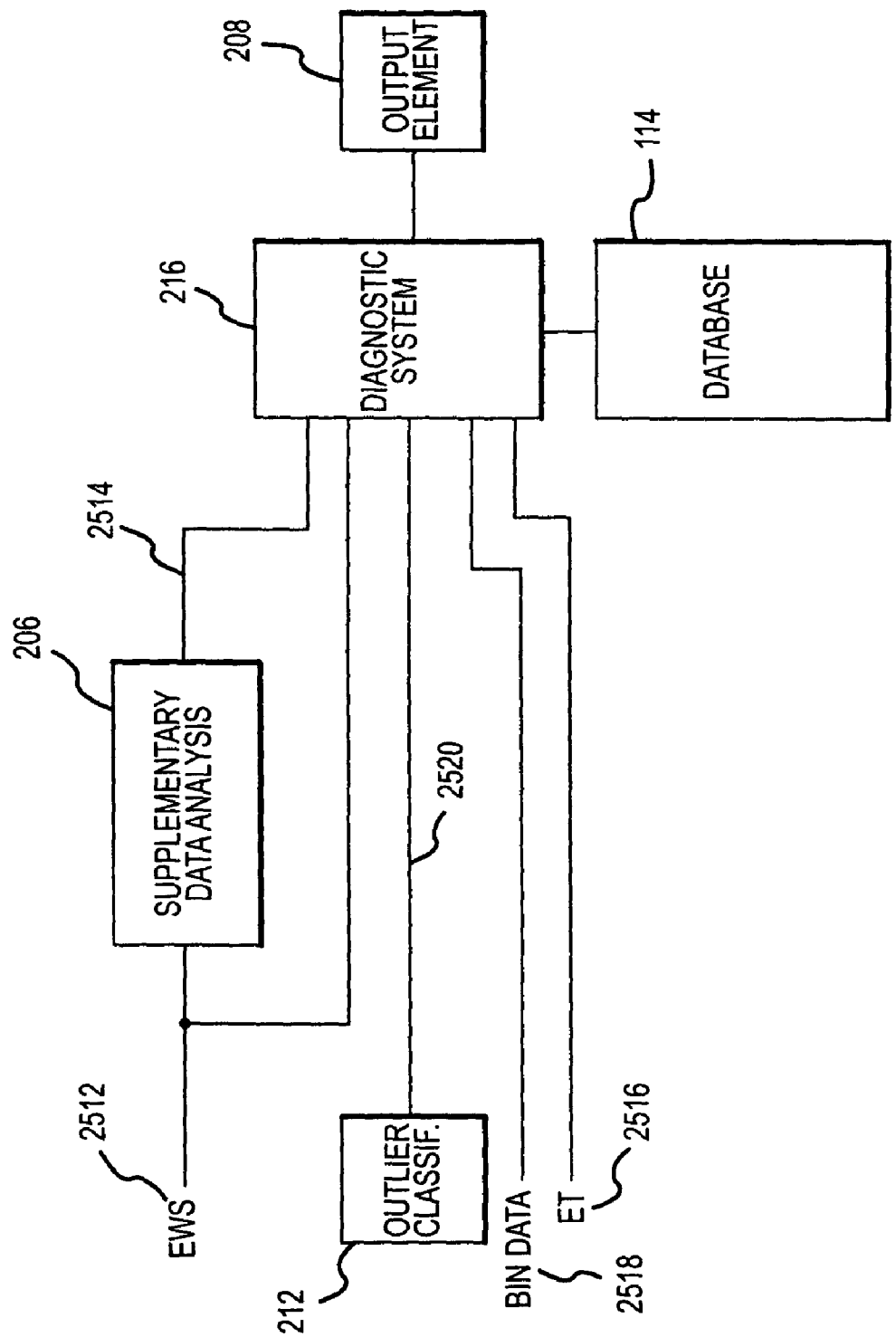
FIG. 25 is a block diagram of a system for identifying a characteristic of a process using test data.

For example, referring to FIG. 25, the diagnostic system 216 of the present embodiment is configured to analyze two or more types of data. The diagnostic system 216 analyzes the raw electronic wafer sort (EWS) data 2512, as well as the EWS bin signature data 2514 for each wafer. The EWS bin signature data 2514 may comprise any suitable classification data based on the EWS results, for example as may be generated by the supplementary data analysis element 206. In the present embodiment, the EWS bin signature data 2514 comprises data corresponding to each device on a wafer indicating the magnitude of the device's failure, such as classifications of gross, significant, or marginal, as determined by the supplementary data analysis element 206.

The diagnostic system 216 also receives process control or electrical test (ET) data 2516, such as data relating to the electrical characteristics for various points on the wafer and/or for the components 106. Further, the diagnostic system 216 may receive the bin map data 2518 for the wafer indicating the pass/fail binning classifications for the components 106. In addition, the diagnostic system 216 may receive the outlier signature bin map 2520 for the wafer, for example data generated by the outlier classification element 212. For example, each outlier in the data may be classified as tiny, small, medium, or critical according to selected criteria.

Figure 26:
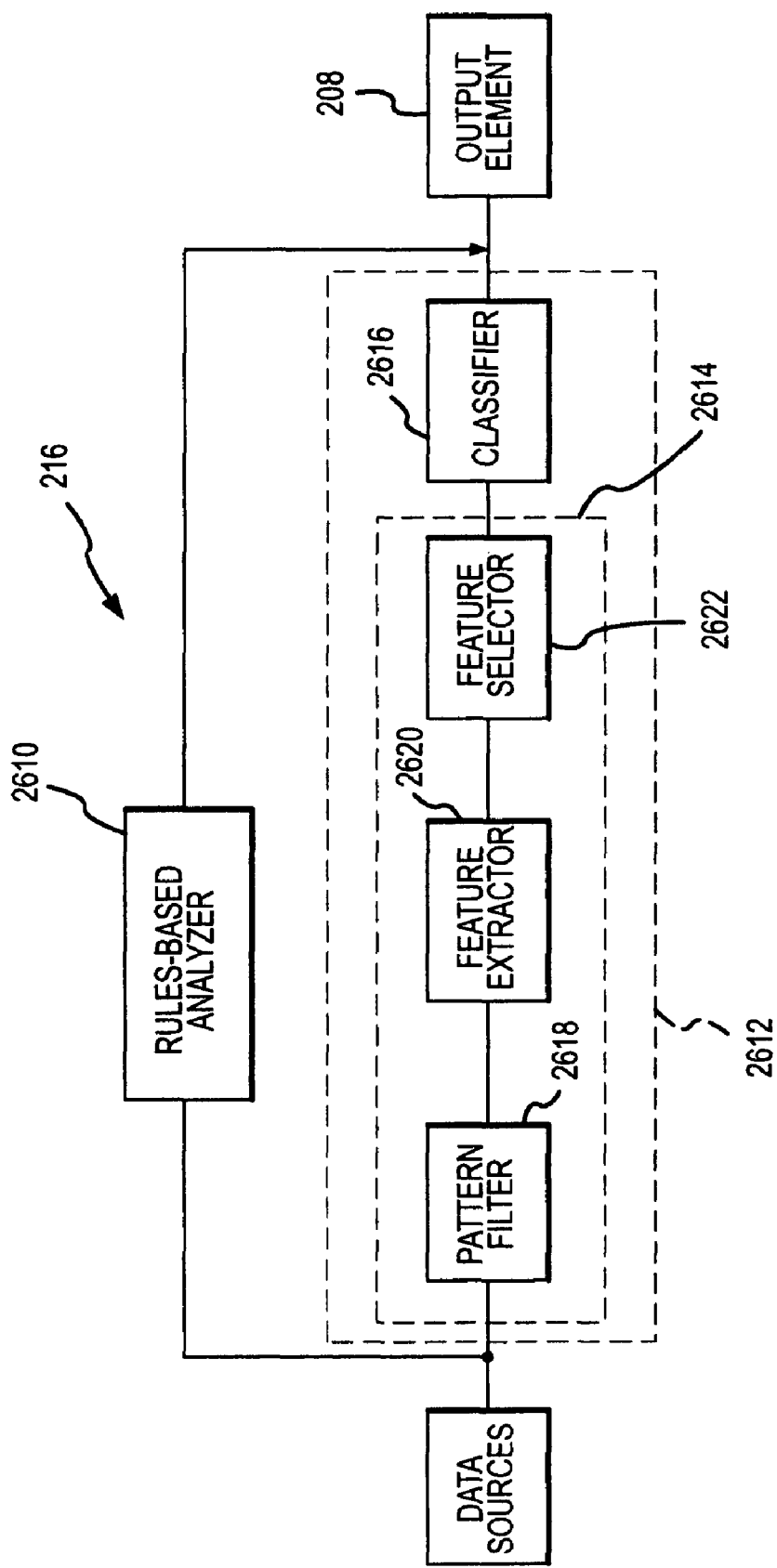
FIG. 26 is a block diagram of a diagnostic system.

The diagnosis system 216 may be configured in any suitable manner to analyze the received data to identify process characteristics, such as problems or issues in the manufacturing or test process. The process characteristics may be identified according to any suitable criteria or process. For example, referring to FIG. 26, the diagnostic system 216 of the present embodiment comprises a rules-based analyzer 2610 for identifying process characteristics according to predefined criteria. Additionally or alternatively, the diagnostic system 216 may comprise a pattern recognition system 2612 for identifying process characteristics based on patterns recognized in the test data.

In particular, the rules-based analyzer 2610 may analyze the test data for particular characteristics corresponding to particular problems. The particular characteristics suitably comprise any known set of data corresponding to particular test or manufacturing issues. The rules-based analyzer 2610 is suitably configured to analyze the data for selected types of data and generate a corresponding signal. For example, if tests corresponding to a particular output node on multiple components do not produce any results at all, the diagnosis system 216 may generate a notification that either (a) the output node is not functioning at all, or (b) the test probe is not properly contacting the output node.

The pattern recognition system 2612 is suitably configured to receive the data from the various sources and identify patterns in the data. The pattern recognition system 2612 is also suitably configured to match the identified patterns with known issues associated with such patterns, for example by assigning a likelihood of a particular issue based on the identified pattern. For example, clusters of devices having similar non-passing bin results or outliers located in the same position on different wafers may indicate a particular problem in the manufacturing process. The pattern recognition system 2612 identifies and analyzes patterns in the data that may indicate such issues in the manufacturing and/or test process.

The pattern recognition system 2612 may be configured in any suitable manner to identify patterns in the various test data and analyze the patterns for correspondence to potential manufacturing or test issues. In the present embodiment, the pattern recognition system 2612 comprises an intelligent system configured to recognize spatial patterns of clustered defects in the test data. In particular, the pattern recognition system 2612 of the present embodiment includes a pattern identifier 2614 and a classifier 2616. The pattern identifier 2614 identifies patterns in the received data that may correspond to issues. The classifier 2616 classifies the identified patterns to different known categories or an unknown category.

The pattern identifier 2614 may be configured in any suitable manner to identify patterns in the test data. For example, the pattern identifier 2614 is suitably configured to filter out data sets that exhibit no patterns, generate data relating to the patterns in the data, and select particular patterns for classification. In the present embodiment, the pattern identifier 2614 comprises a pattern filter 2618, a feature extractor 2620, and a feature selector 2622. The pattern filter 2618 determines whether a data set, such as the data for a particular wafer, includes a pattern. The feature extractor 2620 generates features that exhibit information from the data sets designated by the pattern filter 2618 and are suitable for analysis by the classifier 2616. The feature selector 2622 analyzes the generated features according to selected criteria to select features for classification.

For example, the pattern filter 2618 suitably comprises a software module configured to process the received data to detect whether any patterns are in the data. To preserve the integrity of the test data, the pattern filter suitably processes the data without losing information from the original data. The pattern filter 2618 may discard data sets without patterns, leaving only data sets having detected patterns. The pattern filter may be configured to analyze the various types of data individually or in combination.

In the present embodiment, the pattern filter 2618 reduces noise in the data set, for example to remove intermittent noise from the test data. The pattern filter 2618 may employ any suitable system for filtering noise, such as spatial filtering, median filtering, or a convolution process on the test data. The pattern filter 2618 also analyzes the test data to identify patterns in the test data. The pattern filter 2618 may be configured to identify patterns in the data set in any suitable manner.

Figure 28:
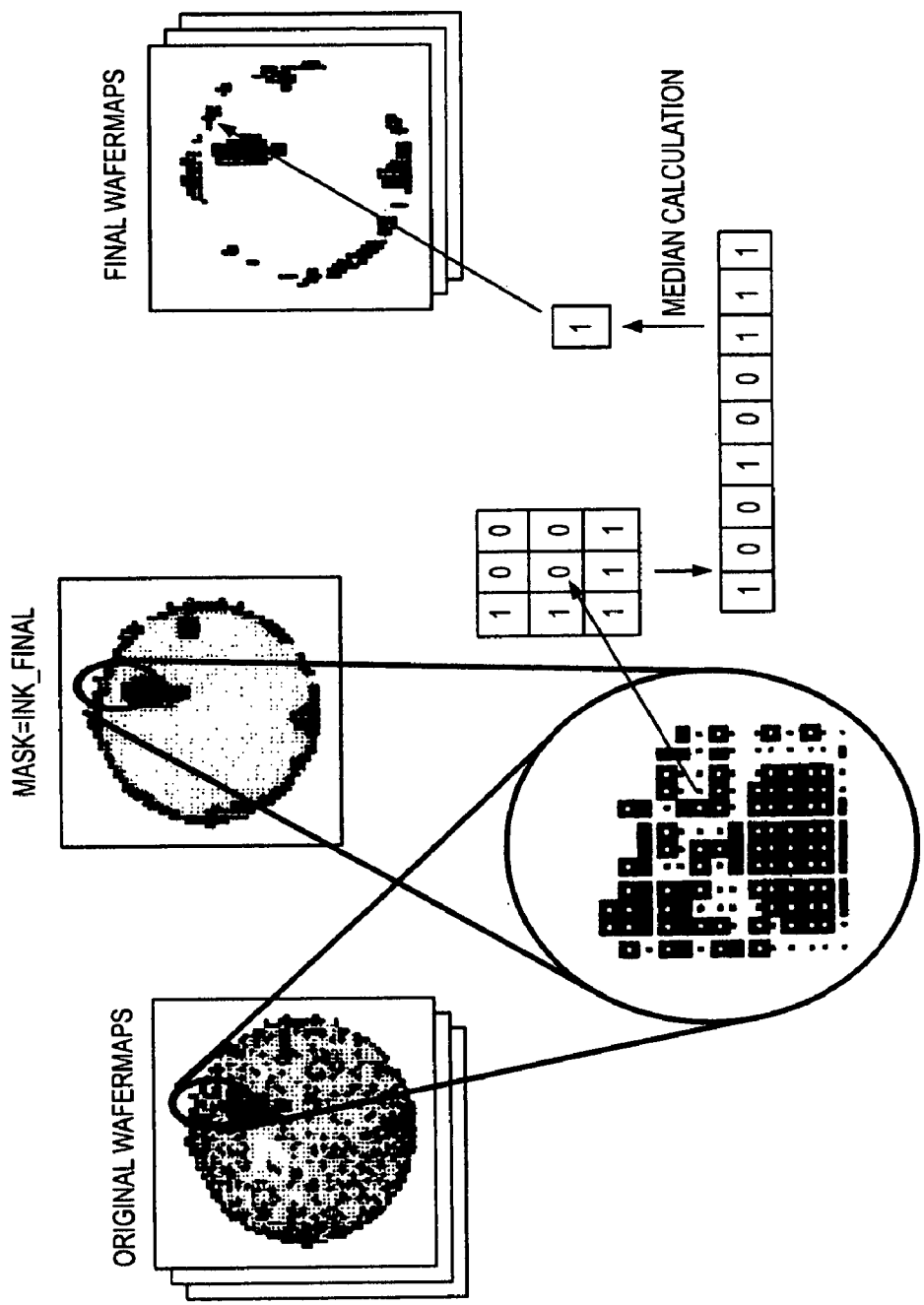
FIG. 28 is a diagram of a pattern filtering process.

In the present embodiment, the pattern filter 2618 analyzes the data according to a pattern mining algorithm and in conjunction with one or more masks associated with known patterns or theoretical patterns. In one exemplary embodiment, the pattern filter 2618 utilizes spatial filtering, such as median filtering, to reduce noise, such as "salt-and-pepper" noise due to outliers in the data. For example, referring to FIG. 28, the pattern filter may be configured to perform median filtering of the test data using a two-dimensional e-binmap in conjunction with the pattern mask. The pattern mask may comprise any suitable mask, which determines which devices in the e-binmap are selected to perform the median filtering. The pattern mask is suitably similar to the pattern to be identified by the classifier. For example, the pattern mask may utilize the information generated by the composite analysis element 214, such as the composite mask data from various data sets or merged composite mask data, though any appropriate simulated theoretical pattern may be used.

The median filtering is performed around each value that has been selected by the mask in the original e-binmap data. In particular, each data point in the data set and selected data points surrounding the each data point are compared to each selected mask. For example, around each value that is selected by the mask in the test data, the median is calculated considering a neighborhood of a size n-by-n, such as a three-by-three window. Those data sets that fail to exhibit a pattern are ignored. Those that include a pattern are provided to the feature extractor 2620.

Data sets having patterns may be analyzed to match the identified patterns to particular issues. Under certain circumstances, however, raw data used by the pattern filter 2618 may not be suitable for analysis by the classifier 2616. Consequently, the pattern identifier 2614 may comprise a system for creating data, based on the test data, that may be used by the classifier 2616.

In the present embodiment, the feature extractor 2620 generates features that exhibit information from the data sets designated by the pattern filter 2618. The features may be particularly useful in situations in which the original data is difficult or impossible to use. The features may then be analyzed by the classifier 2616 to identify the type of pattern identified by the pattern filter 2618. For example, the feature extractor 2620 may be configured to compute a set of variables based on the data set. The features are suitably configured to efficiently encode the relevant information residing in the original data and be used by the classifier 2616 to classify the corresponding patterns in the data set into fault classes.

The features may comprise any appropriate information extracted from the data. In the present embodiment, the feature extractor 2620 calculates several features, such as a mass, a centroid, a geometric set of moments, and seven moments of Hu from the test data. The various features may be determined for any sets of data. In the present embodiment, the features are calculated based on bin data or other test data for wafers. Thus, the mass may generally correspond to the magnitude of the distribution of die within a bin of interest or other values, without giving any information about the location of the distribution. When the test value at coordinates x and y is $f(x,y)$, the mass M is suitably calculated according to the following equation:

$$M = \frac{\sum_x \sum_y f(x,y)}{N}$$

where N is the total number of data points in the test data set. The mass is normalized so that there is consistency between data sets with different numbers of data points, such as the number of die on a wafer.

The centroid may be defined by spatial coordinates, such as $x_c$ and $y_c$. The centroid provides location information by measuring the center of mass of the distribution of the die. The centroid of the data may be calculated in any suitable manner, such as according to the following equations:

$$x_c = \frac{\sum_x \sum_y x f(x,y)}{\sum_x \sum_y f(x,y)}$$

$$y_c = \frac{\sum_x \sum_y y f(x,y)}{\sum_x \sum_y f(x,y)}$$

The geometric moments of order ($p=0\ldots 3$, $q=0\ldots 3$) may be calculated according to the following equation:

$$m_{pq} = \frac{\sum_x \sum_y x^p y^q f(x,y)}{\sum_x \sum_y f(x,y)}$$

The information supplied by this set of moments provides an equivalent representation of the data set, in the sense that the binmap can be constructed from its moments of all orders. Thus, each moment coefficient conveys a certain amount of the information residing in a binmap.

In the present embodiment, the seven moments of Hu are also considered (see Hu, M. K., "Visual Pattern recognition by moments invariants", IRE Transactions on Information Theory, Vol. 8(2), pp. 179-187, 1962). The seven moments of Hu are invariant under the actions of translation, scaling, and rotation. The moments of Hu may be calculated according to the following equations:

$$\phi_1 = \eta_{20} + \eta_{02}$$

$$\phi_2 = (\eta_{20} - \eta_{20})^2 + 4\eta_{11}^2$$

$$\phi_3 = (\eta_{30} - 3\eta_{12})^2 + (\eta_{03} - 3\eta_{21})^2$$

$$\phi_4=(\eta_{30}+\eta_{12})^2+(\eta_{03}+3\eta_{21})^2$$

$$\phi_5=(\eta_{30}-3\eta_{12})(\eta_{30}+\eta_{12})[(\eta_{30}+\eta_{12})^2-3(\eta_{21}+\eta_{03})^2]+ \\ (\eta_{03}-3\eta_{21})(\eta_{03}+\eta_{21})[(\eta_{03}+\eta_{21})^2-3(\eta_{12}+\eta_{30})^2]$$

$$\phi_6=(\eta_{20}-\eta_{02})[(\eta_{30}+\eta_{12})^2-(\eta_{12}+\eta_{03})^2]+4\eta_{11}(\eta_{30}+ \\ \eta_{12})(\eta_{03}+\eta_{21})$$

$$\phi_7=((3\eta_{21}-\eta_{03})(\eta_{30}+\eta_{12})[(\eta_{30}+\eta_{12})^2-3(\eta_{21}+\eta_{03})^2]+ \\ (\eta_{30}-\eta_{03})(\eta_{30}+\eta_{12})[(\eta_{30}+\eta_{12})^2-3(\eta_{21}+\eta_{03})^2]$$

where the $\eta_{pq}$ are the central moments for all p, q defined as $$\eta_{pq}=\Sigma\Sigma(x-x_c)^p(y-y_c)^q f(x,y)$$

The first six of these moments are also invariant under the action of reflection, while the last changes sign. The values of these quantities can be very large and different. To avoid precision problems, the logarithms of the absolute values may be taken and passed on to the classifier 2616 as features. The invariance of these features is an advantage when binmaps or other data sets are analyzed with signature classes that do not depend on scale, location, or angular position.

A representative set of 26 features is suitably extracted from every binmap or other data set designated by the pattern filter 2618. All or a portion of the features may be provided directly to the classifier 2616 for classification. In the present embodiment, fewer than all of the features may be provided to the classifier 2616, for example to reduce the number of features to be analyzed and thus reduce the dimensionality of the analysis process. Reducing the number of features tends to reduce computational complexity and redundancy. In addition, the required generalization properties of the classifier 2616 may require the number of features to be limited. For example, for the present classifier 2616, the generalization properties of the classifier 2616 may correspond to the ratio of the number of training parameters N to the number of free classifier parameters. A larger number of features corresponds to a larger number of classifier parameters, such as synaptic weights. For a finite and usually limited number N of training parameters, fewer features tend to improve the generalization of the classifier 2616.

The feature selector 2622 of the present system analyzes the generated features according to selected criteria to select features for classification. In particular, the feature selector 2622 is suitably configured to select particular features to be analyzed and minimize errors that may be induced by providing fewer than all of the features to the classifier 2616. The feature selector 2622 may be configured in any suitable manner to select features for transfer to the classifier 2616.

In the present embodiment, the feature selector 2622 implements a genetic algorithm to select the features. The genetic algorithm suitably includes a parallel search process, which tends to maintain multiple solutions, eliminate the dubious solutions, and improve good solutions. The genetic algorithm analysis is suitably applied to the various features for a number of iterations, and the output of the algorithm is the best solution found in the process of evolution.

Figure 27:
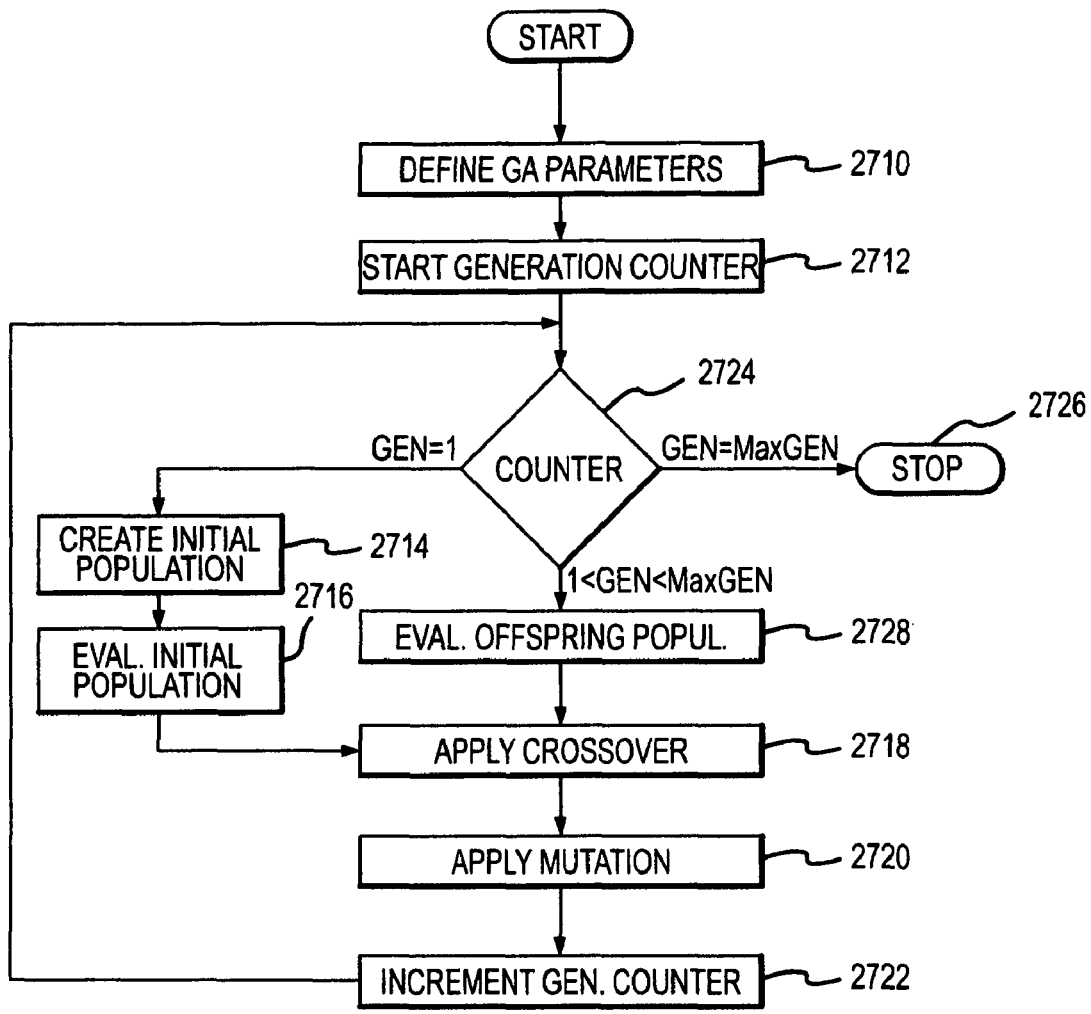
FIG. 27 is a flow diagram of a classification process.

Referring to FIG. 27, to implement the genetic algorithm in the present embodiment, the feature selector 2622 starts by initially defining values for the GA parameters (2710), starting a generation counter (2712), and randomly creating the initial population (2714). The population suitably comprises a collection of coded individuals, and each individual represents a set of selected features. The sequence of individuals in the initial population is generated randomly, for example by an automatic computer program. Any suitable parameters may be used, such as parameters corresponding to a number of epochs, a number of individuals in a population, a size of chromosome, a cost function, a selection rate, a crossover/reproduction rate, and a mutation rate. In the present system, every population has ten different individuals, which represent the presence or not of a particular feature in the optimal solution. In other words, each individual has been binary encoded into a chromosome representing a set of features, i.e., a string of 26 bits (number of features) where a "1" represents that particular feature is taken into consideration for the classification and a "0" means that the feature in that position is not used.

The feature selector 2622 then evaluates the initial population (2716), applies crossover and mutation to the population (2718, 2720), and increments the generation counter (2722). If the generation counter has reached a preselected limit (2724), such as a maximum number of generations, the feature selector 2622 terminates the analysis and provides the selected features to the classifier 2616 (2726). If the limit has not yet been reached, the feature selector 2622 repeatedly evaluates the offspring population (2728) and applies the crossover and mutation to the population until the limit is reached.

The classifier 2616 classifies the identified patterns to different known categories or an unknown category. The classifier 2616 may comprise any suitable classification system for classifying the patterns identified by the pattern identifier 2614, such as Bayes or maximum likelihood classifiers, supervised non-parametric classifiers, and/or supervised or unsupervised rule-based classifiers. The classifier 2616 of the present embodiment is configured to classify the patterns based on analysis of the features selected by the feature selector 2622.

Figure 29:
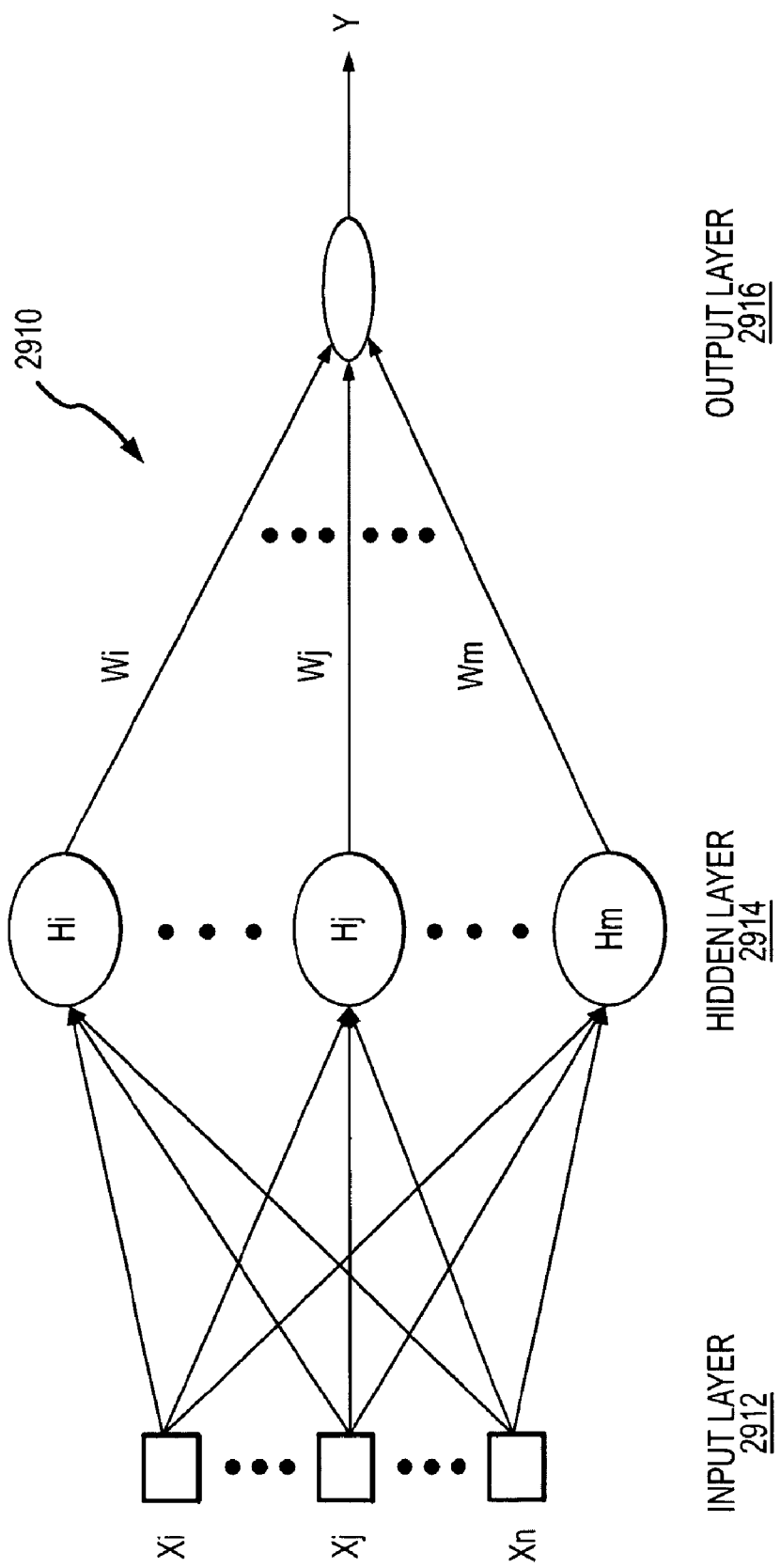
FIG. 29 is a diagram of a neural network.

In the present embodiment, the classifier 2616 comprises a neural network, such as a linear neural network, like a radial basis function (RBF) neural network, or a feedforward network configured to analyze the features selected by the feature selector 2622. Referring to FIG. 29, an RBF neural network 2910 according to various aspects of the present embodiment suitably comprises three layers with different roles. An input layer 2912 comprises source nodes that connect the RBF network to the feature selector 2622 to receive the selected features. The second layer 2914, which suitably comprises a hidden layer, applies a nonlinear transformation from the input space to the hidden space, in which the activation functions of the neurons ($h_i(x)$) are radial basis functions (RBF $\phi$). Gaussian functions are commonly used, but Cauchy, multiquadric and inverse-multiquadric functions may also be used. In the present embodiment, each hidden neuron computes the distance from its input to the neuron's central point, c, and applies the RBF to that distance. The neurons of the output layer 2916 ($o_i(x)$) perform a weighted sum between the outputs of the hidden layer and weights of the links that connect both output and hidden layer, for example according to the equations:

$$h_i(x)=\phi(\|x-c_i\|^2/r_i^2)$$

$$o_j(x)=\Sigma w_{ij}h_i(x)+w_0$$

where x is the input, $\phi$ is the RBF, $c_i$ is the center of the i-th hidden neuron, $r_i$ is its radius, $w_{ij}$ is the weight links that connect hidden neuron number i and output neuron number j, and $w_0$ is a bias for the output neuron.

In other words, the neurons in the hidden layer 2914 apply a nonlinear transformation from the input space to the hidden space, which is of high dimensionality, and the output layer 2916 performs a linear transformation from the hidden-unit space to the output space. The justification for this arrangement is that pattern classification problems cast non-linearly into high dimensionality space are more likely to be linearly separable than in a low dimensional space.

The classifier 2616 receives data for analysis, such as features which have been obtained by the feature extractor 2620 and selected by the feature selector 2622. The data is processed, such as by the RBF network, to compare the data, such as the features, to data for known patterns. If a known pattern matches the data, the corresponding issue or characteristic for the known pattern is noted. The classifier 2616 may also assign a likelihood of a particular issue or characteristic corresponding to the pattern. If no known pattern matches the data, the failure to match is noted as well. The resulting information may then be provided to the output element 208.

The classifier 2616 may also provide a suggested corrective action based on the corresponding characteristic. In particular, the classifier 2616 may be configured to access a memory, such as the database 114, to identify a set of corrective action candidates in response to various fabrication and/or test process characteristics. For example, if the characteristic matching the identified pattern indicates that the components have been excessively exposed to heat in a particular point in the fabrication process, the classifier 2616 may check the database 114 for potential corrective action corresponding to the characteristic to remedy the issue, such as to reduce the temperature or the duration of the exposure of the wafer at the particular fabrication point.

The pattern recognition system 2612 may also be configured to learn additional information about the identified patterns and corresponding issues. For example, the pattern recognition system 2612 may be configured to receive diagnosis feedback information after identifying a pattern. The diagnosis feedback information suitably corresponds to actual issues identified in the manufacturing or test process that caused the identified pattern. The pattern recognition system may then use the diagnosis feedback information for future analyses of data to identify recurrence of the issues.

In operation, data is received from the various sources. The data is initially analyzed for rules-based diagnoses, such as data corresponding exactly to known problems. The diagnosis system 216 generates an output indicating the particular issues identified using the rules-based analysis. The data is then provided to the pattern recognition system 2612, which analyzes the data to identify patterns in the data. The pattern recognition system 2612 may then analyze the identified patterns for correspondence to particular manufacturing or testing issues. The pattern recognition system 2612 suitably assigns a likelihood associated with the particular issues based on the pattern. The diagnosis system 216 may also recommend corrective action based on the identified patterns in the data. The diagnosis system 216 may then generate an output report indicating the various identified issues and the proposed corrective action. After the reported issues are addressed, the pattern recognition system 2612 may receive diagnosis feedback information. The diagnosis feedback information is stored in the pattern recognition system 2612 for use in later analyses.

The particular implementations shown and described are merely illustrative of the invention and its best mode and are not intended to otherwise limit the scope of the present invention in any way. For the sake of brevity, conventional signal processing, data transmission, and other functional aspects of the systems (and components of the individual operating components of the systems) may not be described in detail. Furthermore, the connecting lines shown in the various figures are intended to represent exemplary functional relationships and/or physical couplings between the various elements. Many alternative or additional functional relationships or physical connections may be present in a practical system. The present invention has been described above with reference to a preferred embodiment. Changes and modifications may be made, however, without departing from the scope of the present invention. These and other changes or modifications are intended to be included within the scope of the present invention, as expressed in the following claims.

The invention claimed is:

1. A test data analysis system for analyzing test data for a set of components, comprising:
    a memory for storing the test data; and
    an outlier identification system having access to the memory and configured to identify outliers in the test data according to a selected outlier identification algorithm, wherein the outlier identification system is configured to automatically select the selected outlier identification algorithm from a plurality of outlier identification algorithms.

2. A test data analysis system according to claim 1, wherein the outlier identification system is configured to select the selected outlier identification algorithm according to at least one descriptive statistic derived from the test data.

3. A test data analysis system according to claim 1, wherein the outlier identification system is configured to forego automatically identifying the outliers in the test data if the test data is a selected data population type.

4. A test data analysis system according to claim 1, wherein the outlier identification system comprises a pre-processing engine configured to identify the outliers in the test data using more of the plurality of outlier identification algorithms than the selected outlier identification algorithm.

5. A test data analysis system according to claim 1, wherein the outlier identification system is configured to select the selected outlier identification algorithm according to user-defined rules.

6. A test data analysis system according to claim 1, wherein the outlier identification system is configured to select the selected outlier identification algorithm according to a classification hierarchy based on characteristics of the test data.

7. A test data analysis system according to claim 1, wherein the outlier identification system is configured to automatically identify outliers in the test data according to multiple outlier identification algorithms and discard results generated by outlier identification algorithms other than the selected outlier identification algorithm.

8. A test data analysis system according to claim 1, wherein the outlier identification system comprises:
    a pre-processing engine configured to analyze the test data according to the plurality of outlier identification algorithms to generate pre-processing data; and
    a classification engine configured to select the selected outlier identification algorithm based on the pre-processing data.

9. A test data analysis system according to claim 1, wherein the test data for the set of components includes test data from multiple tests for the components, and wherein the outlier identification system is configured to automatically identify outliers in the test data for each test according to a test-specific selected outlier identification algorithm selected for the test data for each test, wherein the test-specific selected outlier identification algorithm for each test is automatically selected for each test from the plurality of outlier identification algorithms.

10. A test data analysis system according to claim 1, wherein the plurality of outlier identification algorithms is configured to he modified by a user.

11. A test data analysis system according to claim 1, wherein the test data includes raw test data and filtered test data, wherein the filtered test data comprises the raw data without test data corresponding to failures.

12. A test data analysis system according to claim 1, wherein the outlier identification system is configured to:
forego automatically identifying the outliers in the test data according to the selected outlier identification algorithm if the test data is generated by a user-specified test; and
identify outliers in the test data for the selected test using a user-specified outlier identification algorithm.

13. A test data analysis system according to claim 1, wherein:
the selected outlier identification compares the test data to an upper threshold and a lower threshold;
the upper threshold and the lower threshold are defined according to different distances from a mean between an upper test limit and a lower test limit.

14. A test data analysis system according to claim 13, wherein the outlier identification system is configured to forego dynamically adjusting the upper threshold and the lower threshold and assign selected values to the upper threshold and the lower threshold if a selected portion of the tests data is at least one of (a) within a selected range of the upper test limit or the lower test limit, and (b) beyond a selected range of the upper test limit or the lower test limit.

15. A test data analysis system according to claim 1, wherein the outlier identification system is configured to:
dynamically adjust a threshold according to the test data; and
compare the test data to the threshold to identify the outliers.

16. A computer-implemented method for testing components, comprising:
obtaining lest data for the components;
automatically selecting an outlier identification algorithm from a plurality of outlier identification algorithms by the computer; and
automatically identifying outliers in the test data according to the selected outlier identification algorithm by the computer.

17. A computer-implemented method according to claim 16 wherein selecting the outlier identification algorithm includes selecting the selected outlier identification algorithm according to at least one descriptive statistic derived from the test data.

18. A computer-implemented method according to claim 16, further comprising foregoing automatically identifying the outliers in the test data if the test data is a selected data population type.

19. A computer-implemented method according to claim 16, wherein selecting the outlier identification algorithm includes identifying the outliers in the test data using more of the plurality of outlier identification algorithms than the selected outlier identification algorithm.

20. A computer-implemented method according to claim selecting the 16, wherein selecting the outlier identification algorithm includes selected outlier identification algorithm according to user-defined rules.

21. A computer-implemented method according to claim 16, wherein selecting the outlier identification algorithm includes selecting the selected outlier identification algorithm according to a classification hierarchy based on characteristics of the test data.

22. A computer-implemented method according to claim 16, wherein selecting the outlier identification algorithm includes automatically identifying outliers in the test data according to multiple outlier identification algorithms and discarding results generated by outlier identification algorithms other than the selected outlier identification algorithm.

23. A computer-implemented method according to claim 16, wherein selecting the outlier identification algorithm includes:
analyzing the test data according to the plurality of outlier identification algorithms to generate pre-processing data; and
selecting the selected outlier identification algorithm based on the pre-processing data.

24. A computer-implemented method according to claim 16, wherein the test data for the set of components includes tests data from multiple tests for the components, and wherein selecting the outlier identification algorithm includes selecting a test-specific selected outlier identification algorithm for each test from the plurality of outlier identification algorithms.

25. A computer-implemented method according to claim 16, wherein the plurality of outlier identification algorithms is configured to be modified by a user.

26. A computer-implemented method according to claim 16, wherein the test data includes raw test data and filtered test data, wherein the filtered test data comprises the raw data without test data corresponding to failures.

27. A computer-implemented method according to claim 16, wherein automatically identifying outliers comprises:
foregoing automatically identifying the outliers in the test data according to the selected outlier identification algorithm if the test data is generated by a user-specified test; and
identifying outliers in the test data for the selected test using a user-specified outlier identification algorithm.

28. A computer-implemented method. according to claim 16, wherein automatically identifying outliers comprises:
comparing the test data to an upper threshold and a lower threshold., wherein the upper threshold and the lower threshold are defined according to different distances from a mean between an upper test limit and a lower test limit.

29. A computer-implemented method according to claim 28, wherein automatically identifying outliers further comprises foregoing dynamically adjusting the upper threshold and the lower threshold and assigning selected values to the upper threshold and the lower threshold if a selected portion of the tests data is at least one of (a) within a selected range of the upper test limit or the lower test limit and (b) beyond a selected range of the upper test limit or the lower test limit.

30. A computer-implemented method according to claim 16, wherein automatically identifying outliers comprises:
dynamically adjusting a threshold according to the test data; and
comparing the test data to the threshold to identify the outliers.

31. A non-transitory computer readable medium containing computer instructions stored therein for causing a computer processor to perform a method for analyzing test data comprising:
obtaining test data for the components;
automatically selecting an outlier identification algorithm from a plurality of outlier identification algorithms; and
automatically identifying an outlier in the test data using the selected outlier identification algorithm.

32. A non-transitory computer readable medium according to claim 31, wherein selecting the outlier identification algorithm includes selecting the selected outlier identification algorithm according to at least one descriptive statistic derived from the test data.

33. A non-transitory computer readable medium according to claim 31, further comprising foregoing automatically identifying the outliers in the test data if the test data is a selected data population type.

34. A non-transitory computer readable medium according to claim 31, wherein selecting the outlier identification algorithm includes identifying the outliers in the test data using more of the plurality of outlier identification algorithms than the selected outlier identification algorithm.

35. A non-transitory computer readable medium according to claim 31, wherein selecting the outlier identification algorithm includes selecting the selected outlier identification algorithm according to user-defined rules.

36. A non-transitory computer readable medium according to claim 31, wherein selecting the outlier identification algorithm includes selecting the selected outlier identification algorithm according to a classification hierarchy based on characteristics of the test data.

37. A non-transitory computer readable medium according to claim 31, wherein selecting the outlier identification algorithm includes automatically identifying outliers in the test data according to multiple outlier identification algorithms and discarding results generated by outlier identification algorithms other than the selected outlier identification algorithm.

38. A non-transitory computer readable medium according to claim 31, wherein selecting the outlier identification algorithm includes:
   analyzing the test data according to the plurality of outlier identification algorithms to generate pre-processing data; and
   selecting the selected outlier identification algorithm based on the pre-processing data.

39. A non-transitory computer readable medium according to claim 31, wherein the test data for the set of components includes tests data from multiple tests for the components, and wherein selecting the outlier identification algorithm includes selecting a test-specific selected outlier identification algorithm for each test from the plurality of outlier identification algorithms.

40. A non-transitory computer readable medium according to claim 31, wherein the plurality of outlier identification algorithms is configured to be modified by a user.

41. A non-transitory computer readable medium according to claim 31, wherein the test data includes raw test data and filtered test data, wherein the filtered test data comprises the raw data without test data corresponding to failures.

42. A non-transitory computer readable medium according to claim 31, wherein automatically identifying outliers comprises:
   foregoing automatically identifying the outliers in the test data according to the selected outlier identification algorithm if the test data is generated by a user-specified test; and
   identifying outliers in the test data for the selected test using a user-specified outlier identification algorithm.

43. A non-transitory computer readable medium according to claim 31, wherein automatically identifying outliers comprises:
   comparing the test data to an upper threshold and a lower threshold, wherein the upper threshold and the lower threshold are defined according to different distances from a mean between an upper test limit and a lower test limit.

44. A non-transitory computer readable medium according to claim 43, wherein automatically identifying outliers further comprises foregoing dynamically adjusting the upper threshold and the lower threshold and assigning selected values to the upper threshold and the lower threshold if a selected portion of the tests data is at least one of (a) within a selected range of the upper test limit or the lower test limit and (b) beyond a selected range of the upper test limit or the lower test limit.

45. A non-transitory computer readable medium according to claim 35, wherein automatically identifying outliers comprises:
   dynamically adjusting a threshold. according to the test data; and
   comparing the test data to the threshold to identity the outliers.

* * * * *

UNITED STATES PATENT AND TRADEMARK OFFICE
CERTIFICATE OF CORRECTION

| | | |
|---|---|---|
| PATENT NO. | : 8,000,928 B2 | Page 1 of 1 |
| APPLICATION NO. | : 12/111773 | |
| DATED | : August 16, 2011 | |
| INVENTOR(S) | : Michael J. Scott et al. | |

It is certified that error appears in the above-identified patent and that said Letters Patent is hereby corrected as shown below:

In column 40, claim 45, line 39, please delete "identiy" and insert --identify--

Signed and Sealed this
Twenty-seventh Day of September, 2011

David J. Kappos
*Director of the United States Patent and Trademark Office*